(12) United States Patent
Bulleit et al.

(10) Patent No.: US 11,694,002 B1
(45) Date of Patent: Jul. 4, 2023

(54) CUSTOMIZED PROTECTIVE DEVICES AND SYSTEMS AND METHODS FOR PRODUCING THE SAME

(71) Applicant: Protect3d, Inc., Durham, NC (US)

(72) Inventors: Clark Harrison Bulleit, Tampa, FL (US); Kevin Andrew Gehsmann, Greensboro, NC (US); Timothy John Skapek, Dallas, TX (US); Kiegan Lenihan, Durham, NC (US)

(73) Assignee: PROTECT3D, INC., Durham, NC (US)

( * ) Notice: Subject to any disclaimer, the term of this patent is extended or adjusted under 35 U.S.C. 154(b) by 0 days.

(21) Appl. No.: 17/489,470

(22) Filed: Sep. 29, 2021

Related U.S. Application Data

(60) Provisional application No. 63/084,922, filed on Sep. 29, 2020.

(51) Int. Cl.
| | |
|---|---|
| *G06T 15/00* | (2011.01) |
| *G06F 30/20* | (2020.01) |
| *A41D 13/00* | (2006.01) |
| *B29C 64/386* | (2017.01) |
| *G06T 7/149* | (2017.01) |

(Continued)

(52) U.S. Cl.
CPC ......... *G06F 30/20* (2020.01); *A41D 13/0002* (2013.01); *B29C 64/386* (2017.08); *G06T 7/149* (2017.01); *G06T 17/205* (2013.01); *B33Y 80/00* (2014.12)

(58) Field of Classification Search
CPC ............ A61F 5/0125; A61F 2005/0139; A61F 2005/0165; G06F 30/00; G06F 2113/12; G06F 16/211; G06T 19/00; G06T 2219/00

USPC .......................................................... 345/418
See application file for complete search history.

(56) References Cited

U.S. PATENT DOCUMENTS

| | | |
|---|---|---|
| 1,850,540 A | 12/1930 | Erickson |
| 2,377,339 A | 6/1945 | Greene |
| D181,676 S | 12/1957 | Ristenpart |

(Continued)

FOREIGN PATENT DOCUMENTS

CN 306074538 9/2020

OTHER PUBLICATIONS

Hale L, Linley E, Kalaskar DM. A digital workflow for design and fabrication of bespoke orthoses using 3D scanning and 3D printing, a patient-based case study. Scientific reports. Apr. 27, 2020;10(1):1-7.*

(Continued)

*Primary Examiner* — Phu K Nguyen
(74) *Attorney, Agent, or Firm* — Husch Blackwell LLP; Bryan D. Stewart; YiKai Chen

(57) ABSTRACT

A method for generating a representation of a three-dimensional protective device includes accessing a scan of anatomical data of a target and identifying a reference model of a closest size or proportion to a size or proportion of the target. The method further includes creating a boundary of a three-dimensional protective device using the reference model and the scan of anatomical data of the target. Additionally, the method includes generating a representation of a continuous, three-dimensional surface of the three-dimensional protective device that corresponds to the scan of anatomical data and the reference model within the boundary of the three-dimensional protective device.

20 Claims, 38 Drawing Sheets

(51) Int. Cl.
*G06T 17/20* (2006.01)
*B33Y 80/00* (2015.01)

(56) References Cited

U.S. PATENT DOCUMENTS

| | | | |
|---|---|---|---|
| D310,278 S | 8/1990 | Quinlan | |
| D382,052 S | 8/1997 | Bayer | |
| D417,543 S | 12/1999 | Gable | |
| 6,629,945 B1 | 10/2003 | Stromgren | |
| D485,020 S | 1/2004 | Yake | |
| D554,386 S | 11/2007 | Nobles | |
| D555,254 S | 11/2007 | Buethorn | |
| D569,044 S | 5/2008 | Crye | |
| D599,025 S | 8/2009 | Mayhew | |
| 8,272,073 B2 | 9/2012 | Arensdorf | |
| D705,938 S | 5/2014 | McDonald | |
| 8,838,263 B2* | 9/2014 | Sivak | G16H 50/50 623/47 |
| D724,746 S | 3/2015 | Ruel | |
| D815,214 S | 4/2018 | Lacy | |
| D840,047 S | 2/2019 | Koo | |
| D858,788 S | 9/2019 | Giddings | |
| D861,185 S | 9/2019 | Pihlavamaki | |
| D863,577 S | 10/2019 | Chobuathong | |
| D865,183 S | 10/2019 | Otani | |
| D868,279 S | 11/2019 | Chiu | |
| D876,640 S | 2/2020 | King | |
| D882,808 S | 4/2020 | Miller | |
| D885,589 S | 5/2020 | Marcil | |
| D904,638 S | 12/2020 | Shiota | |
| D908,905 S | 1/2021 | Braden | |
| D908,906 S | 1/2021 | Braden | |
| D908,910 S | 1/2021 | Lampert | |
| D909,672 S | 2/2021 | Williams | |
| 2010/0268138 A1* | 10/2010 | Summit | A61F 5/013 700/98 |
| 2014/0180185 A1* | 6/2014 | Zachariasen | G06F 30/00 602/5 |
| 2014/0298681 A1 | 10/2014 | Epstein | |
| 2015/0328840 A1* | 11/2015 | Zachariasen | A61F 5/0127 700/98 |
| 2022/0079794 A1* | 3/2022 | Johnson | A61F 5/0125 |

OTHER PUBLICATIONS

Christensen, A. and Rybicki, F.J., 2017. Maintaining safety and efficacy for 3D printing in medicine. 3D printing in medicine, 3(1), pp. 1-10.*

Tan X, Chen W, Cao J, Ahmed-Kristensen S. Identify Critical Data During Product Customisation—A Case Study of Orthoses Fabrication. InProceedings of the Design Society: DESIGN Conference May 2020 (vol. 1, pp. 413-422). Cambridge University Press.*

Sharma N, Welker D, Cao S, Netzer BV, Honigmann p. Thieringer F. An Interactive, Fully Digital Design Workflow for a Custom 3D Printed Facial Protection Orthosis (Face Mask). In International Conference on Additive Manufacturing in Products and Applications Sep. 1, 2020 (pp. 26-36). Springer, Cham.*

Garcia J, Yang Z, Mongrain R, Leask RL, Lachapelle K. 3D printing materials and their use in medical education: a review of current technology and trends for the future. BMJ simulation & technology enhanced learning. Jan. 2018;4(1):27.*

Kim H, Jeong S. Case study: Hybrid model for the customized wrist orthosis using 3D printing. Journal of mechanical science and technology. Dec. 2015;29(12):5151-6.*

Lin H, Shi L, Wang D. A rapid and intelligent designing technique for patient-specific and 3D-printed orthopedic cast. 3D printing in medicine. Dec. 2016;2(1):1-0.*

Vicenzino B, Collins N, Cleland J, McPoil T. A clinical prediction rule for identifying patients with patellofemoral pain who are likely to benefit from foot orthoses: a preliminary determination. British Journal of Sports Medicine. Sep. 1, 2010 ;44(12):862.*

Wall Street Journal. How Two Duke Benchwarmers and a 3-D Printer Rescued a Top NFL Quarterback Prospect. Mar. 1, 2019. https://www.wsj.com/articles/how-two-duke-benchwarmers-and-a-3-d-printer-rescued-a-top-nfl-quarterrback-prospect-11551446283 (Year: 2019).

NFL. NFL 2020 1st and Future Winner, Protect3d, using 3D scanning and printing to help improve injury recovery. Dec. 14, 2020. http://www.nfl.com/playerhealthandsafety/equipment-and-innovation/1st-and-future/nfl-2020-1st-and-future-winner-protect3d-using-3d-scanning-and-printing-to-help (Year: 2020).

IMPACT Deltoid PAd, Arthron IMPACT, Ithaca Sports, [Post date unknown], [site seen Nov. 22, 2021] Seen at URL: https://www.ithacasports.com/deltpad.html? cmp=googleproducts&kw=deltpad&gclid=EAlalQobChMIg7be796i9AlVxdzlCh0zaAS2EAQYBiABEgLPP%E2%80% A6 (Year 2021).

Magic Silicone Should Pads, BOOMBA, getboomba.com, [Post date unknown], [site seen Nov. 22, 2021] Seen at URL: http://www.getboomba.com/products/silicone-shoulder-pads? currency=USD&variant=39441729224880&utm_medium=cpc&utm_source=googles&utm%E2%80%A6 (Year: 2021).

IMPACT A/C Shoulder Pad—Right, Standard (Under 250lbs), IMPACT, Amazon, [Post date Aug. 25, 2010 [site seen Nov. 22, 2021] Seen at URL: http://www.amazon.com/Impact-Shoulder-Pad-Standard-250lbs/dp/B0040UVTVA/ref=asc_df_B0040UVTVA/ (Year: 2010).

* cited by examiner

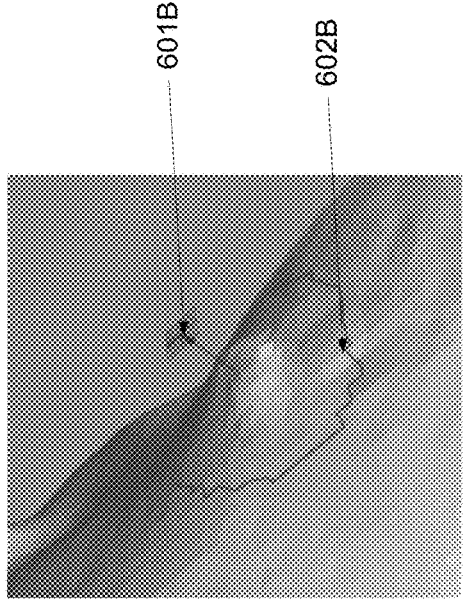
FIG. 6B
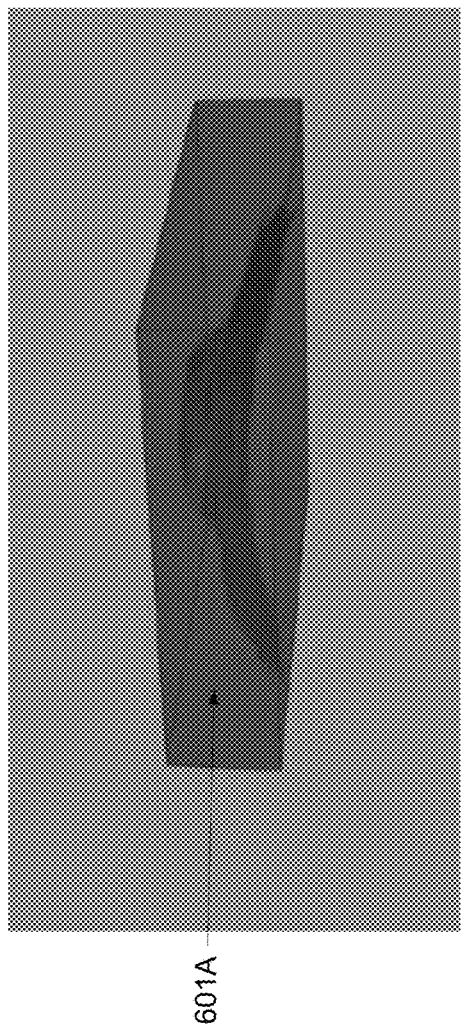
FIG. 6A
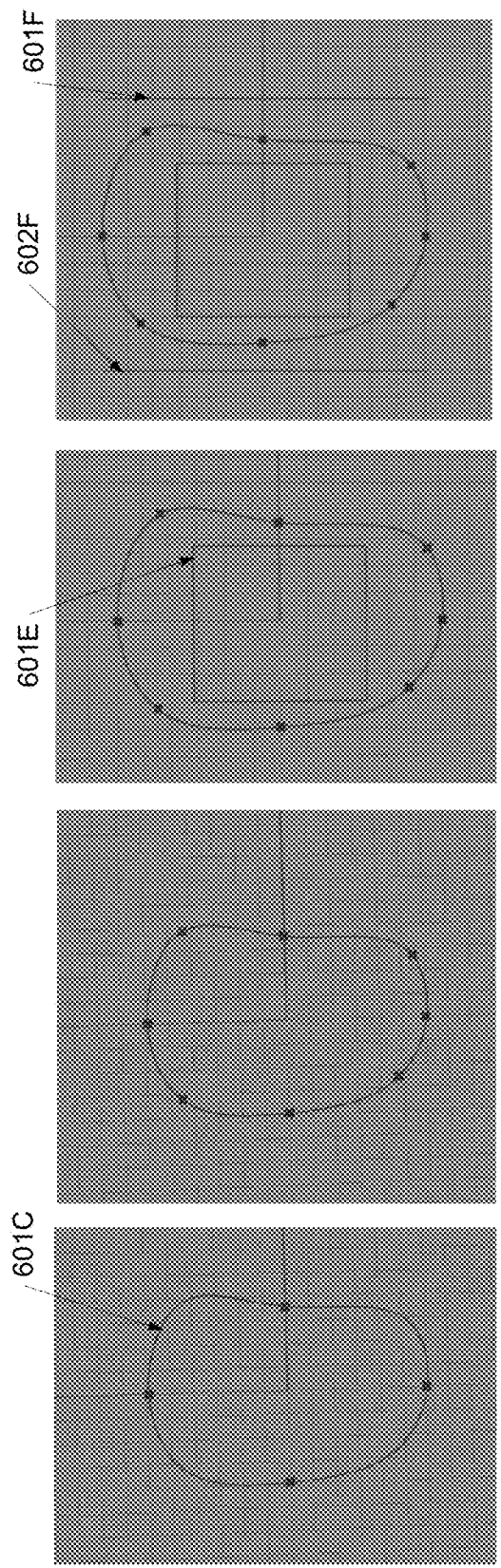
FIG. 6F
FIG. 6E
FIG. 6D
FIG. 6C

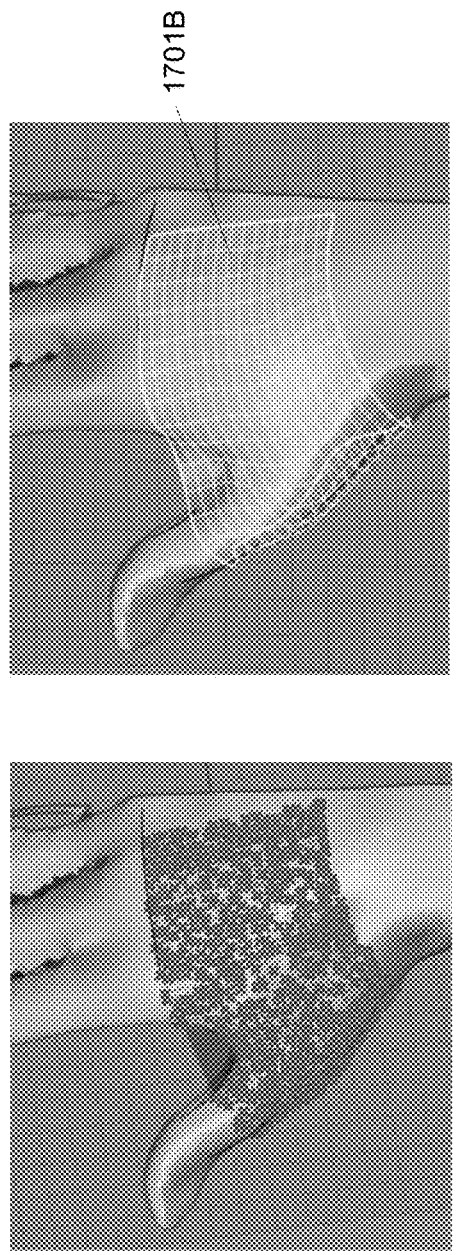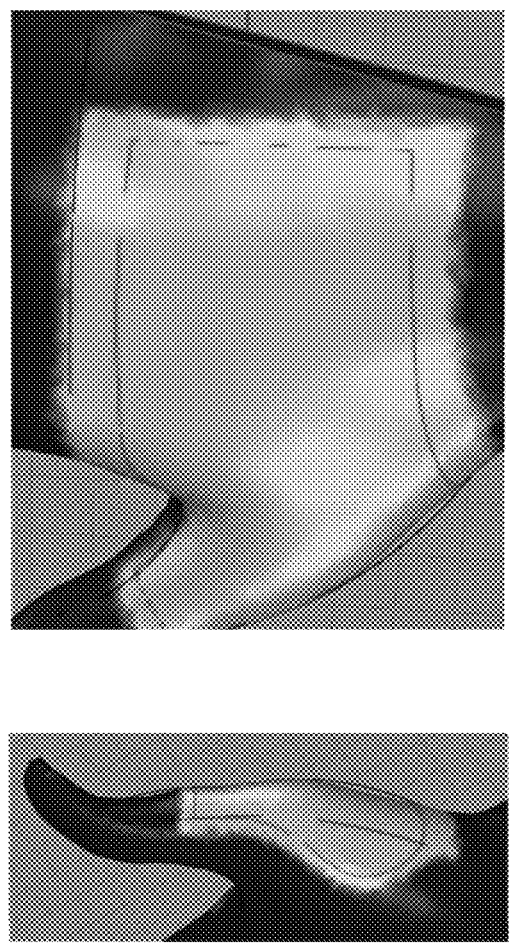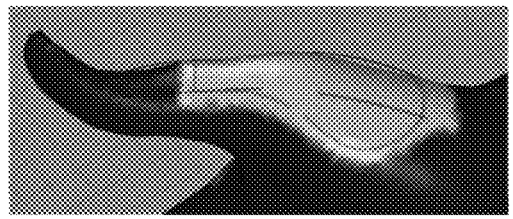
FIG. 17A  FIG. 17B  FIG. 17C  FIG. 17D

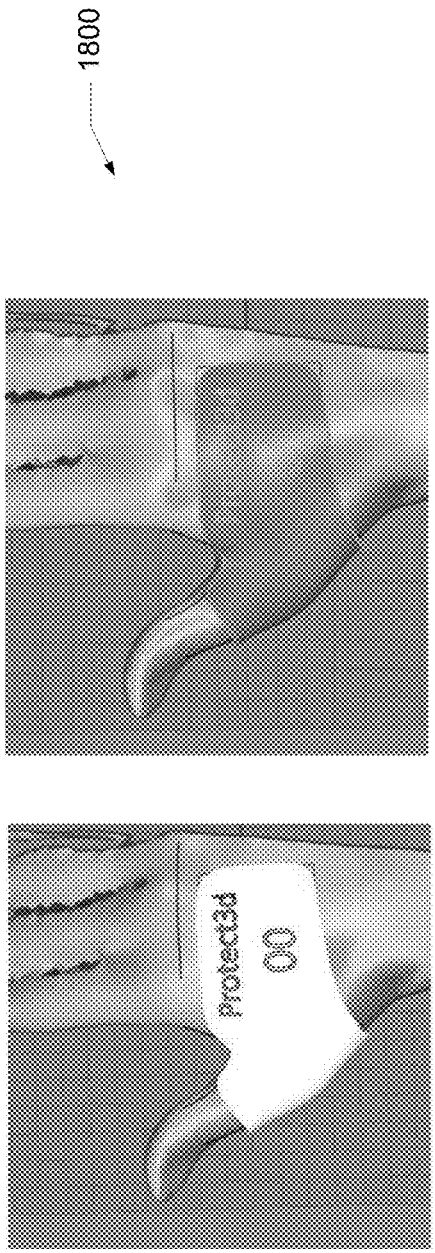
FIG. 18A
FIG. 18B
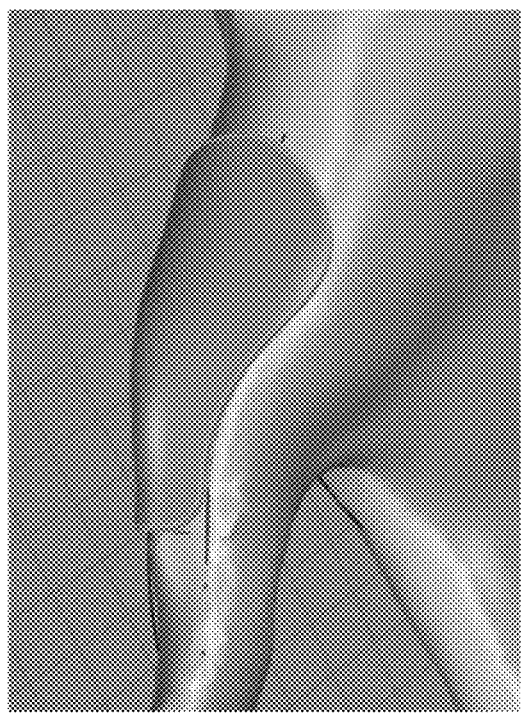
FIG. 18C

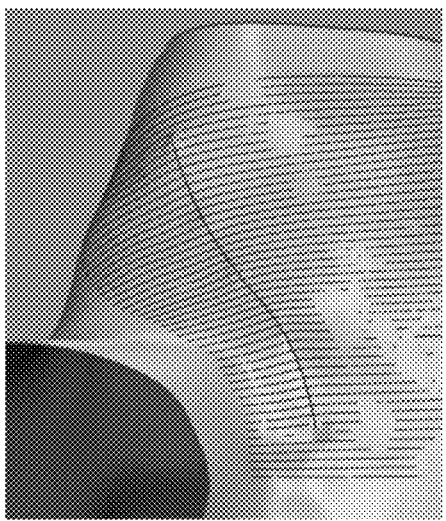
FIG. 23B
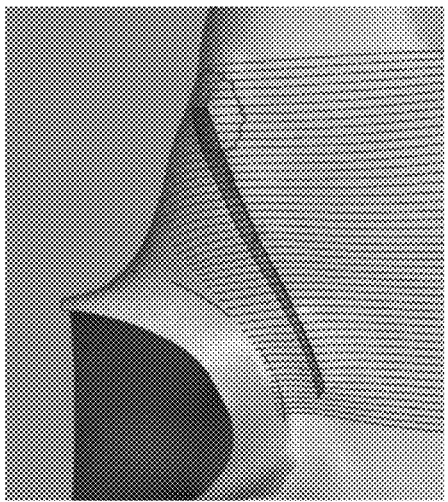
FIG. 23A
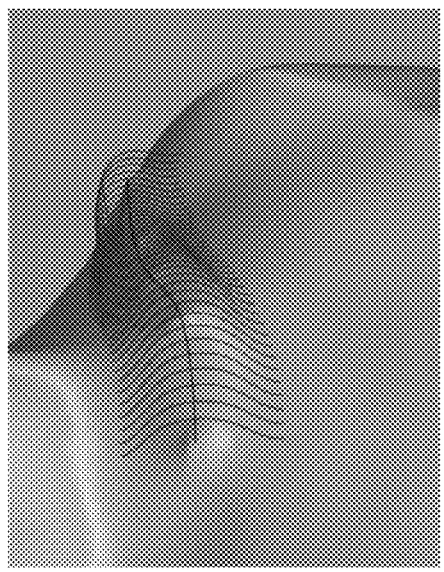
FIG. 23C
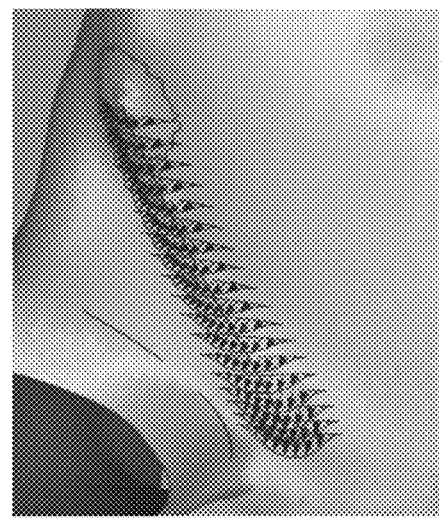
FIG. 23E
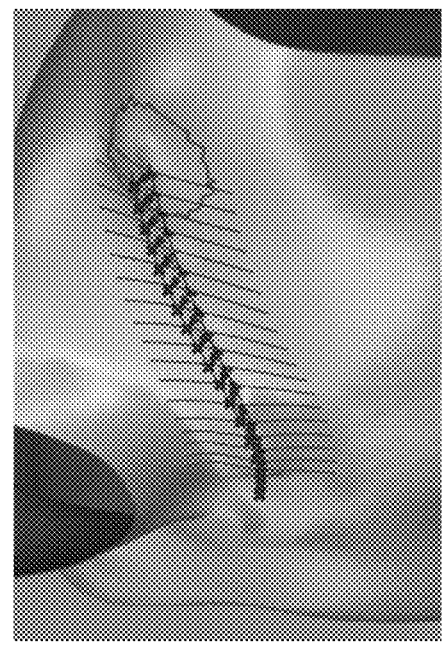
FIG. 23D
FIG. 23F

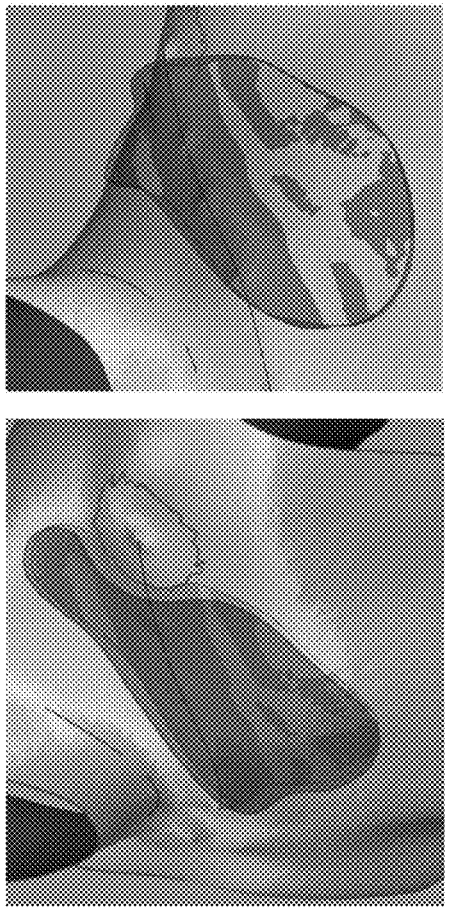
FIG. 25A
FIG. 25B
FIG. 25E
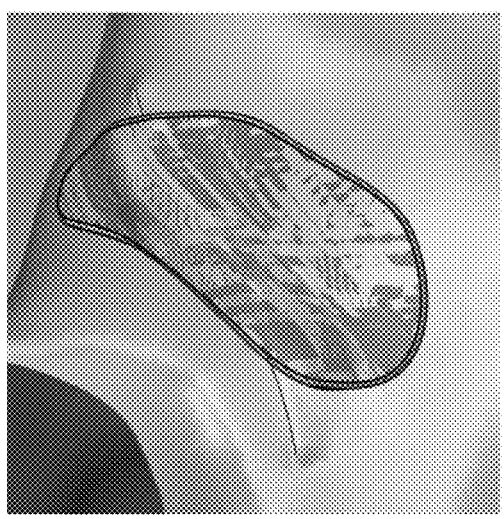
FIG. 25D
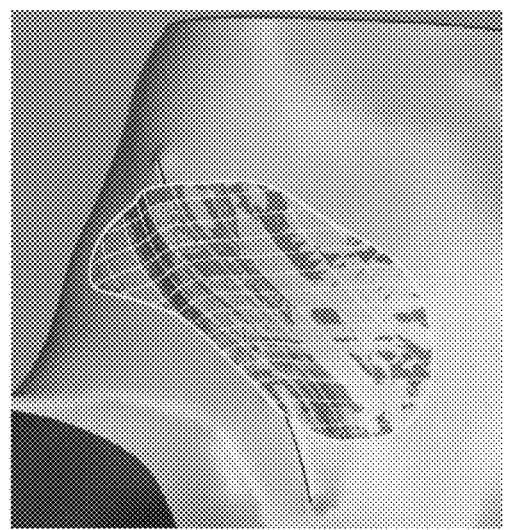
FIG. 25C

2600

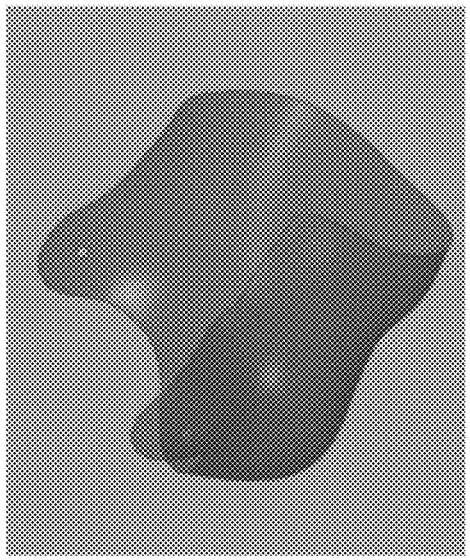
FIG. 31A
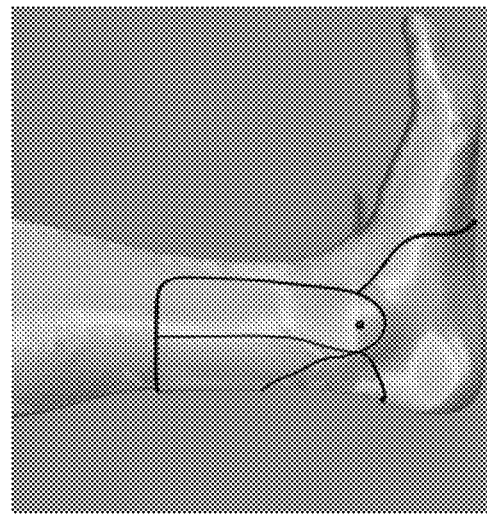
FIG. 31B
FIG. 31C
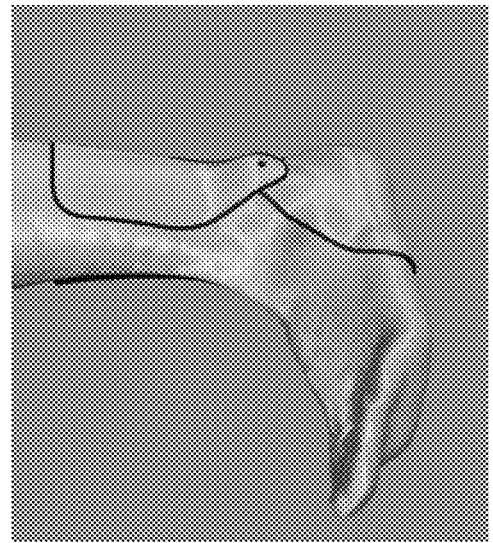
FIG. 31D

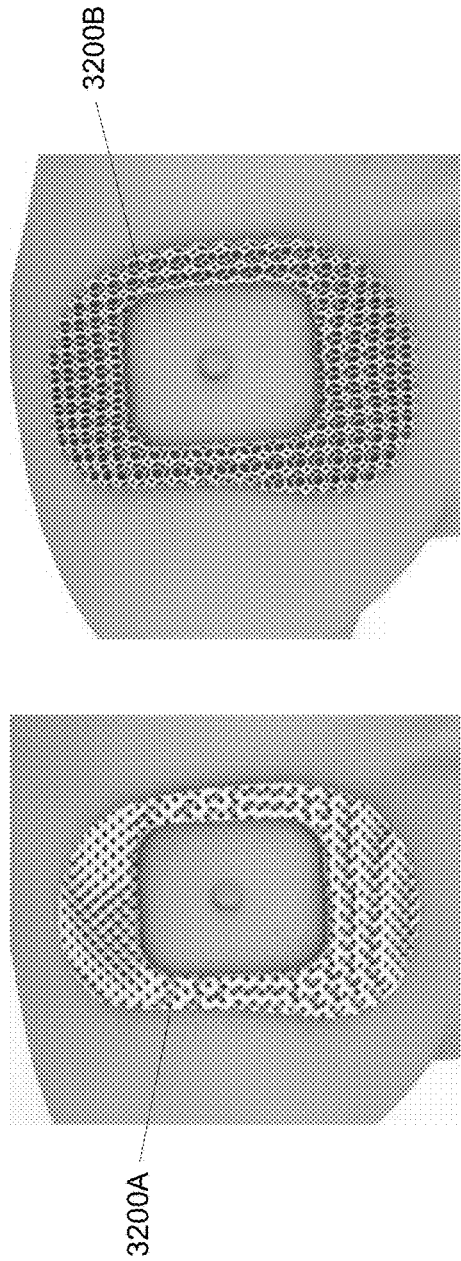
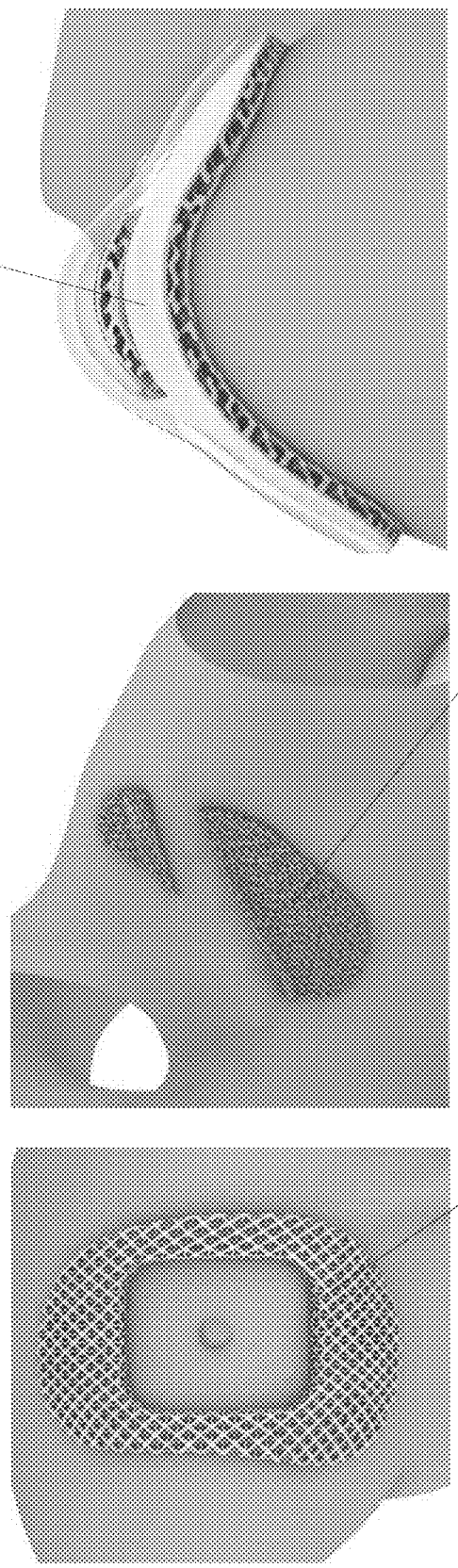
FIG. 32A, FIG. 32B, FIG. 32C, FIG. 32D, FIG. 32E

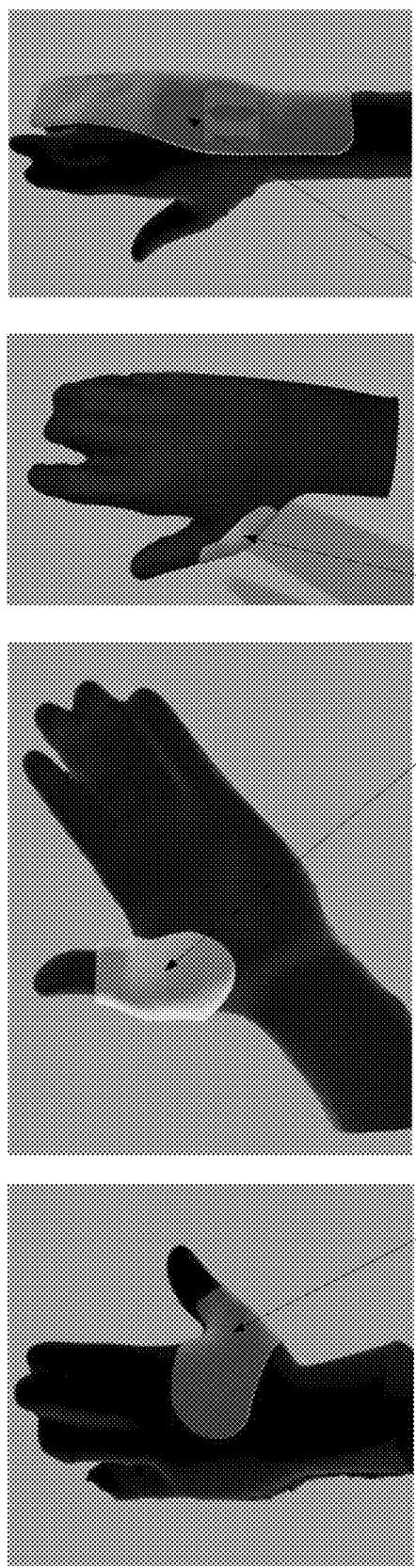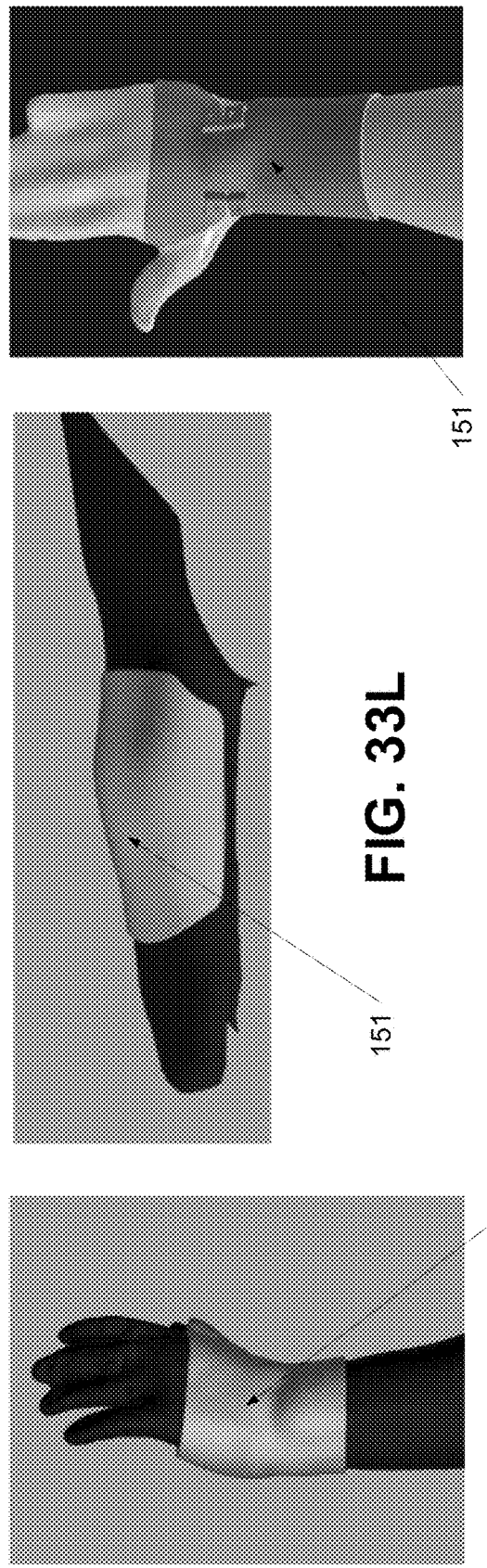
FIG. 33G  FIG. 33H  FIG. 33I  FIG. 33J
FIG. 33K  FIG. 33L  FIG. 33M

151

CUSTOMIZED PROTECTIVE DEVICES AND SYSTEMS AND METHODS FOR PRODUCING THE SAME

CROSS-REFERENCE TO RELATED APPLICATIONS

This application claims the benefit of and priority to U.S. Patent Application No. 63/084,922, filed Sep. 29, 2020, entitled "CUSTOMIZED PROTECTIVE DEVICES AND SYSTEMS AND METHODS FOR CREATING SAME," which is incorporated herein by reference in its entirety.

TECHNICAL FIELD

The present systems and methods relate generally to three-dimensional printing systems, and more particularly to systems and methods for efficiently customizing protective devices using three-dimensional printing systems.

BACKGROUND

Protective devices often may be worn by a subject (i.e., a person) desiring to protect a particular portion of the subject's body, for example, during participation in athletic competition, military operations, or even daily activities. Example protective devices may include pads, braces, splints, supports, guards, shields, and other similar structural devices configured for covering or otherwise supporting a desired body portion. In some instances, protective devices may be used with respect to an uninjured body portion to prevent or inhibit injury thereof. In other instances, protective devices may be used with respect to an injured or previously injured body portion to prevent or inhibit further injury or re-injury of the body portion and promote desired healing. Providing protection for the intended body portion typically may be the primary goal in wearing a protective device, which may be achieved by constructing the device from suitable materials and to have a shape and size necessary to fit along and appropriately cover or support the intended body portion. However, additional goals often may include allowing the subject to maintain a normal range of motion while wearing the protective device and avoiding or minimizing any discomfort caused by wearing the device.

In many instances, players with more severe injuries need to wait for an examination with a doctor to receive a proper diagnosis on their injury before receiving a protective device. In these cases, the doctor prescribes off-the-shelf protective devices to accommodate the player's injuries. Standard off-the-shelf protective devices may be used by subjects seeking an affordable and readily available device. Although standard protective devices may be available in different sizes or size ranges, such devices often may present certain limitations including, for example, improper fit, inadequate coverage, limited range of motion, and/or discomfort for a particular subject wearing the device.

In some cases, a customized protective device may be created for a particular subject, thereby avoiding at least some of the limitations associated with standard devices. One technique for creating a customized protective device is hand molding of a thermoplastic substrate to cover an intended body portion, which is a practice widely used in collegiate and professional athletics. This technique, however, still may present certain shortcomings including, for example, constraints associated with the material, thickness, and geometry of the thermoplastic substrate as well as the experience and skill of the person molding the protective device. Thus, hand-molded protective devices may not be able to simultaneously achieve the desired goals of protection, mobility, and comfort. Another technique for creating a customized protective device involves casting a plaster mold around the intended body portion, and then forming the device based on a negative of the plaster mold in a process similar to injection molding. Although this technique may allow for greater variation in material, thickness, and geometry of the protective device as compared to hand-molded devices, the plaster-molding approach generally may be time-consuming and costly, particularly when multiple iterations are required to achieve a device that provides the protection, mobility, and comfort desired by the intended subject. Furthermore, the entire process from diagnosis to acquiring the prescribed protective device can take several weeks to complete.

Therefore, there is a long-felt but unresolved need for a system or method that facilitates designing and manufacturing customizable protective devices in a short period of time.

BRIEF SUMMARY OF DISCLOSURE

Briefly described, and in various embodiments, the present disclosure relates to systems and methods for creating customized protective devices. In various embodiments, an injured athlete, a trainer, or a doctor may employ the disclosed system to quickly and accurately produce protective devices that may protect various injured or potentially injureable areas of a patient (e.g., athlete).

According to particular embodiments, the systems, methods, and processes discussed herein enable creation of custom, anatomy-fitting protective devices in a matter of days (e.g., less than five days from data capture to device delivery). In one or more embodiments, the disclosed system employs computer devices to measure and form models of anatomical features of a patient. In some embodiments, the computing device renders, creates, and optimizes a representation of a customized protective device for the patient. In at least one embodiment, the disclosed systems and methods then leverage 3D-printing technologies create the protective device from the optimized representation of the protective device.

According to a first aspect, a computer-implemented method in which one or more processing devices perform operations comprising: A) accessing a scan of anatomical data of a target; B) orienting the scan of anatomical data of the target by comparing the scan of anatomical data of the target with a set of reference anatomical data; D) identifying a reference model of a closest size or proportion to a size or proportion of the target; E) creating a boundary of a three-dimensional protective device using the reference model and the scan of anatomical data of the target; F) isolating a relevant portion of the scan of anatomical data using dimensions of the boundary of the three-dimensional protective device; G) generating a representation of a continuous, three-dimensional surface of the three-dimensional protective device using the relevant portion of the scan of anatomical data and the boundary of the three-dimensional protective device; and H) applying an optimization algorithm to the representation of the continuous, three-dimensional surface of the three-dimensional protective device to smooth the representation of the continuous, three-dimensional surface while maintaining a fit to the scan of the anatomical data.

According to a further aspect, the computer-implemented method of the first aspect or any other aspect, wherein the operation of creating the boundary of the three-dimensional protective device comprises: A) finding a tangent vector of a three-dimensional curve at a relevant position of the scan of anatomical data; and B) calculating a cross-product of the tangent vector with a normal of a polygon mesh of the reference model at a closest position of the reference model to the relevant position.

According to a further aspect, the computer-implemented method of the first aspect or any other aspect, wherein the operation of creating the boundary of the three-dimensional protective device further comprises: A) finding additional tangent vectors at discrete position increment locations of the scan of anatomical data; and B) calculating additional cross-products of the additional tangent vectors with normal of the polygon mesh at closest positions of the reference model to the discrete position increment locations.

According to a further aspect, the computer-implemented method of the first aspect or any other aspect, wherein the optimization algorithm applied to the continuous, three-dimensional surface comprises iteratively applying a Laplacian smoothing algorithm and an attraction force algorithm.

According to a further aspect, the computer-implemented method of the first aspect or any other aspect, wherein the operations further comprise: A) determining a thickness of the three-dimensional protective device, wherein the thickness of the three-dimensional protective device is greater in an area with an elevated stress concentration.

According to a further aspect, the computer-implemented method of the first aspect or any other aspect, wherein the operations further comprise: A) generating a lattice structure for the three-dimensional protective device to decrease weight, achieve desired energy absorption characteristics, optimize bending or splinting properties, or any combination thereof.

According to a further aspect, the computer-implemented method of the first aspect or any other aspect, wherein the three-dimensional protective device comprises an AC joint pad, a thumb guard, a collarbone pad, or an ankle brace.

According to a further aspect, the computer-implemented method of the first aspect or any other aspect, wherein the operations further comprise: A) determining a chest depth and shoulder width of the target from the scan of anatomical data of the target, wherein the size of the target comprises at least the chest depth and the shoulder width.

According to a further aspect, the computer-implemented method of the first aspect or any other aspect, wherein the operation of generating the representation of the continuous, three-dimensional surface comprises: A) generating a polygon mesh using the scan of anatomical data of the target and the reference model; B) identifying a location of a lofted region of the polygon mesh; C) segmenting the polygon mesh using evenly spaced perpendicular surfaces; D) calculating normal vectors of the evenly spaced perpendicular surfaces of the polygon mesh positioned over the lofted region; and E applying a function to a magnitude of the normal vectors to generate the lofted region as an arched curve that (i) fits end tangents of regions of the polygon mesh bounding the lofted region and (ii) is lofted to generate a three-dimensional space between the continuous, three-dimensional surface of the three-dimensional protective device and the polygon mesh.

According to a second aspect, a system comprising: A) a processor; and B) a non-transitory computer-readable medium having instructions stored thereon, the instructions executable by the processor for performing operations comprising: 1) accessing a scan of anatomical data of a target; 2) identifying a reference model of a closest size or proportion to a size or proportion of the target; 3) creating a boundary of a three-dimensional protective device using the reference model and the scan of anatomical data of the target; 4) generating a lofted region of the three-dimensional protective device, wherein generating the lofted region comprises: a) generating a polygon mesh using the scan of anatomical data of (i) the target within the boundary of the three-dimensional protective device and (ii) the reference model; b) identifying a location of the lofted region of the polygon mesh; c) segmenting the polygon mesh using evenly spaced perpendicular surfaces; d) calculating normal vectors of the evenly spaced perpendicular surfaces of the polygon mesh positioned over the lofted region; and e) applying a function to a magnitude of the normal vectors to generate the lofted region as an arched curve that (i) fits end tangents of regions of the polygon mesh bounding the lofted region and (ii) is lofted to generate a three-dimensional space between the three-dimensional protective device and the polygon mesh; C) generating a representation of a continuous, three-dimensional surface of the three-dimensional protective device that corresponds to the scan of anatomical data, the reference model, and the lofted region; and D) transmitting the representation of the continuous, three-dimensional surface of three-dimensional protective device to an additive manufacturing device.

According to a further aspect, the system of the first aspect or any other aspect, wherein the operations further comprise: A) applying an optimization algorithm to the continuous, three-dimensional surface, wherein the optimization algorithm comprises iteratively applying a Laplacian smoothing algorithm and an attraction force algorithm.

According to a further aspect, the system of the first aspect or any other aspect, wherein the three-dimensional protective device comprises a joint brace that prevents or inhibits rotation or movement of a joint of the target.

According to a further aspect, the system of the first aspect or any other aspect, wherein the operation of creating the boundary of the three-dimensional protective device comprises: A) finding a tangent vector of a three-dimensional curve at a relevant position of the scan of anatomical data; and B) calculating a cross-product of the tangent vector with a normal of a polygon mesh of the reference model at a closest position of the reference model to the relevant position.

According to a further aspect, the system of the first aspect or any other aspect, wherein the operations further comprise: A) labeling anatomical features of the scan of anatomical data, wherein the labeled anatomical features are used to identify the reference model of the closest size or proportion to the size or proportion of the target.

According to a further aspect, the system of the first aspect or any other aspect, wherein the operation of accessing the scan of anatomical data of the target comprises receiving a three-dimensional anatomical scan of the target from a three-dimensional scanning device.

According to a third aspect, a non-transitory computer-readable medium having program code that is stored thereon, the program code executable by one or more processing devices for performing operations comprising: A) accessing a scan of anatomical data of a target; B) identifying a reference model of a closest size or proportion to a size or proportion of the target; C) creating a boundary of a three-dimensional protective device using the reference model and the scan of anatomical data of the target; and D) generating a representation of a continuous, three-dimensional surface of the three-dimensional protective device that corresponds to the scan of anatomical data and the reference model within the boundary of the three-dimensional protective device.

According to a further aspect, the non-transitory computer-readable medium of the third aspect or any other aspect, wherein the operation of generating the representation of the continuous, three-dimensional surface comprises: A) generating a polygon mesh using the scan of anatomical data of the target and the reference model; B) identifying a location of a lofted region of the polygon mesh; C) segmenting the polygon mesh using evenly spaced perpendicular surfaces; D) calculating normal vectors of the evenly spaced perpendicular surfaces of the polygon mesh positioned over the lofted region; and E) applying a function to a magnitude of the normal vectors to generate the lofted region as an arched curve that (i) fits end tangents of regions of the polygon mesh bounding the lofted region and (ii) is lofted to generate a three-dimensional space between the continuous, three-dimensional surface of the three-dimensional protective device and the polygon mesh.

According to a further aspect, the non-transitory computer-readable medium of the third aspect or any other aspect, wherein the operations further comprise: A) generating a lattice structure for the three-dimensional protective device to decrease weight, achieve desired energy absorption characteristics, optimize bending or splinting properties, or any combination thereof.

According to a further aspect, the non-transitory computer-readable medium of the third aspect or any other aspect, wherein the operations further comprise: A) determining a thickness of the three-dimensional protective device, wherein the thickness of the three-dimensional protective device is greater in an area with an elevated stress concentration.

According to a further aspect, the non-transitory computer-readable medium of the third aspect or any other aspect, wherein the three-dimensional protective device comprises a joint brace that prevents or inhibits rotation or movement of a joint of the target.

According to a further aspect, a computer-implemented method in which one or more processing devices perform operations comprising: A) accessing a scan of anatomical data of a target; B) orienting the scan of anatomical data of the target by comparing the scan of anatomical data of the target with a set of reference anatomical data; D) identifying a reference model of a closest size or proportion to a size or proportion of the target; E) locating a plurality of relevant anatomical features from the scan of anatomical data; F) creating a boundary of a three-dimensional protective device using the reference model and the scan of anatomical data of the target; G) isolating a relevant portion of the scan of anatomical data using dimensions of the boundary of the three-dimensional protective device; H) manipulating a portion of the three-dimensional protective device to add additional features; I) generating a representation of a continuous, three-dimensional surface of the three-dimensional protective device using the relevant portion of the scan of anatomical data and the boundary of the three-dimensional protective device; J) applying an optimization algorithm to the representation of the continuous, three-dimensional surface of the three-dimensional protective device to smooth the representation of the continuous, three-dimensional surface while maintaining a fit to the scan of the anatomical data; K) exporting a complete rendered model to an additive manufacturing device to print the three-dimensional protective device.

These and other aspects, features, and benefits of the claimed system(s) and method(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF FIGURES

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIGS. 6A-F illustrate exemplary modeling data for producing a customized protective device for the acromioclavicular joint, according to one embodiment of the present disclosure;

FIGS. 17A-D illustrate exemplary modeling data for producing a customized protective device for the thumb, according to one embodiment of the present disclosure;

FIGS. 18A-C illustrate a rendered customized protective device for the thumb, according to one embodiment of the present disclosure;

FIGS. 19A-B illustrate exemplary modeling data for producing a customized protective device for a clavicle, according to one embodiment of the present disclosure;

FIGS. 23A-F illustrate exemplary modeling data for producing a customized protective device for the clavicle, according to one embodiment of the present disclosure;

FIGS. 25A-E illustrate exemplary modeling data for producing a customized protective device for the clavicle, according to one embodiment of the present disclosure;

FIGS. 31A-D illustrate exemplary modeling data for producing a customized protective device for the ankle, according to one embodiment of the present disclosure; and FIGS. 32A-E illustrate a rendered customized protective device and their corresponding lattice structures, according to one embodiment of the present disclosure.

DETAILED DESCRIPTION OF FIGURES

Figure 1:
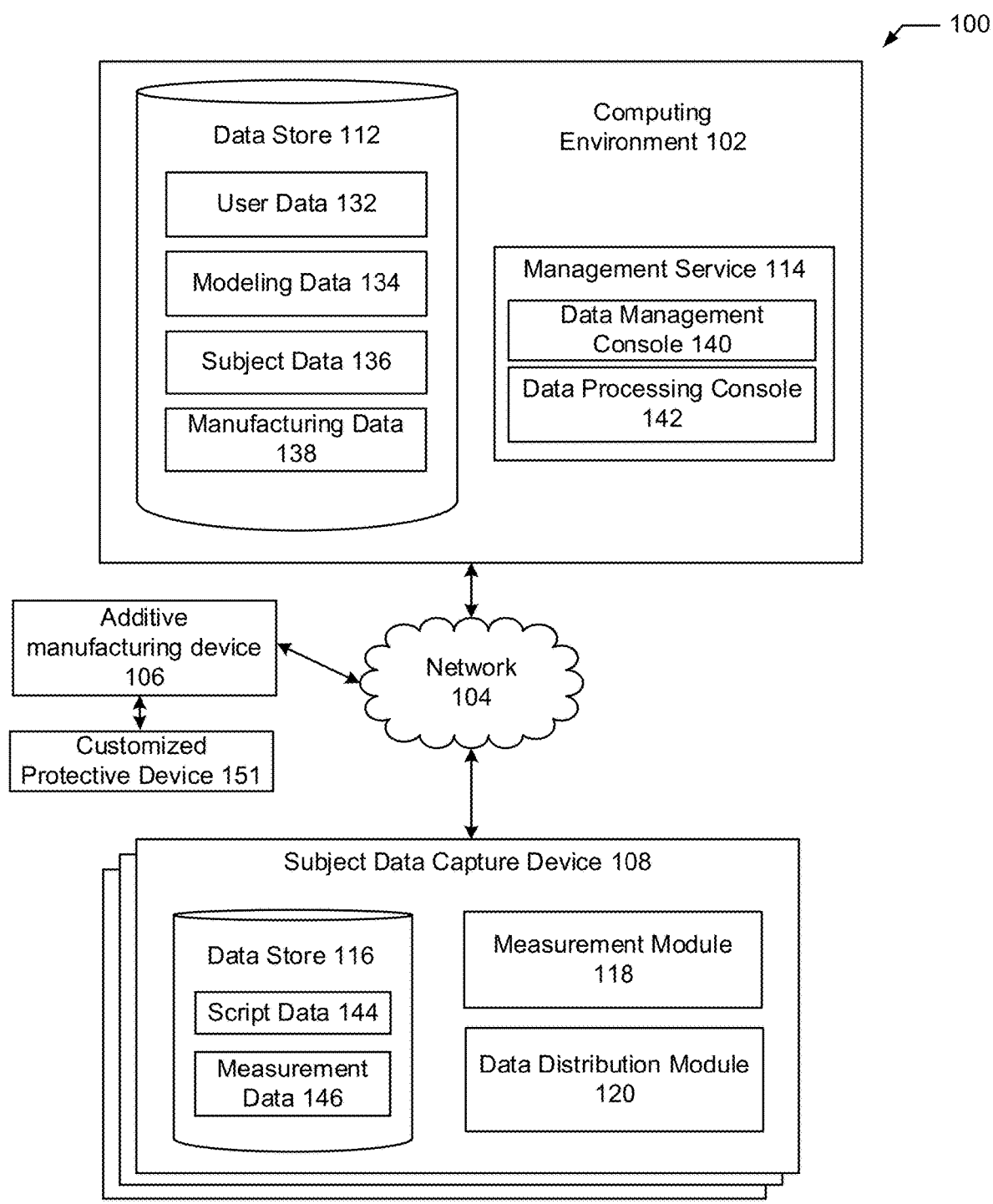
FIG. 1 illustrates an example network environment that manages the production of a customized protective device, according to one aspect of the present disclosure.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Whether a term is capitalized is not considered definitive or limiting of the meaning of a term. As used in this document, a capitalized term shall have the same meaning as an uncapitalized term, unless the context of the usage specifically indicates that a more restrictive meaning for the capitalized term is intended. However, the capitalization or lack thereof within the remainder of this document is not intended to be necessarily limiting unless the context clearly indicates that such limitation is intended.

The systems, methods, and processes herein create customized protective devices that provide protection for an intended body portion, allow a subject (e.g., patient) to maintain a normal range of motion, and avoid or minimize discomfort caused by wearing the customized protective device. The customized protective devices described herein generally may include a contoured member that is configured to cover (e.g., extend over) at least a portion of an intended body portion of the subject, with the contoured member having an inner surface disposed opposite an outer surface. The inner surface may be configured to face and/or contact the intended body portion when the customized protective device is worn by the subject, while the outer surface may be configured to face away from the intended body portion.

In some embodiments, a customized protective device may be configured for use with respect to an injured or previously injured body portion to prevent or inhibit further injury or re-injury of the body portion and promote healing. In some embodiments, such a customized protective device may be configured to provide direct impact shielding for the injured or previously injured body portion. As described in detail below, direct impact shielding may be provided by configuring the customized protective device to include one or more contact portions and one or more non-contact portions. When the protective device is worn by the subject, the contact portion(s) may contact the subject's body, while the non-contact portion(s) may be offset (i.e., spaced apart) from the subject's body. In this manner, the non-contact portion(s) may cover an injured or previously injured body portion, while the contact portions distribute impact forces to surrounding body portions. In other embodiments, as described below, a customized protective device may be configured to limit a range of motion of a joint of the subject, for example, an injured joint, such that the joint is protected from further injury.

In at least one embodiment, a customized protective device may be configured for use with respect to an uninjured body portion to prevent or inhibit injury of the body portion. For example, such a customized protective device may be configured to cover a body portion that is likely to be impacted during participation in a given activity, such as contact sports. This type of customized protective device generally may be form-fit to the body portion to be protected, without any non-contact portions. Further, such a customized protective device may be configured to allow the subject to maintain a normal range of motion of nearby joints, while also avoiding undesired contact between the protective device and body portions other than those covered by the customized protective device.

The custom manufacturing processes of several types of customized protective devices are described herein and illustrated in the accompanying drawings. It will be appreciated that these protective devices are merely examples, and that features of the described and illustrated devices, as well as the methods for creating the customized protective devices, may be applied similarly to other types of customized protective devices for protecting other portions of a subject's body.

With reference to FIG. 1, shown is a networked environment 100 that manages the production of a customized protective device, according to one embodiment of the present disclosure. The networked environment 100 may include a computing environment 102, an additive manufacturing device 106, and a subject data capture device 108, which are in data communication with each other via a network 104. In particular embodiments, the final output of the network environment 100 is a customized protective device 151, created by the additive manufacturing device 106. In various embodiment, the network 104 includes, for example, the Internet, intranets, extranets, wide area networks (WANs), local area networks (LANs), wired networks, wireless networks, or other suitable networks, etc., or any combination of two or more such networks. For example, such networks may include satellite networks, cable networks, Ethernet networks, Bluetooth networks, Wi-Fi networks, NFC networks, and other types of networks.

The computing environment 102 may include, for example, a server computer or any other system providing computing capability. Alternatively, the computing environment 102 may employ more than one computing devices that can be arranged, for example, in one or more server banks or computer banks or other arrangements. In at least one embodiment, such computing devices are located in a single installation or are distributed among many different geographical locations. For example, the computing environment 102 may include one or more computing devices that together may include a hosted computing resource, a grid computing resource and/or any other distributed computing arrangement. In some cases, the computing environment 102 may correspond to an elastic computing resource where the allotted capacity of processing, network, storage, or other computing-related resources can vary over time. In various embodiments, the computing environment 102 includes remote mobile computing devices that are capable of performing the actions of the computing environment 102. For example, a cellular device can process particular data and store the data locally, remotely on a cloud storage system, or a combination of the two.

Various applications and/or other functionality may be executed in the computing environment 102 according to various embodiments. In particular embodiments, various data is stored in a data store 112 that is accessible to the computing environment 102. The data store 112 can be representative of one or more of data stores 112 as can be appreciated. The data stored in the data store 112, for example, is associated with the operation of the various applications and/or functional entities described below.

In various embodiments, the computing environment 102 includes a management service 114. The management service 114 may process and distribute data locally or to other devices connected to the network 104. For example, the management service 114 can receive subject data from a subject data capture device 108 and store the data in a storage for subject data 136 in the data store 112.

The management service 114 may include a data management console 140 and a data processing console 142. In at least one embodiment, the data management console 140 distributes data to particular locations throughout the network environment 100. For example, the data management console 140 may send user data 132 to the subject data capture device 108 so that the subject data capture device 108 can identify the current patient being processed for a customized protective device 151. In various embodiments, the data management console 140 can receive data and store data locally on the data store 112. For example, after the subject data capture device 108 measures particular data from a patient, the data is sent to the computing environment 102. Continuing with this example, the data management console 140 stores the data into a storage location for modeling data 124 at the data store 112.

In some embodiments, the data processing console 142 processes data for further use. In one or more embodiments, the data processing console 142 receives data from the data management console 140 and performs particular actions. In various embodiments, after a patient has been measured and their data has been stored, the data management console 140 sends subject data 136 to the data processing console 142 for further processing. Further processing performed by the data processing console 142 may include, but is not limited to, three-dimensional (3D) rendering, computer-aided design (CAD) file conversion, smoothing rendered surfaces, orienting data and locating relevant features, creating boundaries for 3D sketches, and processing additional features. In particular embodiments, the data processing console 142 performs analysis in a relatively quick timeline. For example, after the data is received from the subject data capture device 108, the data processing console can process data in at least less than one day, two days, or three days. In one or more embodiments, the data processing console 142 produces manufacturing data 136 based on 3D-renderings of a customized protective device 151. For example, the 3D rendering of a customized clavicle protective device for a particular patient may be exported to a CAD format and sent to the additive manufacturing device 106 for creation of the customized clavicle protective device.

In some embodiments, the data processing console 142 employs machine-learning techniques to recommend particular customized protective devices 151 based on previous prototype performances. For example, the computing environment 102 may receive input data regarding the performance of a customized protective device 151 and employ machine learning techniques to modify future protective devices.

The data store 112 may include, but is not limited to, the user data 132, the modeling data 134, subject data 136, and manufacturing data 138. In particular embodiments, the user data 132 acts as the head of a linked list of data. In some embodiments, each set of user data 132 has its own corresponding modeling data 134, subject data 136, manufacturing data 138, and other particular data. For example, when a user is identified and added to the system, their corresponding modeling data 134 is linked to their particular user data 132. In some embodiments, linking the data enables the system to track an individual's data to that particular patient.

In one or more embodiments, the user data 132 includes any information that pertains to the patient being assessed by the system. The user data may include, for example, a patient's age, height, weight, Body Mass Index (BMI), sport of interest, sport of injury, and any other data that pertains to the specific patient. For example, before examination, the computing environment 102 can receive particular information identifying the patient and store the information in the storage location of the user data 132.

In various embodiments, the modeling data 134 includes any modeling data received and processed by the data processing console 142. For example, the modeling data 134 can include, but is not limited to, 3D renderings, additional features, models of the subject, various renderings from different angles, CAD files, and reference human models. In various embodiments, after the data processing console 142 renders 3D structures of the particular patient, the data is stored in the storage location of the modeling data 134. The completed CAD files may be transferred from the modeling data 134 to the manufacturing data 138 using the data management console 140. In some embodiments, the modeling data 134 stores human models used for referencing when creating a new rendering of a particular patient's injury location.

In one or more embodiments, the subject data 136 can include any raw data captured by the subject data capture device 108. For example, the subject data 136 can include, but is not limited to, 3D coordinate data, depth, height, width, point cloud data, and 3D triangulation data. In various embodiments, after the subject data capture device 108 performs a measurement of a subject, the data is sent to the computing environment 102 and stored for modeling purposes. In some embodiments, the data management module 142 can combine the subject data 136 and the modeling data 134 and reference the data as the subject data 136 to consolidate storage in the data store 112.

In various embodiments, the manufacturing data 138 can include any information related to the manufacturing of customized protective devices 151. The manufacturing data 138 may include, for example, the finalized CAD file, manufacturing commands, shipping information, deadlines, and any other information pertinent to the manufacturing process. In particular embodiments, the data management console 140 sends CAD file information obtained from the modeling data 134 to the storage location of the manufacturing data 138. In one or more embodiments, the manufacturing data 138 is sent to the additive manufacturing device 106 to produce customized protective devices 151. For example, once the data processing console 142 renders the 3D CAD file, the information is sent to the additive manufacturing device 106 to produce a 3D printed customized protective device 151.

In one or more embodiments, the additive manufacturing device 106 can receive data from the computing environment 102 for processing and creating the customized protective device 151. In some embodiments, the additive manufacturing device 106 can employ 3D printing techniques to produce the customized protective device 151. In particular embodiments, the additive manufacturing device 106 can have more than one 3D printing device, where each 3D printing device is programmed to perform a distinct act. For example, a first 3D printer may produce a base lattice structure of the customized protective device 151 using a specific material and technique, while a second 3D printer may produce an exterior mold of the customized protective device 151 using a different material and technique for production. In at least one embodiment, the additive manufacturing device 106 is one individual 3D printing system with configurable settings. For example, the additive manufacturing device 106 may be capable of creating all components of the customized protective device 151.

In various embodiments, the customized protective device 151 is defined as a padded customized material, designed to protect a particular area of the body for a specific individual. The customized protective device 151 may be created by the additive manufacturing device 106. In one or more embodiments, the customized protective device 151 is designed and manufactured in distinct layers. In at least one embodiment, the customized protective device 151 includes base layer, a lattice layer, and a top layer. The base layer and the top layer may add increased rigidity to the customized protective device 151. The lattice layer may increase the absorption capabilities of the customized protective device 151, as discussed further below with respect to FIGS. 32A-E.

In some embodiments, the subject data capture device 108 measures, records, and sends measurement data to the remaining components of the network environment 100. In particular embodiments, the subject data capture device 108 includes, but is not limited to, a cellphone, tablet, or other mobile computing device with an integrated measurement tool, an attachable scanning system, or a dedicated scanning device. In some examples, the subject data capture device 108 can perform some or any of the actions of the computing environment 102. For example, the subject data capture device 108 can process data locally and produce a CAD rendering of the patient's measurement data. In one or more embodiments, the subject data capture device 108 uses a data capturing device 108 to record point cloud data or triangle mesh data to formulate a 3D rendering of a body part of the patient. The subject data capture device 108 may store the data locally in a data store 116, distribute the data across the network 104 to other devices, or perform a combination of the two. For example, the data distribution module 120 can send subject data to the computing environment 102. In various embodiments, the data store 116 includes a script data 144 and a measurement data 146. In one or more embodiments, the script data 144 can include any code that, when executed by a processor, causes the subject data capture device 108 to perform operations such as measuring patient information, processing the patient information, and modeling data associated with the patient. In particular embodiments, the operations performed by the subject capture device 108 in response to executing the script data 144 result in measured data from a particular patient that is aggregated and locally stored as the measurement data 146.

In various embodiments, the subject data capture device 108 may also measure range of motion data. In one or more embodiments, the subject data capture device 108 predicts particular motions for the specific body part. In at least one embodiment, the subject data capture device 108 can capture new 3D scans based on the predicted range of motion of the particular patient. In particular embodiments, the subject data capture device 108 captures data as the patient moves their particular body part in various directions and using various methods. The subject data capture device 108 may create a snapshot of each position and create subject data 136 that relates to the range of motion of the subject. In various embodiments, the subject data capture device 108 or the computing environment 102 can employ machine learning algorithms, or any other algorithms, to facilitate predicting range of motions and recommending new customized protective devices 151 based on the range of motion data.

In some embodiments, the subject data capture device 108 captures the subject data 136 in the form of a point cloud or a polygon mesh from a 3D scanner. In at least one embodiment, the data collected by the subject data capture device 108 includes data from non-relevant sources such as surrounding objects. In various embodiments, the subject data capture device 108 considers the non-relevant data as noise. In particular embodiments, the subject data capture device 108 or the data processing console 142 can correct the subject data 136 to remove the noise collected during measurement.

In some embodiments, the computing environment 102 or the subject data capture device 108 utilizes a previously compiled data set from the subject data 136. In various embodiments, a previously compiled data set is defined as subject data 136 of previous patients. In some embodiments, the computing environment 102 aggregates subject data 136 from past patients and uses the subject data 136 to approximate current or future modeling. The previously compiled data set may include, but is not limited to, polygon meshes or point cloud data taken from model subjects of varying sizes and proportions. In some embodiments, the point clouds or meshes from the subject data 136 is aligned to a specific coordinate system, plane, or axis depending on the type of customized protective device 151. The computing environment 102 may align and orient the point cloud or polygon mesh subject data 136 for a current patient by using previously compiled data sets. For example, if the current client is a 5'10" male weighing 175 pounds, the computing environment 102 may compare the current subject data 136 to the previously collected subject data 136 of patients with a similar body composition. In particular embodiments, the extracted data sets also include labels in the form of meshes, bounding boxes, curves, points, or vectors that are correctly positioned on relevant anatomical landmarks.

In some embodiments, the computing environment 102 or the subject data capture device 108 receives subject data 136 and user data 132 (e.g., height and weight). In particular embodiments, the computing environment 102 or the subject data capture device 108 can parse the subject data 136 and the user data 132 for models that are within a defined range of similarity to the subject including factors such as size and gender. For example, searching for gender, size, proportion, or a combination thereof may quickly result in a smaller data set of reference models that are more likely to have similar anatomical feature sizes and/or proportions to the current patient. In various embodiments, the subject data 136 of the current patient is matched to each of the models in the set of models within the defined range of similarity. In at least one embodiment, the computing environment 102 or the subject data capture device 108 utilizes a point-set optimization algorithm that can minimize the distance between vertices in two polygon meshes or point clouds, such as between the models in the set of models and the subject data 136. Some example optimization algorithms may include, but are not limited to, the Iterative Closest Point (ICP) and the related Globally Optimized ICP (GO-ICP) algorithms. In particular embodiments, the computing environment 102 or the subject data capture device 108 chooses optimization algorithm and runs the algorithm on reduced complexity or decimated data that gives a rough approximation of the relevant shape in question. In one or more embodiments, the first run of the algorithm selects a reference model or a set of reference models that are most similar to the subject data 136. In at least one embodiment, the subject data 136 is matched against the smaller reference data set with higher-precision settings.

Once the subject data 136 is aligned closely to similar models from the reference set, more localized methods may be used to precisely locate and label features. In some embodiments, the computing environment 102 or the subject data capture device 108 uses principal component analysis (PCA) tools to evaluate a region where a bone or limb is expected to be located. In various embodiments, the computing environment 102 or the subject data capture device 108 uses local minimum or maximum analysis to precisely locate a bony protrusion or joint. In one or more embodiments, the computing environment 102 or the subject data capture device 108 uses neural networks to find these more precise landmarks. In some embodiments, the computing environment 102 or the subject data capture device 108 outputs information about relevant anatomical landmarks, such as curves, points, vectors, boxes, spheres, meshes, or point clouds, for further steps in the process. In an embodiment, upon identifying and labeling the relevant anatomical landmarks, the computing environment 102 may generate a design for the customized protective device 151, as discussed in detail below with respect to FIGS. 3 and 4.

Figure 2:
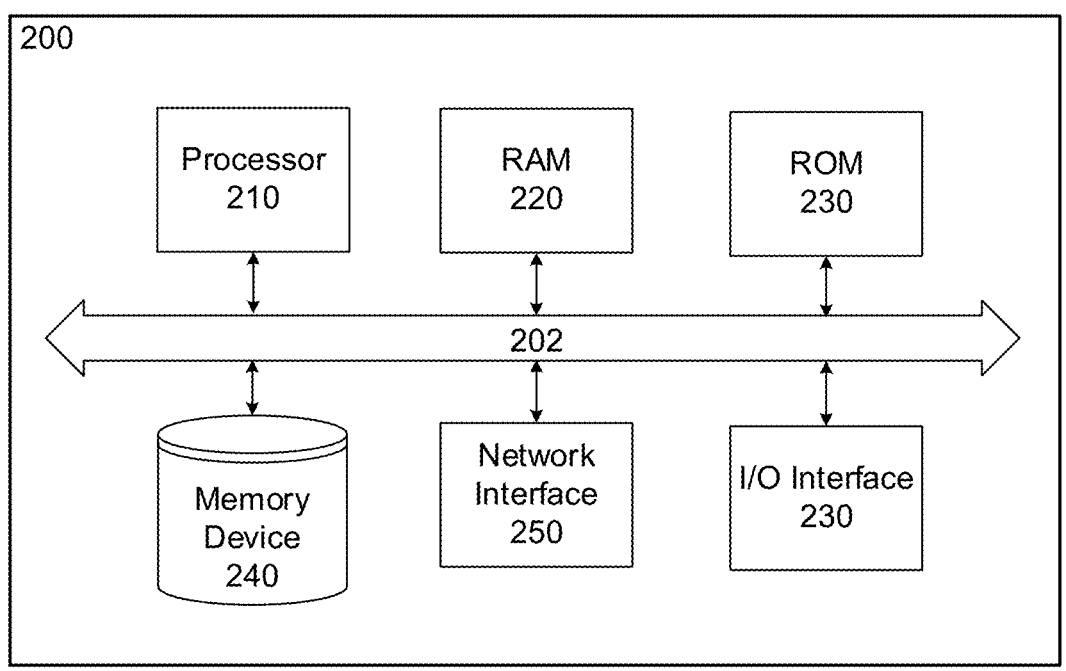
FIG. 2 illustrates an example schematic block diagram of a computing environment or a subject data-capture device, according to one embodiment of the present disclosure.

With reference to FIG. 2, shown is a schematic block diagram of the computing environment 102 or the subject data capture device 108, according to an embodiment of the present disclosure. In some embodiments, the computing environment 102 or the subject data capture device 108 includes one or more computing devices 200. In particular embodiments, each computing device 200 includes at least one processor circuit, for example, having a processor 210 and a memory 240, both of which are coupled to a local interface 202. To this end, each computing device 200 may include, for example, at least one server computer or like device. The local interface 202 may include, for example, a data bus with an accompanying address/control bus or other bus structure as can be appreciated.

In at least one embodiment, stored in the memory 240 are both data and several components that are executable by the processor 210. In particular embodiments, stored in the memory 240 and executable by the processor 210 are the management service 114, the measurement module 118, the data distribution module 120, and potentially other applications. In one or more embodiments, also stored in the memory 240 may be a data store 112, a data store 116, and other data. In addition, an operating system may be stored in the memory 240 and executable by the processor 210.

It is understood that there may be other applications that are stored in the memory 240 and are executable by the processor 210 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Flash®, or other programming languages.

In some embodiments, a number of software components are stored in the memory 240 and are executable by the processor 210. In this respect, the term "executable" means a program file that is in a form that can ultimately be run by the processor 210. Examples of executable programs may be, for example, a compiled program that can be translated into machine code in a format that can be loaded into a random access portion of the memory 240 and run by the processor 210, source code that may be expressed in a proper format such as object code that is capable of being loaded into a random access portion of the memory 240 and executed by the processor 210, or source code that may be interpreted by another executable program to generate instructions in a random access portion of the memory 240 to be executed by the processor 210, etc. In various embodiments, an executable program may be stored in any portion or component of the memory 240 including, for example, random access memory (RAM) 220, read-only memory (ROM) 230, hard drive, solid-state drive, USB flash drive, memory card, optical disc such as compact disc (CD) or digital versatile disc (DVD), floppy disk, magnetic tape, or other memory components.

In particular embodiments, the memory 240 is defined herein as including both volatile and nonvolatile memory and data storage components. In some embodiments, volatile components are those that do not retain data values upon loss of power. In at least one embodiment, nonvolatile components are those that retain data upon a loss of power. Thus, the memory 240 may include, for example, random access memory (RAM) 220, read-only memory (ROM) 230, hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM 220 may include, for example, static random access memory (SRAM), dynamic random access memory (DRAM), or magnetic random access memory (MRAM) and other such devices. The ROM 230 may include, for example, a programmable read-only memory (PROM), an erasable programmable read-only memory (EPROM), an electrically erasable programmable read-only memory (EEPROM), or other like memory device.

Also, the processor 210 may represent multiple processors 210 and/or multiple processor cores and the memory 240 may represent multiple memories 240 that operate in parallel processing circuits, respectively. In such a case, the local interface 202, network interface 250, and/or I/O interface 230 may be an appropriate network that facilitates communication between any two of the multiple processors 210, between any processor 210 and any of the memories 240, or between any two of the memories 240, etc. The local interface 202 may include additional systems designed to coordinate this communication, including, for example, performing load balancing. The processor 210 may be of electrical or of some other available construction.

Although the management service 114, the measurement module 118, the data distribution module 120, and other various systems described herein may be embodied in software or code executed by hardware as discussed above, as an alternative the same may also be embodied in dedicated hardware or a combination of software/hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application-specific integrated circuits (ASIC s) having appropriate logic gates, field-programmable gate arrays (FPGAs), or other components, etc.

Figure 3:
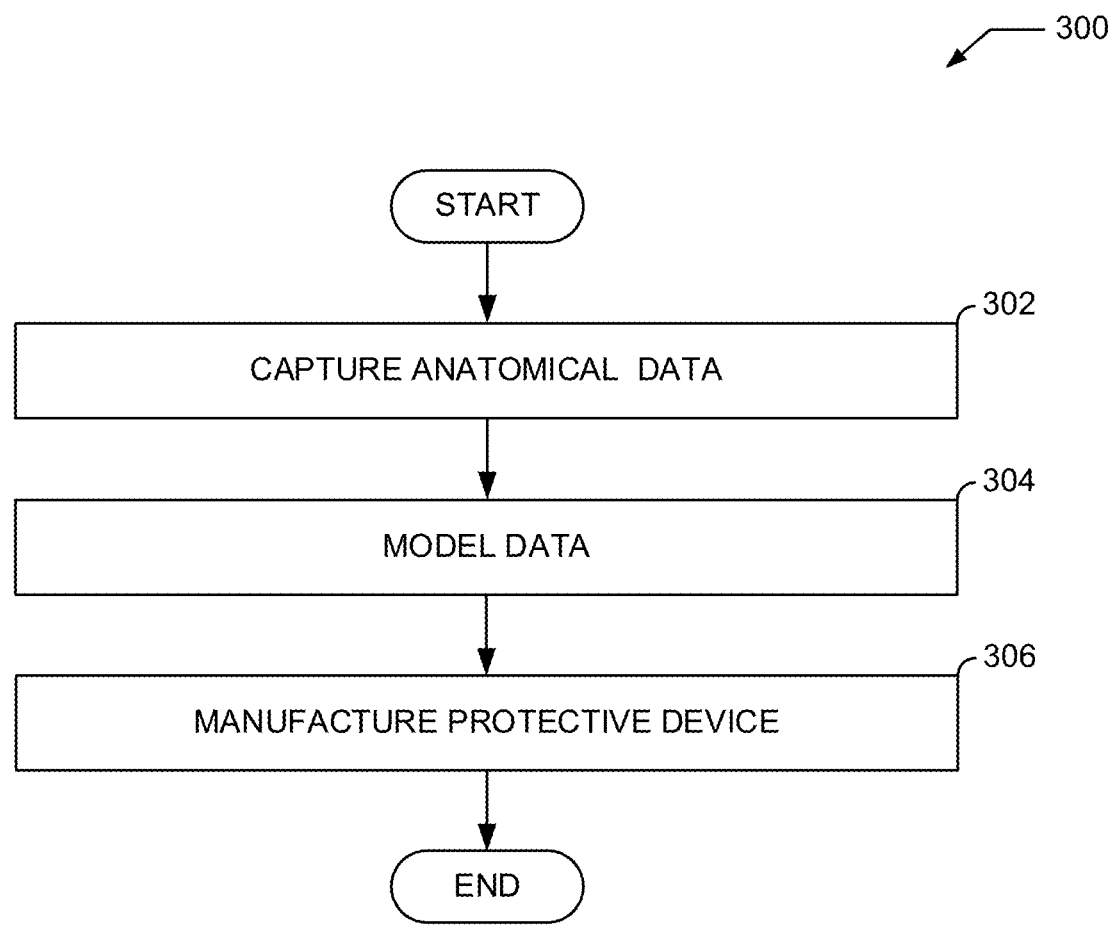
FIG. 3 illustrates an example flowchart of a process for the measurement, modeling, and creation of a customized protective device, according to one embodiment of the present disclosure.
Figure 4:
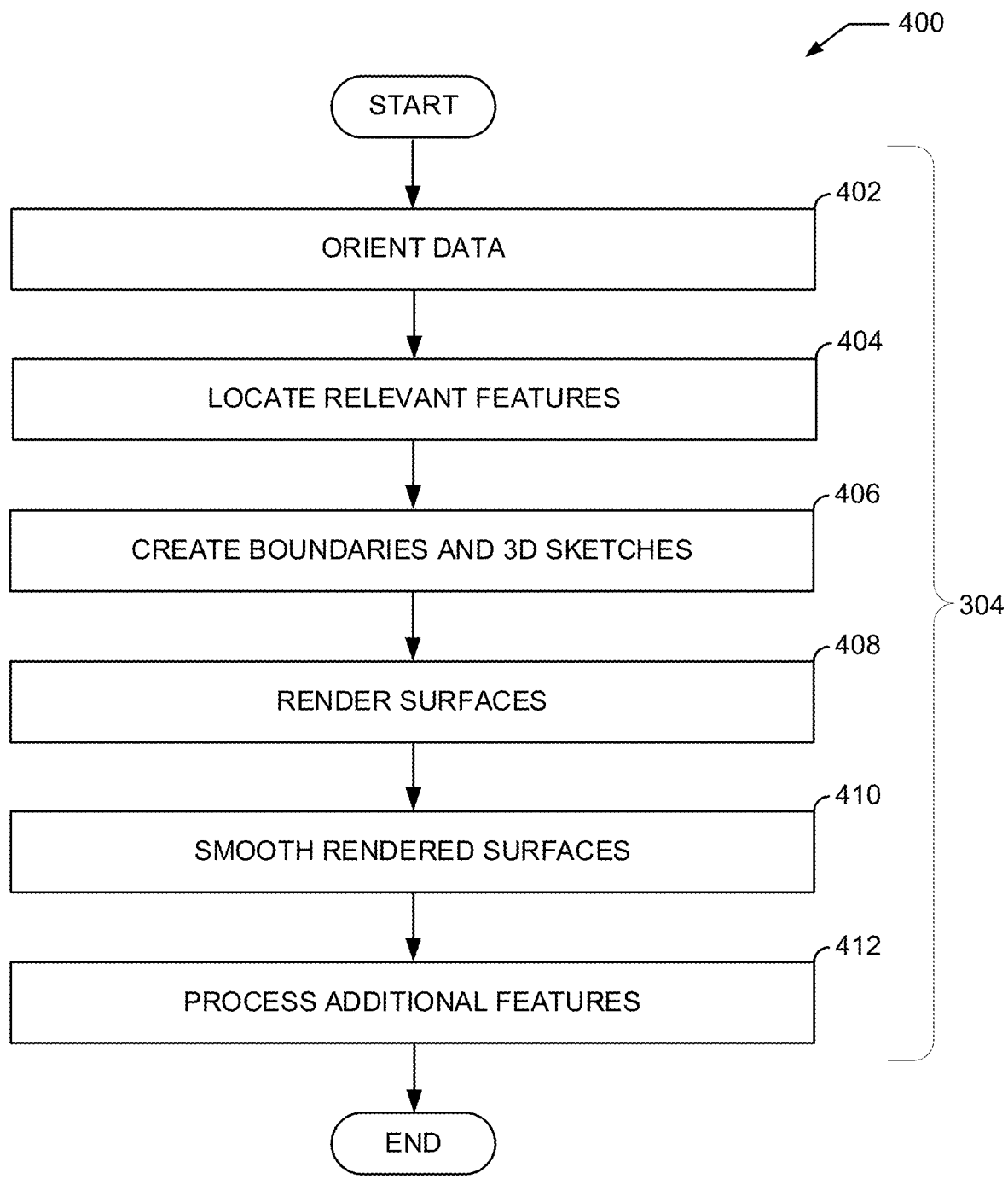
FIG. 4 illustrates an example flowchart of a process for the modeling of a customized protective device, according to one embodiment of the present disclosure.
Figure 5A:
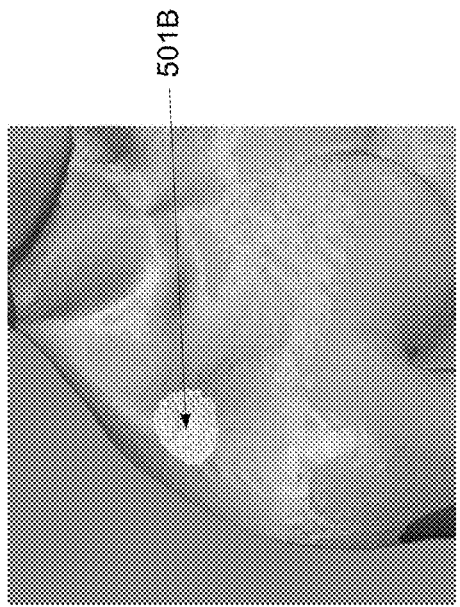
FIGS. 5A-D illustrate exemplary modeling data for producing a customized protective device for an acromioclavicular joint, according to one embodiment of the present disclosure.
Figure 5B:
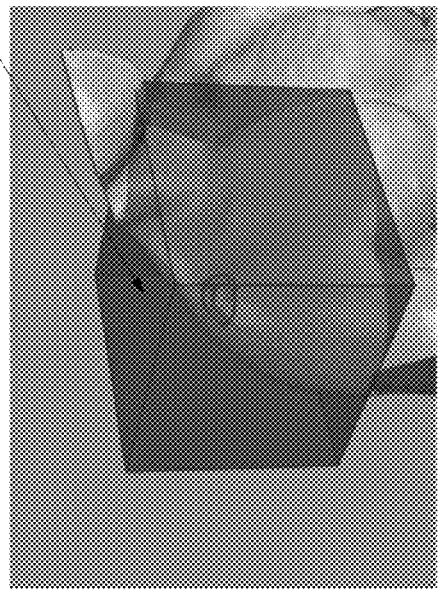
Figure 5C:
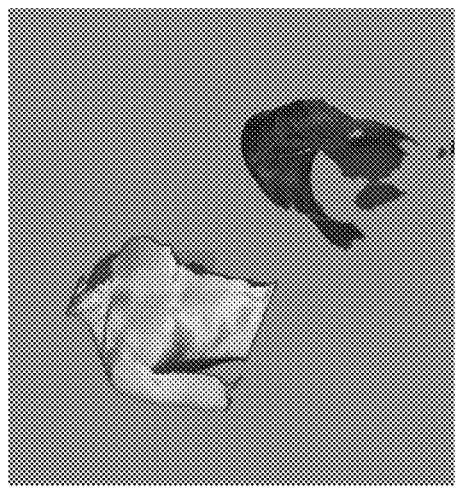
Figure 5D:
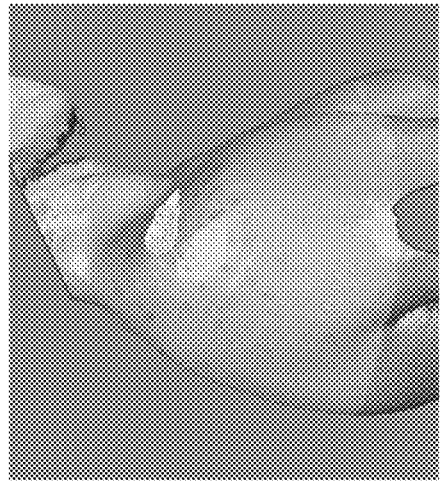
Figure 7E:
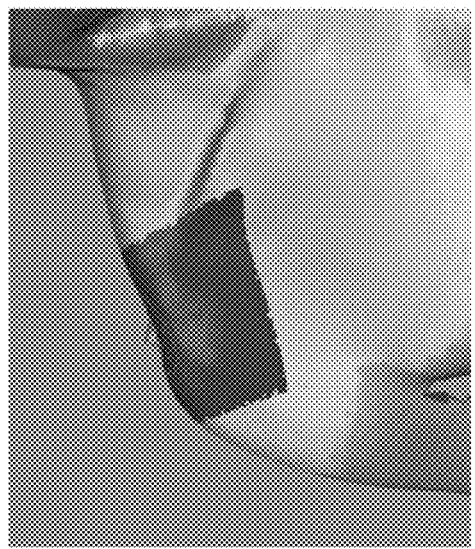
FIGS. 7A-E illustrate exemplary modeling data for producing a customized protective device for the acromioclavicular joint, according to one embodiment of the present disclosure.
Figure 7D:
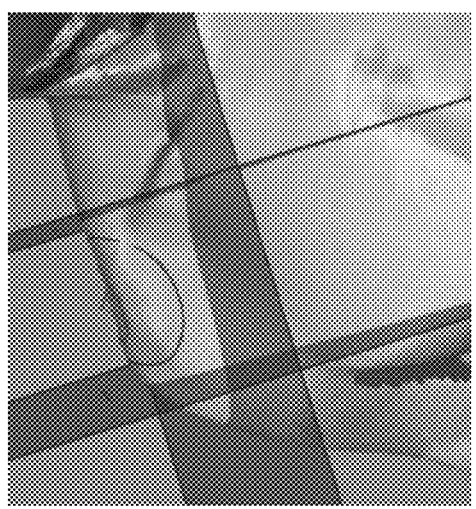
Figure 7B:
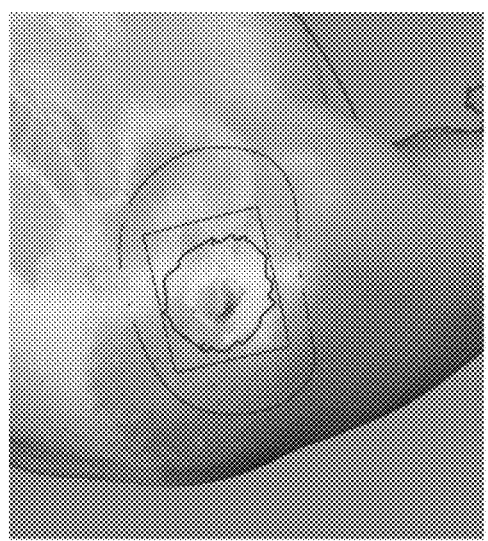
Figure 7A:
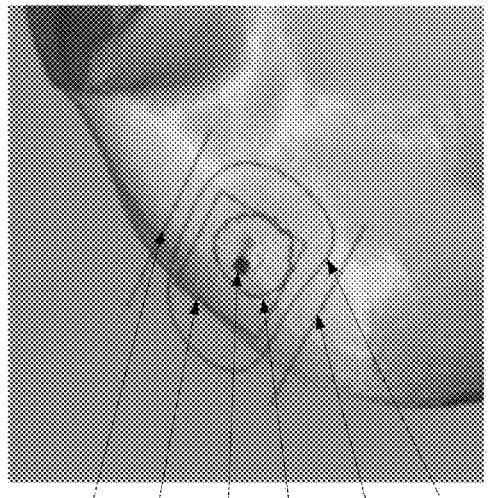
Figure 7C:
Figure 8B:
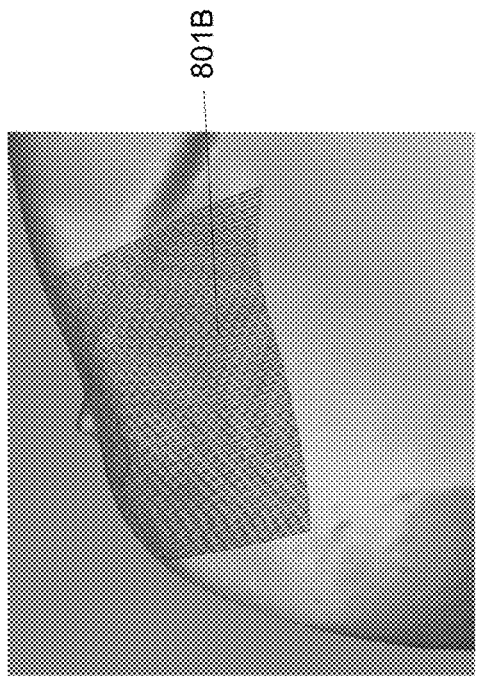
FIGS. 8A-D illustrate exemplary modeling data for producing a customized protective device for the acromioclavicular joint, according to one embodiment of the present disclosure.
Figure 8D:
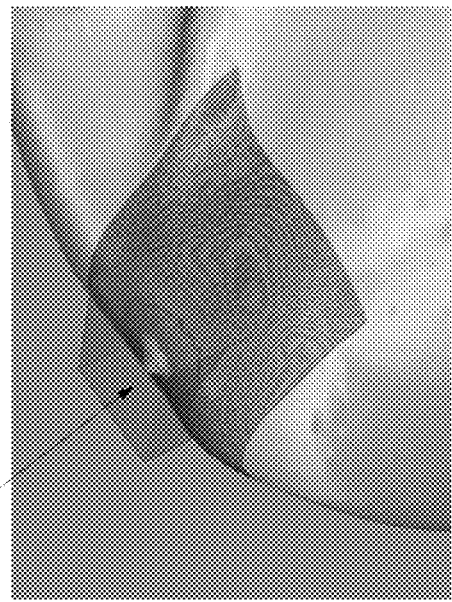
Figure 8A:
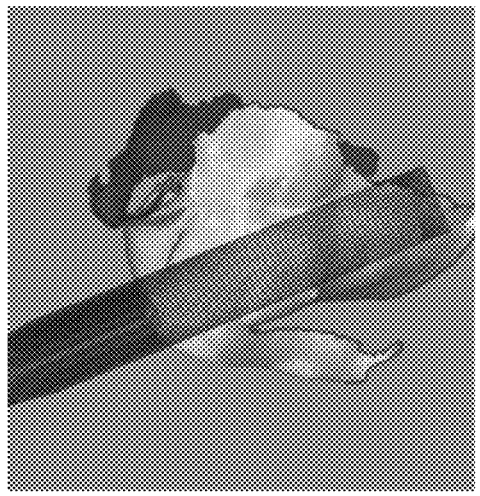
Figure 8C:
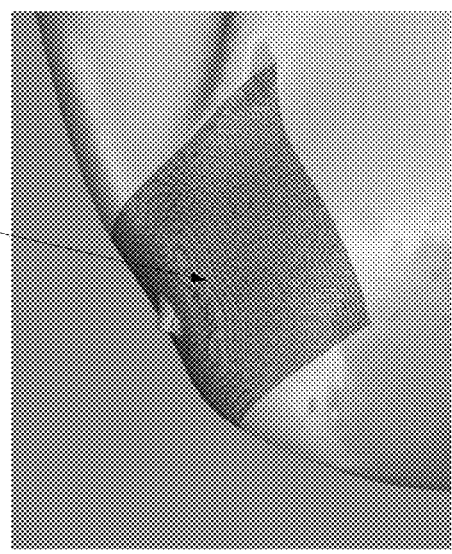

The flowcharts of FIGS. 3 and 4 may show the functionality and operation of an implementation of portions of the management service 114, the measurement module 118, the data distribution module 120, and any other particular program. If embodied in software, each block may represent a module, segment, or portion of code that includes program instructions to implement the specified logical function(s). The program instructions may be embodied in the form of source code that includes human-readable statements written in a programming language or machine code that includes numerical instructions recognizable by a suitable execution system such as a processor 210 in a computer system or other system. The machine code may be converted from the source code, etc. If embodied in hardware, each block may represent a circuit or a number of interconnected circuits to implement the specified logical function(s).

Although the flowcharts of FIGS. 3 and 4 show a specific order of execution, it is understood that the order of execution may differ from that which is depicted. For example, the order of execution of two or more blocks may be scrambled relative to the order shown. In various embodiments, two or more blocks shown in succession in FIGS. 3 and 4 are executed concurrently or with partial concurrence. Further, in some embodiments, one or more of the blocks shown in FIGS. 3 and 4 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

In some embodiments, any logic or application described herein, including the management service 114, the measurement module 118, the data distribution module 120, and any particular program, that includes software or code can be embodied in any non-transitory computer-readable medium for use by or in connection with an instruction execution system such as, for example, a processor 210 in a computer system or other system. In this sense, the logic may include, for example, statements including instructions and declarations that can be fetched from the computer-readable medium and executed by the instruction execution system. In the context of the present disclosure, a "computer-readable medium" may be any medium that may contain, store, or maintain the logic or application described herein for use by or in connection with the instruction execution system.

In one or more embodiments, the computer-readable medium includes any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including the management service 114, the measurement module 118, and the data distribution module 120, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same computing device 200 or in multiple computing devices in the same computing environment 102 or subject data capture device 108. Additionally, it is understood that terms such as "application," "service," "system," "engine," "module," and so on may be interchangeable and are not intended to be limiting. For example, while specific functionality may be described as happening by a specific application (e.g., the management service 114, the measurement module 118, and the data distribution module 120), it us understood that the functionality described may be interchangeable and is not intended to be limiting to a specific component.

Referring now to FIG. 3, illustrated is an example flowchart of a process 300 for measurement, modeling, and creation of the customized protective device 151, according to one embodiment of the present disclosure. In particular embodiments, the process 300 includes a high-level approach for creating customized protective devices 151. In various embodiments, the customized protective devices 151 are described with respect to clavicle injuries, but the process 300 is applicable to any injured body part that could benefit from a customized protective device 151. For example, the customized protective device 151 may be produced for a patient with a shin splint or a patient with a large bruise. In at least one embodiment, the customized protective device 151 takes on any particular shape.

At box 302, the process 300 includes capturing anatomical data. In particular embodiments, the anatomical data is captured from a subject, such as a patient with an injury. In some embodiments, the subject data capture device 108 may be or may include a 3D scanner, and the subject data 136 may be a 3D scan captured by the scanner. Various types of 3D scanners may be used, such as a structured-light scanner, an infrared scanner, a mobile computing device with built-in scanning capabilities, a time-of-flight laser scanner, a triangulation-based laser scanner, 3D light detection and ranging (LIDAR) scanner, or other suitable scanning device for obtaining a 3D scan. In some embodiments, the subject data received from the subject data capture device 108 may be in the form of a point cloud (i.e., a set of data points arranged in 3D space) or a triangle mesh (i.e., a mesh of interlocking triangular surfaces), although other suitable types of polygon mesh may be used. In some embodiments, relevant anatomical features including bone structures, bruises, or pain points are located using 2 or 3-dimensional markings on a patient and captured alongside other relevant patient data. In other embodiments, data captured from the subject may include motion tracking or 3D scans or images taken at several positions including functional weight bearing positions based on the specifications of the subject.

At box 304, the process 300 includes a data modeling process. In an example, the data processing console 142 may process subject data received from the subject data capture device 108 and create a digital model of a customized protective device 151 for the intended subject. In doing so, the data processing console 142 may utilize various computer-aided design (CAD) software capabilities. In some embodiments, a human user may validate results from data processing console 142. In some embodiments, the computing environment 102 may be designed to easily receive inputs from a human user. In one or more embodiments, this may involve allowing the user to correct some aspects of the customized protective device 151 design in real time, such as identifying boundary locations, and saving more complex, longer runtime calculations to be completed afterwards. In some examples, the data processing console 142 may be configured for use by a trained design engineer, a medical professional, or a subject without any CAD experience. In some embodiments, the data processing console 142 is able to create repeatable, customized protective devices 151 quickly and easily while still enabling flexible changes based on subject specifications.

At box 306, the process 300 includes manufacturing the customizable protective device 151, according to one embodiment of the present disclosure. The additive manufacturing device 106 may create customized protective devices 151 using a digital model created by the data processing console 142. In some embodiments, the additive manufacturing device 106 may be or may include a 3D printer, such as a stereolithography (SLA) printer, although other suitable additive manufacturing techniques may be used. In some embodiments, the properties of the material used to form the customized protective device 151 generally depend on the application and intended purpose of the customized protective device 151. As described below, certain types of protective devices may provide direct impact shielding from injured or previously injured body portions, for example, by creating the customized protective device 151 with a bridge or dome structure.

For such customized protective devices 151, the material used may be highly impact resistant and rigid enough to resist deformation. In some embodiments, the material used for these devices may have an Izod impact strength that is equal to or greater than about 60-100 J/m, about 60-70 J/m, about 70 J/m, about 70-80 J/m, about 80-90 J/m, or about 90-100 J/m. In at least one embodiment, the material demonstrates a flexural modulus that is equal to or greater than about 0.4-0.9 GPa, about 0.4-0.5 GPa, about 0.5 GPa, about 0.5-0.6 GPa, about 0.6-0.7 GPa, about 0.7-0.8 GPa, or about 0.8-0.9 GPa. Other types of protective devices may prevent or inhibit rotation or movement of joints. For such applications, it may be advantageous to use a material that emphasizes rigidity over impact resistance. Additionally, the material may be sufficiently robust such that flexing is unlikely to cause material failure. In some embodiments, the material for devices intended to prevent or inhibit rotation or movement of joints may have a flexural modulus that is equal to or greater than 0.85 GPa and an elongation at break of more than 50% in tensile testing. In various embodiments, the material of the protective devices is biocompatible and resists deformation during exposure to heat up to 150 degrees Fahrenheit. In some embodiments, a customized protective device 151 may be formed of polypropylene photopolymer, although other suitable materials satisfying the material properties may be used.

Referring now to FIG. 4, illustrated is an example flowchart of the process 400 for the modeling of the customized protective device 151, according to one embodiment of the present disclosure. In particular embodiments, the process 400 generally relates to the modeling procedure of the data processing console 142, such as the data modeling process of box 304 described above with respect to FIG. 3. In some embodiments, the process 400 is performed to produce a 3D model of a subject using the corresponding subject data 136.

At box 402, the process 400 includes orienting data. To aid the orientation process, one or more tracking dots (or other suitable markings) may be placed on the injured location of the patient to enhance the scanning capabilities of the subject data capture device 108 and/or to provide additional or more targeted data for modeling the injured location. In one or more embodiments, adding a tracking dot can increase the measurement ability of the subject data capture device 108 by providing the subject data capture device 108 with a focal point during measurements. After the subject data capture device 108 records measurements of a particular patient, the subject data capture device 108 may send the measured subject data 136 to the computing environment 102. In one or more embodiments, the computing environment 102 receives the measured subject data 136 in the form of a polygon mesh or point cloud data set.

In particular embodiments, the data processing console 142 orients the subject data 136 by positioning the measured subject data 136 in the correct 3D location. In some embodiments, the data management console 140 uses the current subject data 136 to search the data storage 112 for similar subject data 136. In at least one embodiment, the data management console 140 compiles all similar previously collected subject data 136. In one or more embodiments, the data processing console 142 compares current subject data 136 to previously collected subject data 136 to enhance the modeling of the current subject data 136. For example, the data processing console 142 compares subject data 136 of the previously created model to the current subject data 136. Continuing this example, the data processing console 142 makes adjustments to the subject data 136 of the current model based on the subject data 136 of the previously created model. In at least one embodiments, the data processing console 142 uses similar previously recorded subject data 136 to accurately align the subject data 136 of the current patient. In various embodiments, the data processing console 142 aligns the subject data 136 in a three coordinate axis system, which corresponds to the three coordinate axis system of the world. For example, when creating a 3D scan of an acromioclavicular (AC) joint, the polygon mesh of the subject data 136 is properly aligned to a consistent position in 3D digital space.

At box 404, the process 400 includes locating relevant features from the anatomical scan. In some embodiments, the located relevant features include anatomical landmarks from the subject data 136. The shape and functions of the customized protective devices 151 may often be parametrically determined by particular bones, joints, or muscle locations. In various embodiments, if the features can be reliably and precisely identified, the final customized protective device 151 can be more standardized. For example, a customized protective device 151 made for a subject may be the same or similar when created from two different sets of subject data 136 from the same subject. In one or more embodiments, the same devices created for different subjects perform the same functions when worn by the subjects even if the shapes or sizes vary considerably.

In some embodiments, the data processing console 142 may match, using a closest point optimization algorithm or another similar algorithm, the subject data 136 in the form of a polygon mesh or point cloud to a set of reference meshes, depth images, or point clouds that contain anatomical data from human models of similar sizes. This process can take on a hierarchical structure. The data processing console 142 may search through the subject data 136 and select a set of reference data captured from human models that have similar relevant characteristics to the subject, such as size and anatomical features included in the scan. In some embodiments, the data processing console 142 runs a closest point optimization algorithm to test the match of the subject data 136 to each input in the reference set using meshes or point clouds of a reduced size meant to approximate the general shape of the desired anatomical feature. Once the best reference model is selected, the data processing console 142 may run a similar optimization algorithm or series of algorithms to more precisely match the subject data 136 to the reference data gathered from the modeling data 134. After the subject data 136 is more closely matched to the reference data that contains labeled anatomical landmarks, the data processing console 142 may run various other algorithms on localized regions of interest including principal component analysis, local minimum or maximum analysis, neural networks trained with curvature maps, raw 3D data, or 2D projections, or other related algorithms. In one or more embodiments, these methods may then export precise labels and information about the exterior surface, underlying bone or muscle structures, or limbs of the subject for subsequent use in the process 400. In various embodiments, this information may take the form of 3D curves, points, vectors, planes, spheres, cylinders, meshes, point clouds, or orthographic projections that can correspond to bones, joints, protrusions, or surface contours.

At box 406, the process 400 includes creating boundaries and 3D sketches. In various embodiments, the data processing console 142 uses the data produced after orienting and locating the relevant features. In some embodiments, the shape of the customized protective device 151 may be a parametric function determined from standardized measurements or metrics taken directly from the patient data. The shape, form, and function of the customized protective device 151 may be based on functionally or clinically relevant inputs instead of pre-determined dimensions. For example, one feature of a disclosed thumb guard design is that it may extend across the surface of the subject's hand to the midline between the subject's middle and ring fingers. In various embodiments, this is opposed to a traditional approach of setting devices dimensions to have a fixed width and curvature for a given size.

In some embodiments, 3D sketches or boundaries can also be used to demarcate certain relevant features of the final customized protective device 151, such as lofted bumps, channels, and cutouts. In some embodiments, the data processing console 142 may create a 3D device boundary by moving points orthogonal to relevant anatomical landmarks along a polygon mesh of the subject data. The data processing console 142 may find a tangent vector of a 3D curve at a relevant position and calculating the cross-product of that vector with the normal of a polygon mesh at the closest position. In some embodiments, the vector may also be re-calculated at discrete increments to maintain consistency. In at least one embodiment, a two-dimensional (2D) sketch of a device may be projected onto a polygon mesh of the subject's data from a locally defined plane or surface. In one or more embodiments, a human user may also alter the location of the landmarks or device boundary to suit the particular specifications of a subject or validate results given automatically by the data processing console 142.

At box 408, the process 400 can include rendering surfaces. In at least one embodiment, the data processing console 142 can create a continuous surface of geometry that fits, at least in part, to the subject data 136 at the relevant locations marked by the 3D curves created in the boundary creation. In some embodiments, the subject data 136 is represented in a discretized format such as a polygon mesh or point cloud. In some embodiments, continuous geometries have many benefits over discrete representations including reduced file sizes, greater ease and freedom when performing CAD modeling operations, mathematical smoothness, and greater control of tolerance.

In some embodiments, the process of generating this piece of continuous geometry involves first creating 3D curves that fit on the polygon mesh and then subsequently generating a Non-uniform rational B-spline (NURBS) surface from those curves. In some embodiments, the subject polygon mesh can first be sectioned to isolate the minimum area to create the customized protective device 151 corresponding to the boundary of the customized protective device 151. In various embodiments, the data processing console 142 isolates the minimum area of the polygon mesh by referencing the boundary of the customized protective device 151. In some embodiments, the data processing console 142 creates new boundaries for the polygon mesh by expanding the boundary of the customized protective device 151 by a predetermined factor. In various embodiments, the data processing console 142 decreases computational stress by redefining the rendering surfaces of the polygon mesh. By reducing the target location for rendering, the data processing console 142 reduces the computational stress on the computing environment 102. For example, if the data processing console 142 renders a customized protective device 151 for a shoulder, the data processing console 142 can reduce the computational stress on the computing environment by removing unnecessary chest, neck, and head data from the rendering. Oftentimes, a series of planes or surfaces spaced at discrete intervals may be generated and used to intersect the mesh, resulting in polylines or curves. A polyline may be defined as a line created by connecting a set of points with consecutive lines. In some embodiments, the process of plane spacing can be more simply described as sampling the shape and curvature of the mesh at discrete intervals. In other embodiments, curves or curve networks may be generated directly from the principal curvature of the mesh and optimized for flow direction.

For some customized protective devices 151 that have features that deviate from the subject data 136, the curves may be deformed using vector fields, simulated forces, or intersecting geometries, among other curve deformation techniques. Deviations may occur in the customized protective device 151 when a patient has recently had surgery and the customized protective device 151 is designed to avoid stiches. In one or more embodiments, the exact deformation may be based on the function of the customized protective device 151 and the specific specifications of the patient. These curves, deformed or not, may be used to create a surface or series of surfaces, using loft, network surface, or other relevant CAD operations, that fit to the polygon mesh at least in part with a defined tolerance. In various embodiments, the surface may be first generated from the curves before being deformed by a simulated force, vector field, or simulated collision with geometry.

In some embodiments, the data processing console 142 offsets data points relative to the body part of interest. The data processing console 142 may determine offset data point locations by placing the point a certain distance away from the polygon mesh data. In particular embodiments, the data processing console 142 connects offset points to form a curve a certain distance above the body part of interest. In some embodiments, the data processing console 142 incorporates this raised curve to reduce contact between the body part of interest and the customized protective device 151. In at least one embodiment, by adding a raised portion to the customized protective device 151 above the injured body part, the customized protective device 151 can distribute force through other parts of the customized protective device 151 and away from the body part of interest.

At box 410, the process 400 includes smoothing rendered surfaces. In some embodiments, the quality of the surface created directly from a set of curves can fall short of standards such as smoothness or fairness. Because of this, the data processing console 142, in at least one embodiment, uses an optimization algorithm to correct these errors without losing fit to the measured subject data 136. In some embodiments, the surface is the direct input to the algorithm while other embodiments might leverage conversion to a quadrangulate mesh. In either format, competing forces may be applied to the input, which converge to an equilibrium that accomplishes smoothening of the rendered surfaces.

In some embodiments, the system attempts to a balance smoothness and fit to the mesh. In various embodiments, one of the competing forces may be a Laplacian smoothing method that recalculates the position of each vertex based on information from its neighboring vertices. The Laplacian smoothing method may result in shrinkage of the surface and cause a loss of toleranced fit to the subject data 136. In one or more embodiments, another such force used to address the shrinkage of the surface is an attraction force algorithm from the polygon mesh of the subject data 136. In some embodiments, the data processing console 142 can add additional forces to, for example, limit stress concentrations, create features, and smooth transitions between features. In some embodiments, adding additional forces by the data processing console 142 may be run iteratively until the surface meets the goals. In some embodiments, the data processing console 142 converts the mesh surface output from the smoothing process to a NURBS surface or polysurface. By converting the output of the smoothing process from a mesh surface to a NURBS surface or polysurface, the data processing console 142 may reduce the processing demands of the computing environment 102. A reduction in processing demands may occur when the data processing console 142 simplifies or removes more complicated data points generated by the smoothing algorithm.

At box 412, the process 400 includes processing additional features. Additional features may include a thickness of the customized protective device 151, customization of markings on the customized protective device 151, a composition of the material or layers of the customized protective device 151, or any other additional features. In some embodiments, the 3D curve marking the boundary of the customized protective device 151 is projected from the subject mesh or pulled onto the surface. In various embodiments, the curve is directly used to split the surface at the relevant location. In one or more embodiments, the curve may be used to create a surface or body to accomplish the splitting. In some embodiments, the trimmed surface is thickened into a solid body with a thickness determined by the use case and material. In one or more embodiments, the thickness of the customized protective device 151 may vary, being thicker in areas with higher stress concentrations. In particular embodiments, the data processing console 142 uses Finite Element Analysis or topology optimization methods to optimize the strength and weight of the customized protective device 151.

In some embodiments, various functional features including hinges, strap connectors, and screw holes may be added to the design. In at least one embodiment, non-functional features such as subject specific information including name and sports number as well as company or team branding information are added to the surface of the customized protective device 151 in order to increase the level of customization. In some embodiments, the additive manufacturing device 106 rounds or fillets the edges of the customized protective device 151 to enhance the fit of the customized protective device 151 for the subject. In some embodiments, lattice structures may be added to decrease the weight, achieve energy absorption characteristics specified, or optimize bending/splinting properties for a specific use case. The actions performed in the process 400 may be accomplished in different orders depending on the specific specifications of the customized protective device 151.

Referring now to FIGS. 5A-D, illustrated is an exemplary modeling data 134 for producing a customized protective device for an acromioclavicular joint, according to one embodiment of the present disclosure. In some embodiments, the subject data capturing device 108 captures subject data 136 of the particular patient. For example, the subject data capturing device 108 captures subject data 136 in the form of a polygon mesh by a 3D scanner, as described above with respect to the box 302 of process 300. In an embodiment, the position of the injured joint is marked by a 3D tracking dot adhered to the joint before the 3D scan is taken. In various embodiments, the data processing console 142 properly aligns the polygon mesh of the subject data 136 to a consistent position in 3D digital space determined by a second reference anatomy. In an embodiment, the data processing console 142 aligns the reference anatomy with the sagittal plane on an XY-plane of the 3D coordinate system, and the coronal plane aligned with the XZ-plane. In various embodiments, the chin is pointed towards the negative y-axis and the base of the sternum is aligned on the XY-plane. This process may be performed by the data processing console 142, as described above with respect to the box 402 of the process 400.

In particular embodiments, once aligned, the data processing console 142 or trained user of the program can locate relevant anatomical features. In various embodiments, an input for the data processing console 142 or a trained user for locating relevant anatomical features is a roughly circular mesh 501B centered on the 3D tracking dot that marks the location of the AC Joint.

In one or more embodiments, the subject data 136 is processed by the data processing console 142, which generates three individual planes. In some embodiments, the data processing console 142 uses the individual planes to crop the polygon mesh down the midline of the chest, at the apex of the armpit and midway along the front of the neck perpendicular to the local surface normal.

In various embodiments, the data processing console 142 creates a bounding box 501C from the plane corresponding to the midline of the chest. In various embodiments, the bounding box 501C is used to measure the approximate chest depth (back of the chest to the front) and the shoulder width (from the midline of the sternum to the furthest point on the shoulder). The data processing console 142 may create the bounding box 501C to define the area in which the customized protective device 1200 is created. The data processing console 142 may store this data in the modeling data 134 for further processing, such as the processing that results in FIGS. 6A-6F described below.

Referring now to FIGS. 6A-F, illustrated is exemplary modeling data 134 for producing a customized protective device for the acromioclavicular joint, according to one embodiment of the present disclosure. In particular embodiments, the data processing console 142 processes the subject data 136 to refine the location of rendering and model creation. In some embodiments, the polygon mesh 501B of the joint outline, the cropped polygon mesh, a Boolean value for right or left shoulder, and the corresponding measurements (e.g., the chest depth and shoulder width) are processed by the data processing console 142, which generates an outline of a shape 602B of a customized protective device 1200, which is described below with respect to FIGS. 12A-B. In some embodiments, and referring to FIG. 6B, the data processing console 142 finds the arithmetic mean vertex location and surface normal vector of the joint polygon mesh 501B. In one or more embodiments, the data processing console 142 uses the joint polygon mesh 501B to create a plane 601B perpendicular to the vector. With respect to FIG. 6A, the data processing console 142 may use the plane 601B to create a bounding box 601A around the joint mesh outline, where a top surface of the bounding box 601A is the location of the plane 601B and a bottom surface of the bounding box 601A is a location of a lower-most location of the shape 602B. In various embodiments, the data processing console 142 translates the plane 601B along the average normal vector by a distance equal to three times the height of the bounding box 601A. In particular embodiments, the data processing console 142 aligns the local x-axis of the created plane with the direction of the world x-axis, thus aligning the y-axis with the axis of the shoulder.

In one or more embodiments, and referring now to FIGS. 6C-F, the data processing console 142 creates a standardized sketch shape 601C on the world XY plane by interpolating points moved from the origin by defined distances. In various embodiments, the data processing console 142 uses the standardized sketch shape 601C to determine the polygon mesh dimensions along with providing the dimensionality of the customized protective device 1200. For example, the standardized sketch shape 601C and size has been experimentally determined to fit a 200 lb, 5'10" male college football player with a 250 mm chest width and 265 mm chest depth as measured using methods described above. Continuing this example, the width of the shape 601C is 80 mm (0.3-0.35 of the chest width), and the length of the standardized sketch shape 601C is 115 mm (0.40-0.45 of the chest depth). In one or more embodiments, the data processing console 142 scales the size of the standardized sketch shape 601C based on the measurements of the subject. The data processing console 142 may accomplish the scaling by dividing each of the measurements by the dimensions used to determine the standardized sketch shape 601C. In some embodiments, the data processing console 142 uses a factor of change to scale the size of the standard shape 601C so that it fits the subject data 136. In various embodiments, once the data processing console 142 scales the measurements of the subject, a rectangular box 601E is used to demarcate the region that is lofted above the skin surface to distribute force away from the injured joint. In one or more embodiments, the data processing console 142 sets the width of the rectangular box 601E to a factor of 0.5 times the sketch width, and the length is set to be 0.4 of the sketch length. In some embodiments, the data processing console 142 creates a 2D bounding box around the sketch shape. Bounding curves 601F and 602F that are parallel with the length midline are isolated and moved away from the origin 0.2 times the width of the sketch. If the subject specifies a device for their opposite shoulder, or any other body part that is symmetrical, the data processing console 142 may mirror the shape 601C about the middle axis.

Referring now to FIGS. 7A-E, illustrated is exemplary modeling data 134 for producing a customized protective device for the acromioclavicular joint, according to one embodiment of the present disclosure. In various embodiments, the standardized sketch shape 601C, rectangular box 601E, and bounding curves 601F and 602F are translated from the world coordinate system to the local coordinate system described by the plane 601B created above the joint outline. In some embodiments, the data processing console 142 projects the standardized sketch shape 601C and the lofted rectangular box 601E onto the polygon mesh. In some embodiments, the data processing console 142 extrudes the bounding curves 601F and 602F along the same projection vector into cutting surfaces. In one or more embodiments, the data processing console 142 generates a third surface 703C perpendicular to a first surface 701C and a second surface 702C. In various embodiments, the third surface 703C is 1.2 times below the distance between the plane and the furthest point on the standardized sketch shape 601C. In particular embodiments, the data processing console 142 or a trained user varies the shape of the outline and/or lofted boundary to ensure the product is suited for the particular specifications of the subject depending on factors such as injury severity, preference, and sport prerequisites. In one or more embodiments, the data processing console 142 takes the information from the sketch alignment and creates a minimally sized bounding space on the subject polygon mesh that a continuous surface is fit to in future steps. In various embodiments, the data processing console 142 creates a minimally sized bounding space by reducing the area and volume of the polygon mesh while still containing every point of the continuous surface. In one or more embodiments, the data processing console 142 preserves accuracy and reduces computational effort by reducing the bounding space of the subject polygon mesh.

Referring now to FIGS. 8A-D, illustrated is exemplary modeling data 134 for producing a customized protective device for the acromioclavicular joint, according to one embodiment of the present disclosure. Once the minimum polygon mesh surface is isolated, the data processing console 142 segments a mesh 801B using evenly spaced perpendicular surfaces. In various embodiments, the data processing module 142 segments the mesh 801B to facilitate faster processing and to allow line manipulation when defining particular features. For example, the data processing console 142 manipulates the line segments when a bump is defined (see FIGS. 9A-C). The two boundary surfaces may be parallel with the shape of the projected sketch 601C and the rectangular box 601E. In some embodiments, the mesh 801B is used to create a smooth flowing surface that accurately fits the customized protective device 1200 tolerances. In various embodiments, the spacing between the surfaces or planes is set at 1 mm for the particular customizable protective device 1200. When intersected with the mesh, the data processing console 142 may create 2D polylines that sample the mesh shape and curvature to a very fine tolerance. The resulting polylines may then be divided into 1 mm long segments and the evenly spaced points are used to interpolate smooth, continuous NURBS curves. In various embodiments, the data processing console 142 selects a curve 801C that comes closest to intersecting the middle of the joint. In at least one embodiment, the rectangular curve used to mark the lofting area is extruded into a solid body 801D that will be used to isolate the relevant curves.

Figure 9A:
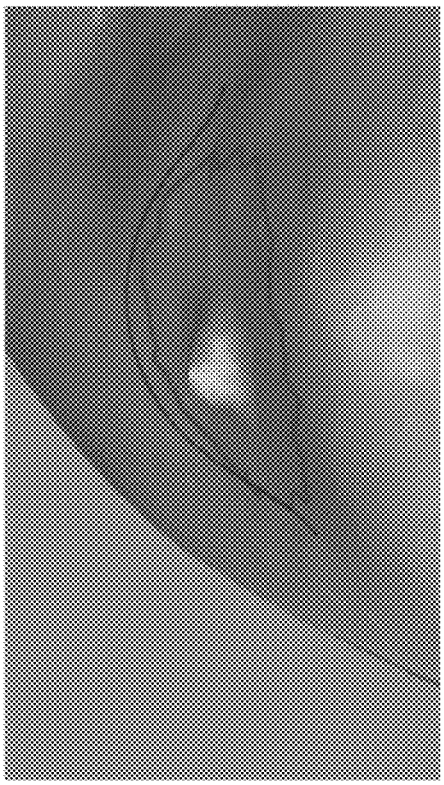
FIGS. 9A-C illustrate exemplary modeling data for producing a customized protective device for the acromioclavicular joint, according to one embodiment of the present disclosure.
Figure 9B:
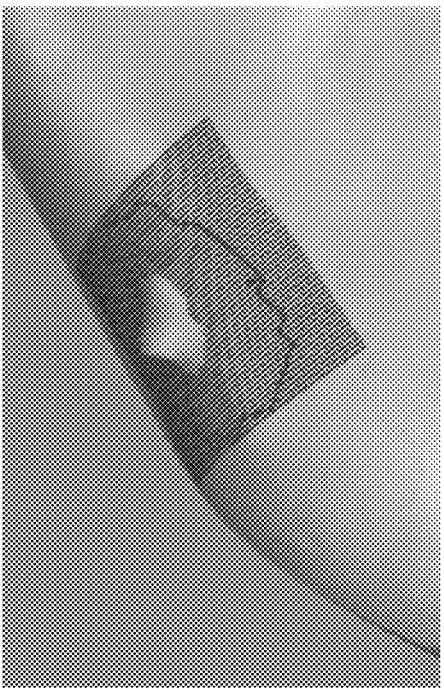
Figure 9C:
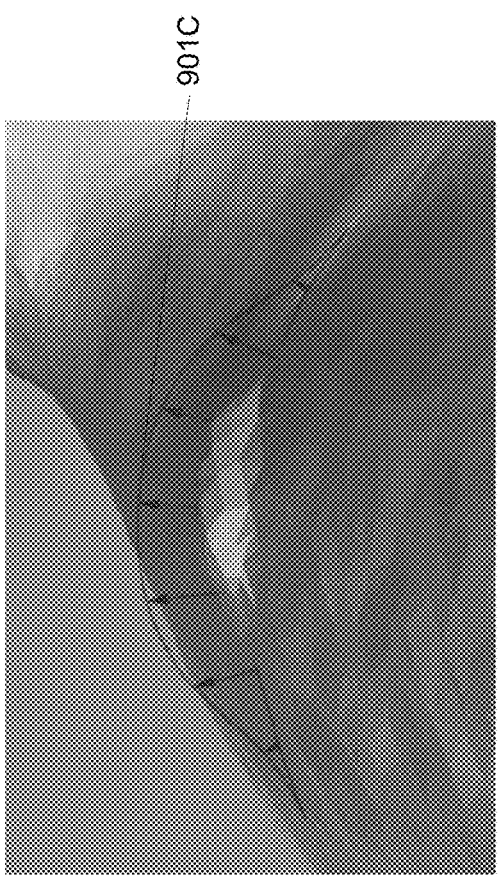
Figure 10A:
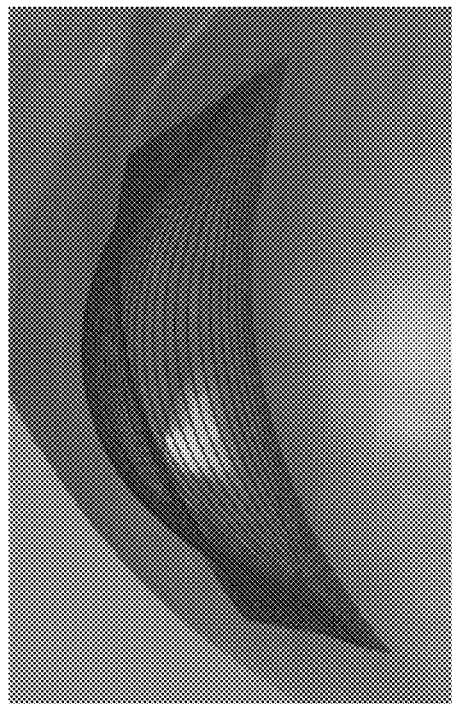
FIGS. 10A-D illustrate exemplary modeling data for producing a customized protective device for the acromioclavicular joint, according to one embodiment of the present disclosure.
Figure 10B:
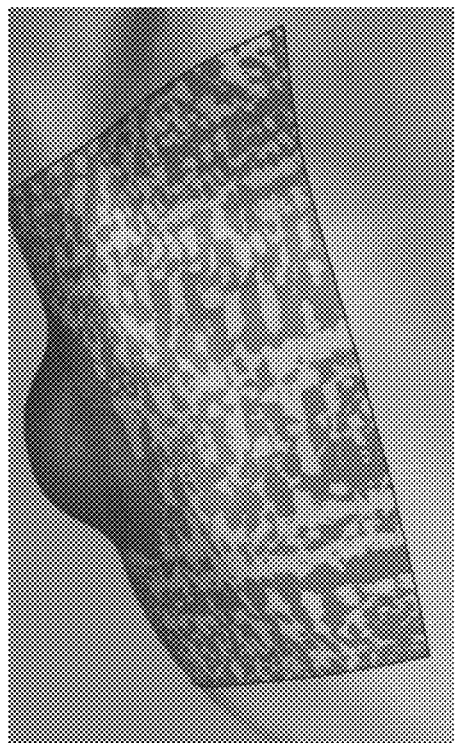
Figure 10C:
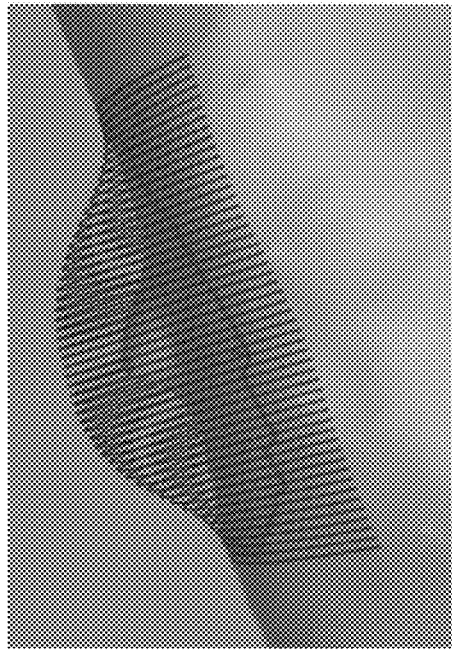
Figure 10D:
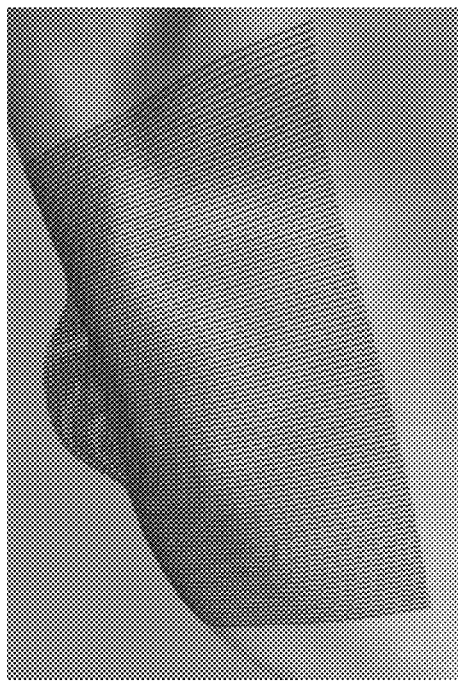
Figure 11A:
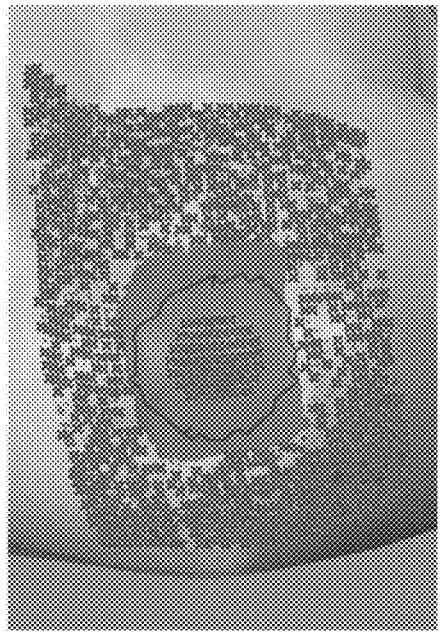
FIGS. 11A-D illustrate exemplary modeling data for producing a customized protective device for the acromioclavicular joint, according to one embodiment of the present disclosure.
Figure 11B:
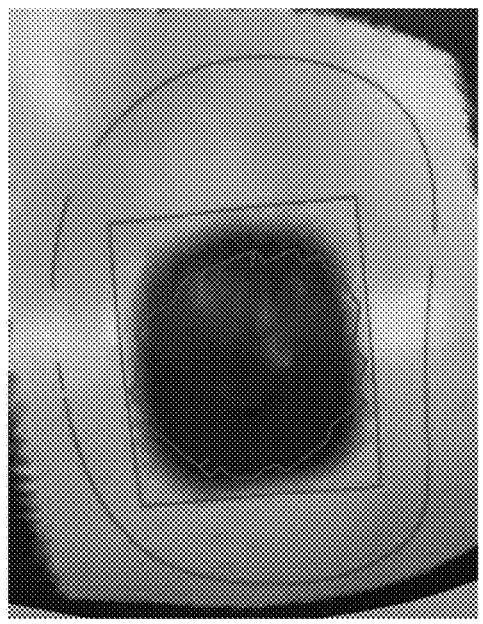
Figure 11C:
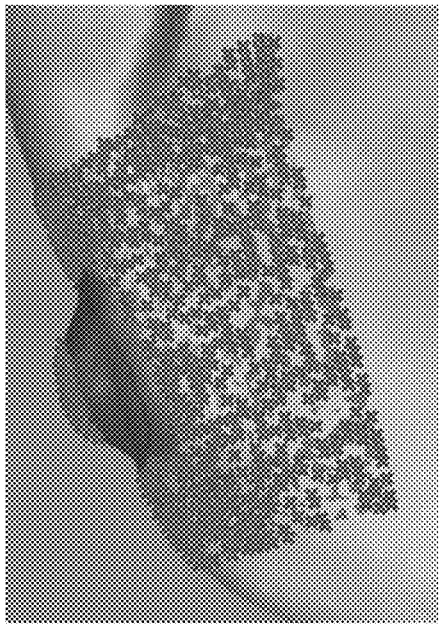
Figure 11D:
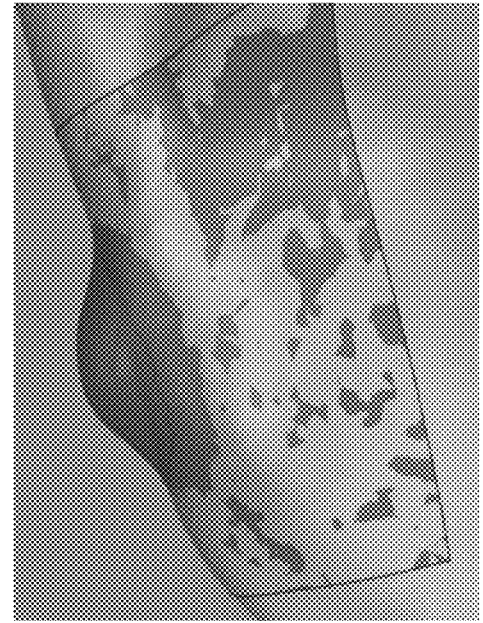

Referring now to FIGS. 9A-C, illustrated is exemplary modeling data 134 for producing a customized protective device for the acromioclavicular joint, according to one embodiment of the present disclosure. In some embodiments, the data processing console 142 manipulates the curves to create particular features. In particular embodiments, the curves are shattered or split at the boundaries of the extruded box and isolated for manipulation. In some embodiments, the data processing console 142 re-parameterizes the curves, divides them into equally-spaced segments, and the calculates their normal vectors to the polygon mesh. In some embodiments, the data processing console 142 applies a function, including but not limited to a sigmoid, Bezier, or Arc, to the magnitude of the normal vector. In at least one embodiment, the maximum vector is set by the data processing console 142 and can be altered by the user or the data processing console 142 for the specifications of a specific subject. In various embodiments, the data processing console 142 produces an arched curve 901C that fits the end tangents of the non-segmented curves. In particular embodiments, the height of the middle of this arched curve 901C is calculated from the base of the 3D tracking dot and is equal to 0.2 times the width of the bounding box in this case.

Referring now to FIGS. 10A-D, illustrated is exemplary modeling data 134 for producing a customized protective device for the acromioclavicular joint, according to one embodiment of the present disclosure. In one or more embodiments, the data processing console 142 manipulates the surrounding curves to standardize the adjustments of the arched curve 901C created for accommodating particular new features. In particular embodiments, the data processing console 142 adjusts the arched curve 901C and other corresponding curves to produce a bump (pocket of air above the body part of interest) used to protect the AC joint of the subject against impact. For example, once the data processing console 142 lofts the arched curve 901C into the desired shape, the data processing console 142 also lofts the surrounding curves with a parametrically graphed falloff using a Bezier Curve or other similar function. In at least one embodiment, the data processing console 142 deforms the curves closest to the middle curve the most and the ones closest to the rectangular boundary are hardly deformed. In some embodiments, the data processing console 142 creates the set of curves that define the bump used to protect the subject's AC joint against impact. In particular embodiments, the data processing console 142 joins the deformed curve segments to the full-length section curves. In one or more embodiments, the data processing console 142 fits a NURBS surface through these toleranced curves by a loft or network surface (or other suitable functions).

Referring now to FIGS. 11A-D, illustrated is exemplary modeling data 134 for producing a customized protective device for the acromioclavicular joint, according to one embodiment of the present disclosure. In some embodiments, the surface created by the data processing console 142 may have defects in surface smoothness that can result in higher stress concentrations or poor product visual quality. In various embodiments, the data processing module employs smoothing techniques to account for discrepancies in the surface. In an embodiments, the data processing console 142 employs an optimization algorithm, which finds the equilibrium point between competing forces. In some embodiments, the data processing console 142 converts the surface to a quadrangulate mesh and a Laplacian smoothing force is exerted across all vertices. In various embodiments, selected vertices can have a competing force pulling them to the polygon mesh of the subject data 136 or fixing them in their original position. The quadrangulate mesh may be converted back to a NURBS surface. In at least one embodiment, the data processing console 142 produces a surface that is smooth and still accomplishes the tolerance for fitting the subject data 136. For example, a maximum deviation of the surface to the subject data may be 0.5 mm in relevant locations.

After the surface shape is suitable, the 3D bounding curve created by the data processing console 142 may be projected or pulled onto the surface and used to separate the desired region. In some embodiments, branding, names, and numbers may be projected onto the surface and used to customize the customized protective device 1200 for the subject. In particular embodiments, the data processing console 142 thickens the surface to an appropriate thickness for the application, and the branding or subject information may be embossed or extruded into the final customizable protective device 1200. In various embodiments, all sharp edges may be rounded or filleted to ensure proper fit of the product. In at least one embodiment, the thickness of the customized protective device 1200 is set to 3.5 mm, the top and bottom edges are filleted with a 1.5 mm radius, and the branding or subject information is extruded to 0.5 mm above the top surface. The edges and intersections with the body may also be filleted to reduce stress concentrations.

Figure 12A:
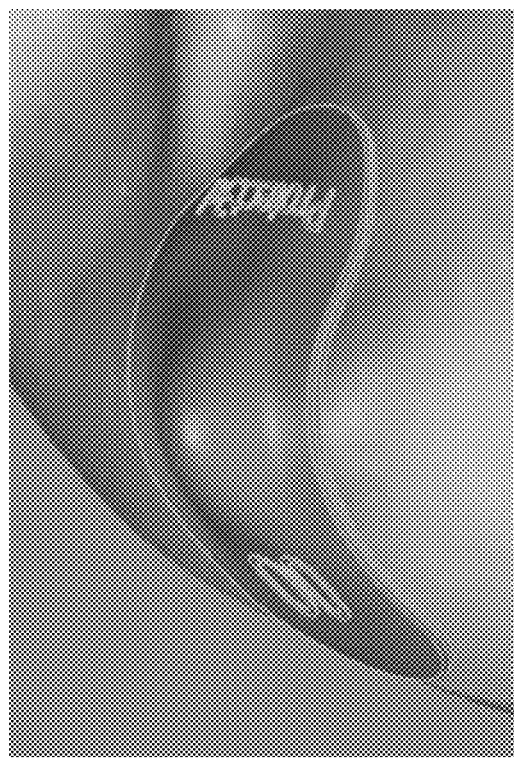
FIGS. 12A-B illustrate a rendered customized protective device for the acromioclavicular joint, according to one embodiment of the present disclosure.
Figure 12B:
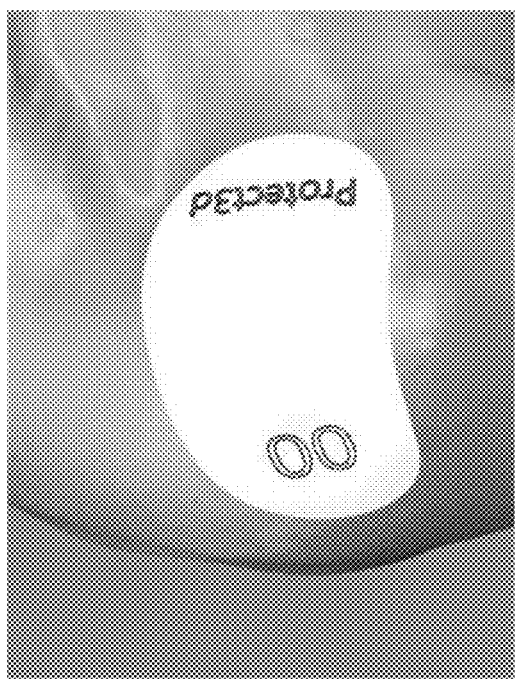

Referring now to FIGS. 12A-B, illustrated is a rendered customized protective device 1200 for the acromioclavicular joint, according to one embodiment of the present disclosure. After the data processing console 142 creates the customizable protective device 1200, the data processing console 142 may export the modeling data 134 to an online digital rendering service and send to the subject or a medical professional for review. Changes may be requested based on the use case, and the parameters of the customized protective device 1200 may be altered to best fit the specifications of the subject. Once the final customized protective device 1200 design is confirmed, the computing environment 102 exports the customized protective device 1200 model to a suitable 3D printing format. Suitable 3D printing file formats may include but are not limited to standard triangle language (STL), OBJ file type, or 3D manufacturing format (3MF). In some embodiments, the computing environment 102 performs slicing on the customized protective device 1200 model to formulate 3D printing instructions. In one or more embodiments, the computing environment 102 uploads the customized protective device 1200 model to a 3D printer that uses SLA technology. The 3D printer discussed herein may print the customized protective device 1200. During, before, or after the printing process, the data processing console 142 may be employed to orient the customized protective device 1200, such that the surface area per slice is minimized and no support structures are generated on the top surface.

In particular embodiments, the additive manufacturing device 106 prints the customized protective device 1200 and energy absorbent foam is adhered to the subject-facing side of the customized protective device 1200 with a rectangular or circular cutout around the joint. In alternative embodiments, the additive manufacturing device 106 prints 3D lattice structures to obtain the specified energy absorption characteristics. These lattice structures may be added as an additional feature to the customized protective device 1200 and may be 3D printed all at once in the same material as the entire device or adhered to the bottom like the foam.

Figure 13A:
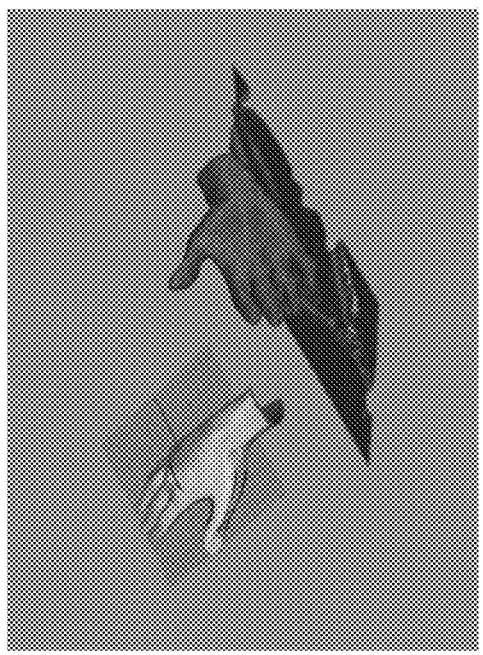
FIGS. 13A-C illustrate exemplary modeling data for producing a customized protective device for a thumb, according to one embodiment of the present disclosure.
Figure 13C:
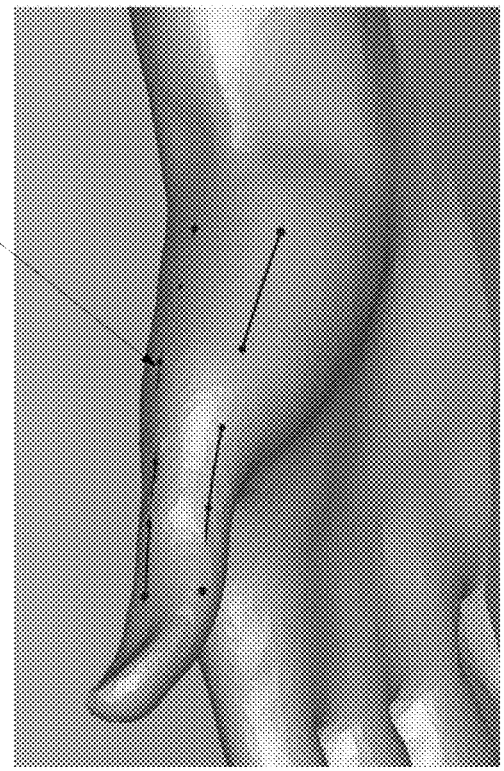
Figure 13B:
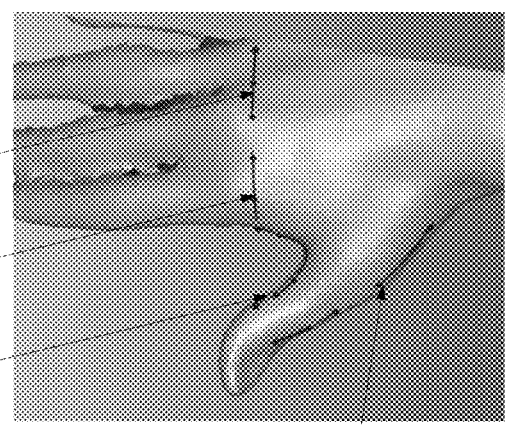
Figure 14B:
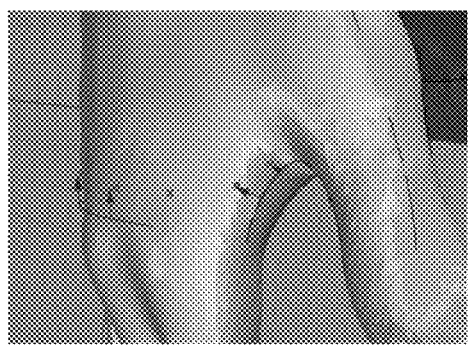
FIGS. 14A-D illustrate exemplary modeling data for producing a customized protective device for the thumb, according to one embodiment of the present disclosure.
Figure 14A:
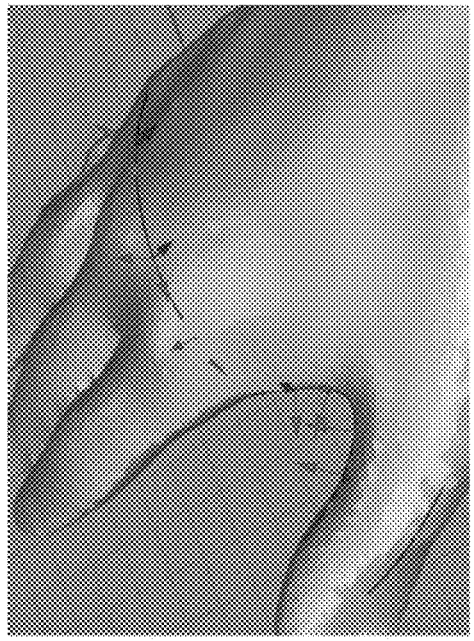
Figure 14D:
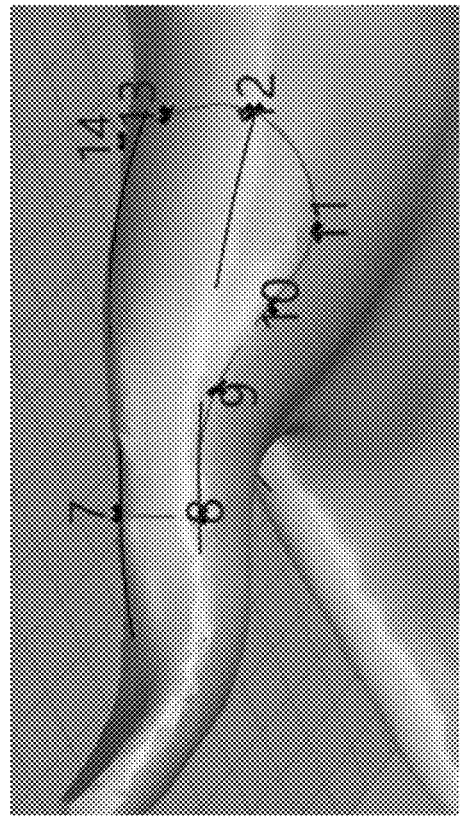
Figure 14C:
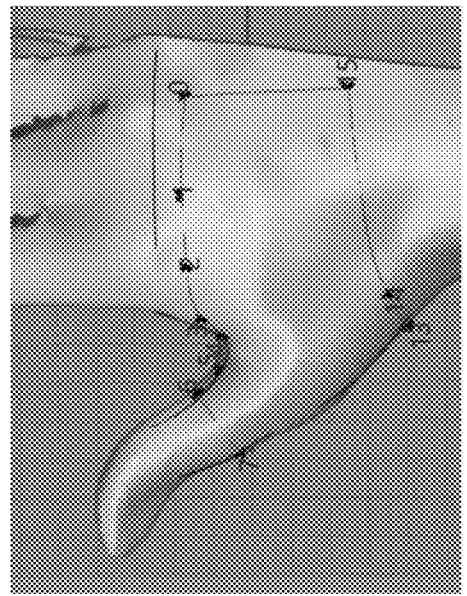

Referring now to FIGS. 13A-C, illustrated is exemplary modeling data 134 for producing a customized protective device for a thumb, according to one embodiment of the present disclosure. In particular embodiments, the subject data capture device 108 performs a substantially similar capturing technique as describe herein in FIG. 5A-D. In some embodiments, relevant anatomical features may be marked by 3D curves. These curves may be generated by the data processing console 142. In various embodiments, such as for creating a thumb guard, the data processing console 142 creates four curves 1301B, 1302B, 1303B, and 1304B that correspond to the bottom line of the knuckles, the web of the hand, the top of the thumb, and the palm profile of the thumb.

Referring now to FIGS. 14A-D, illustrated is exemplary modeling data 134 for producing a customized protective device for the thumb, according to one embodiment of the present disclosure. In some embodiments, the data processing console 142 projects points orthogonally to the four reference curves to form the shape of the thumb guard. The data processing console 142 may find the tangent vector of a 3D curve at a relevant position and calculate the cross-product of that vector with the normal of a polygon mesh at the closest position. In various embodiments, the data processing console 142 recalculates the vector at discrete increments to maintain consistency.

For example, 15 points may be used to create a shape. In one or more embodiments, the shape is a parametric function of the subject's hand. For example, points 0 and 15 correspond to the width of the customized protective device 1800 and are located halfway between the middle and ring fingers. Continuing this example, the orthogonal distance between the bottom of the knuckles and bony protrusion of the ulnar styloid process is measured by the data processing console 142. Continuing this example, point 0 is projected orthogonally 0.1-0.15 times the calculated distance. Continuing this example, point 15 is projected orthogonally 0.4-0.6 times the calculated distance. Continuing this example, points 6, 7, and 8 are on the same plane orthogonal to the thumb proximal phalanx axis and are located halfway between the thumb metacarpophalangeal (MCP) and proximal interphalangeal (PIP) joints. In some embodiments, a planar circle is used to approximate the shape of the thumb at points 6, 7, and 8. In at least one embodiments, point 7 is located on the fingernail side of the thumb and points 6 and 8 are a 90-degree distance away from point 7 on the circle. In various embodiments, point 12 corresponds to the palm-side protrusion of the thumb metacarpal bone. In particular embodiments, point 9 corresponds to the thumb MCP joint. The data processing console 142 may calculate the distance between points 9 and 12 and use the distance to determine the offset from the curve of points 10 and 11. In at least one embodiment, points 13 and 14 follow along just above the base of the hand metacarpals. The desired shape may be altered to meet the specific specifications of the subject. In some embodiments, a brace is used to prevent or support various injuries to the thumb including the thumb ulnar collateral ligament (UCL).

Figure 15A:
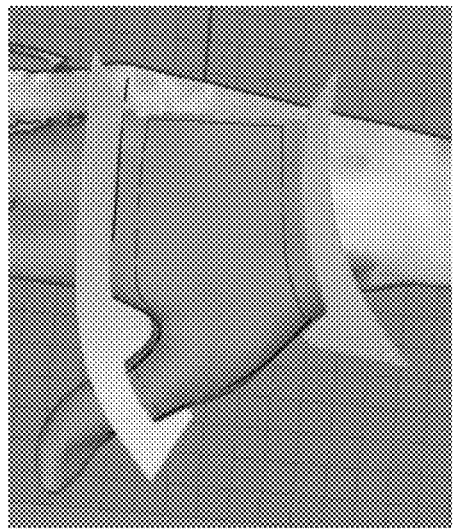
FIGS. 15A-C illustrate exemplary modeling data for producing a customized protective device for the thumb, according to one embodiment of the present disclosure.
Figure 15B:
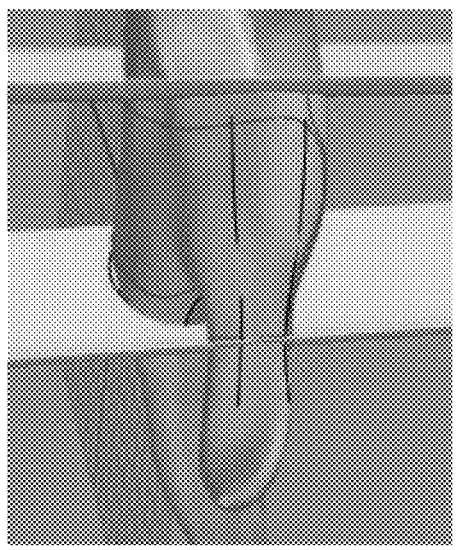
Figure 15C:
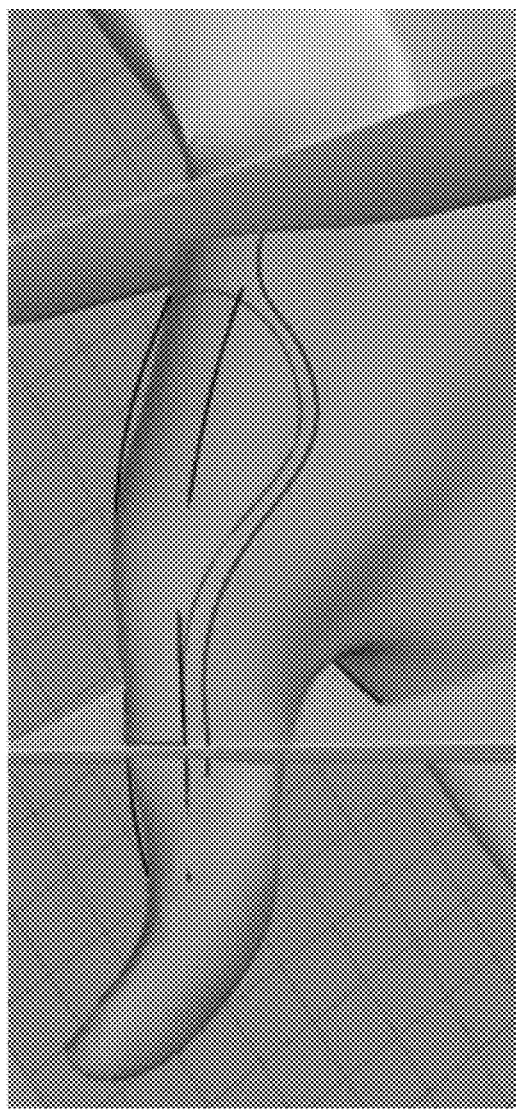
Figure 16B:
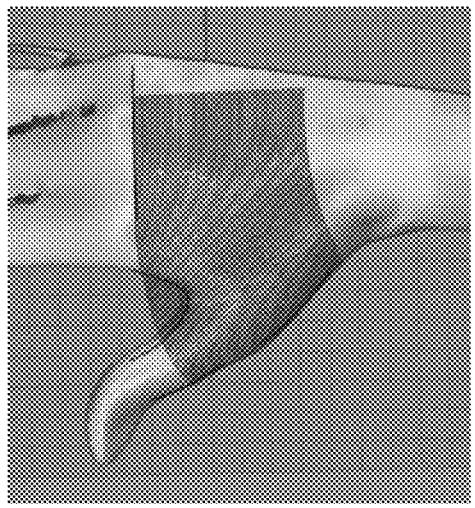
FIGS. 16A-D illustrate exemplary modeling data for producing a customized protective device for the thumb, according to one embodiment of the present disclosure.
Figure 16D:
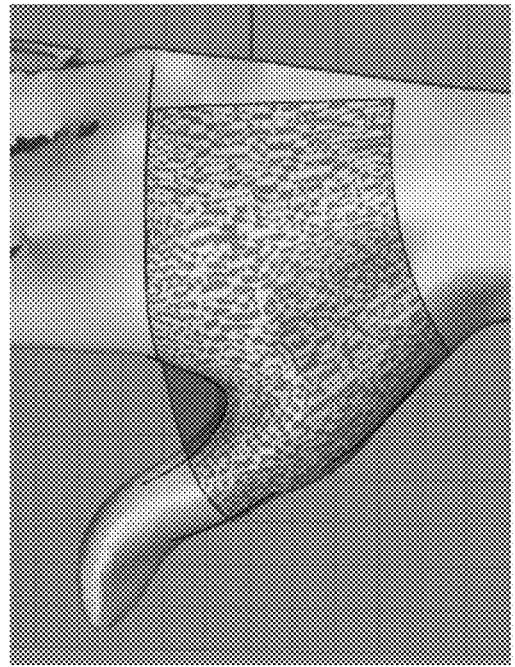
Figure 16A:
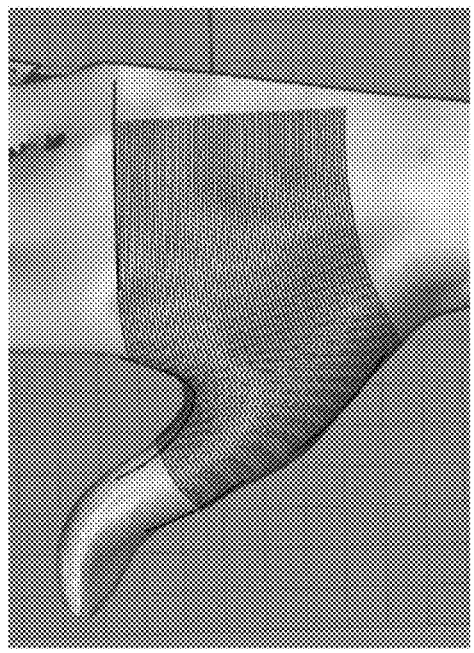
Figure 16C:
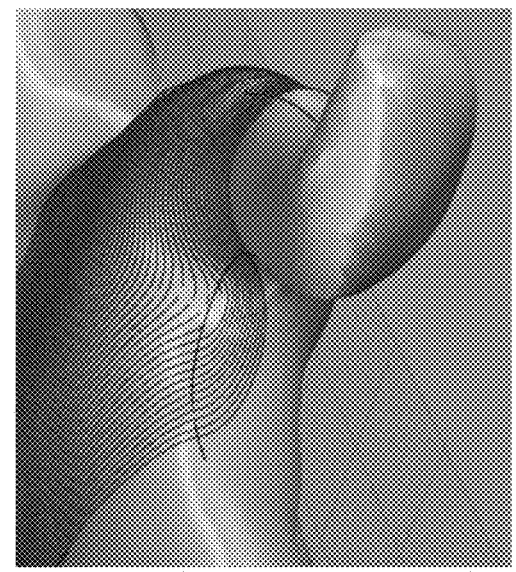

Referring now to FIGS. 15A-C, illustrated is exemplary modeling data 134 for producing a customized protective device for the thumb, according to one embodiment of the present disclosure. In some embodiments, once the shape of the customized protective device 1800 is finalized, then two boundary surfaces are generated that follow the natural curvature of the hand and fit outside of the curve boundary of the customized protective device 1800 shape. In various embodiments, the data processing console 142 creates a boundary curve that follows the shape of the customized protective device 1800 on the palm. In one or more embodiments, the data processing console 142 uses the rendered shapes to generate the NURBS surface.

Referring now to FIGS. 16A-D, illustrated is exemplary modeling data 134 for producing a customized protective device for the thumb, according to one embodiment of the present disclosure. In particular embodiments, the data processing console 142 generates a series of surfaces between the two surfaces. For example, the spacing between the surfaces or planes may be set at 1 mm. In some embodiments, when intersected with the mesh, the data processing console 142 creates 2D polylines that sample the mesh shape and curvature to a very fine tolerance, such as a maximum distance between the mesh shape and the curvature of 1 mm. In one or more embodiments, the data processing console 142 divides the resulting polylines into 1 mm long segments and the evenly spaced points are used to interpolate smooth, continuous NURBS curves. In at least one embodiment, the data processing console 142 groups the curves based on their positions on the hand. Grouping the curves may be accomplished by finding the first intersection curve that is periodic. In various embodiments, the data processing console 142 finds the first surface in the series that results in two continuous segments longer than the mean length of the curves minus two standard deviations. In some embodiments, the data processing console 142 find a point corresponds to the beginning of the web of the hand. In one or more embodiments, the curves are split at the web and the offset palm curve. In particular embodiments, the data processing console 142 splits the curves corresponding to the thumb and the hand above the web and interpolates to form a single continuous curve. In some embodiments, the data processing console 142 preforms the curve spilt as it is much simpler computationally to create one four-sided NURBS surface than a patchwork of surfaces. In at least one embodiment, after the smooth curves are created, the data processing console 142 joins the curves into a NURBS surface by means of a loft or network surface CAD operation.

Referring now to FIGS. 17A-D, illustrated is exemplary modeling data 134 for producing a customized protective device for the thumb, according to one embodiment of the present disclosure. In some embodiments, the data processing console 142 converts the NURBS surface into a quadrangulate mesh 1701B, optimized for smoothness, and fits to the subject data 136 using the defined methods. In various embodiments, the final surface fits the subject data 136 to a defined tolerance of 0.25 mm at all areas outlined by the 3D curve boundary. Once the data processing console 142 finalizes the surface, the data processing service 142 projects or pulls the 3D boundary onto the surface to isolate the desired shape. In some embodiments, the additive manufacturing device 106 projects branding and subject-specific information onto the surface of the customized protective device 1800, as described below with respect to FIG. 18, to increase the level of customization. In an embodiment, the surface may be thickened to an appropriate thickness and all sharp edges may be rounded. In various embodiments, the thickness of the customized protective device 1800 is set to 2 mm, the top and bottom edges are filleted with a 0.85 mm radius, and the branding or subject information is extruded to 0.25 mm above the top surface.

Referring now to FIGS. 18A-C, illustrated is a rendered customized protective device 1800 for the thumb, according to one embodiment of the present disclosure. In various embodiments, the data processing console 142 exports the rendered customized protective device 1800, the data processing console 142 sends the file to the subject or medical professional for review. In several embodiments, changes may be requested based on the use case and the parameters of the customized protective device 1800 are altered to best fit the specifications of the subject. In some embodiments, once the final customized protective device 1800 design is confirmed, the computing environment 102 exports the customized protective device 1800 model to a suitable 3D printing format. Suitable 3D printing file formats may include but are not limited to standard triangle language (STL), OBJ file type, or 3D manufacturing format (3MF). In some embodiments, the computing environment 102 performs slicing on the customized protective device 1800 model to formulate 3D printing instructions. In one or more embodiments, the computing environment 102 uploads the customized protective device 1800 model to a 3D printer that uses SLA technology. The 3D printer discussed herein may print the customized protective device 1800. During, before, or after the printing process, the data processing console 142 or the additive manufacturing device 106 may orient the customized protective device 1800, such that the surface area per slice is minimized and no support structures are generated on the bottom surface that may contact the subject's hand.

Figure 19A:
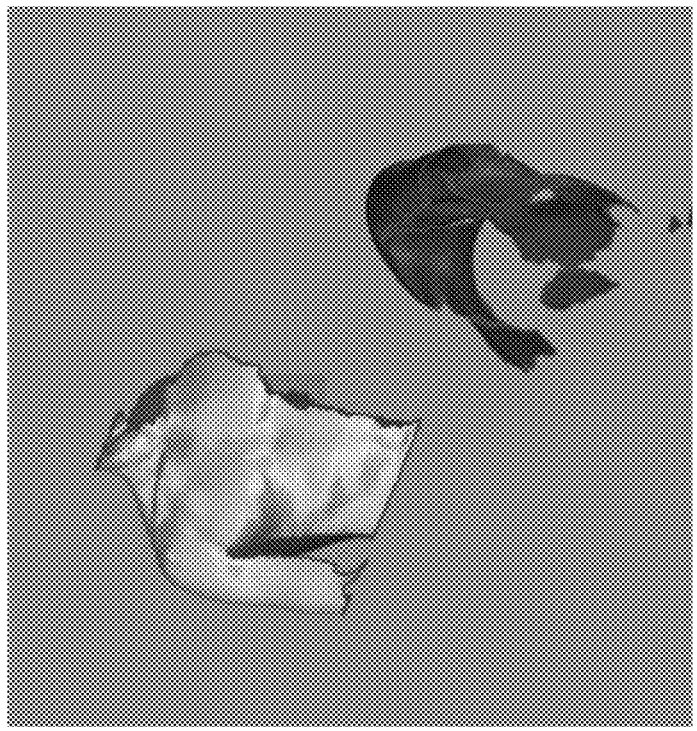
Figure 19A:
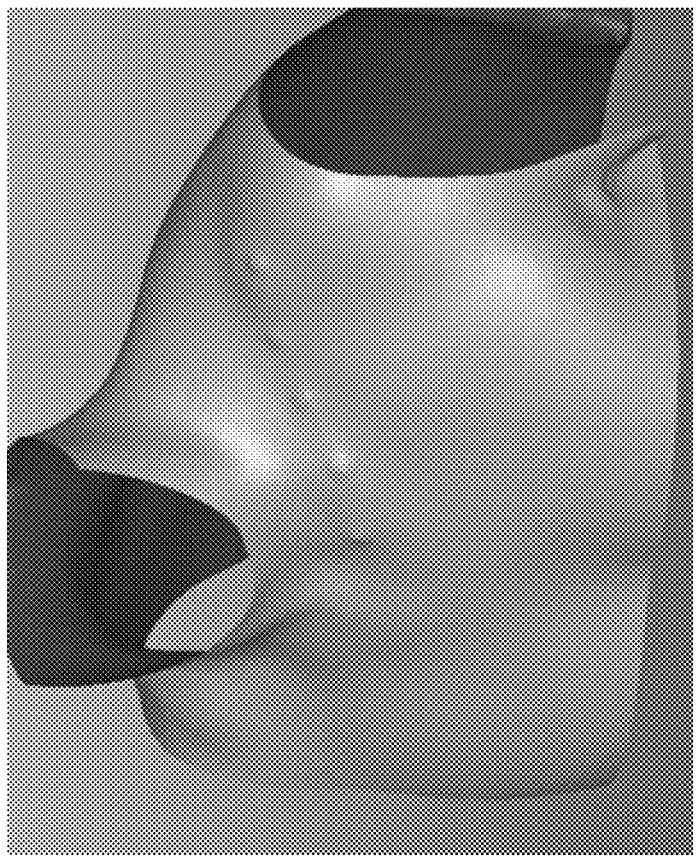

Referring now to FIGS. 19A-B, illustrated is exemplary modeling data 134 for producing a customized protective device for a clavicle, according to one embodiment of the present disclosure. In particular embodiments, the subject data capture device 108 performs a substantially similar capturing technique as describe herein in FIGS. 5A-D. In various embodiments, a customized protective device 2600 is produced for the clavicle, as described below with respect to FIGS. 26A-B. The subject data capture device 108 may capture the subject data similarly to FIG. 5A-D, but for a different area of the body. For example, the subject data capture device 108 may measure a 3D scan of the clavicle of a particular user. The subject data capture device 108 may scan the area and may produce a polygon mesh stored as subject data 136. Before the scan, tracking dots may be added to accentuate the injured area when scanning with the subject data capture device 108.

Figure 20A:
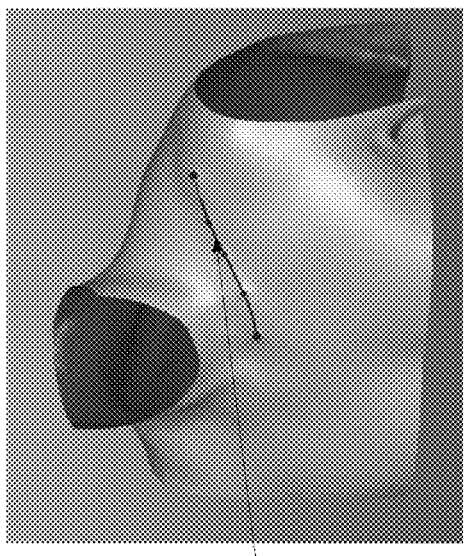
FIGS. 20A-C illustrate exemplary modeling data for producing a customized protective device for the clavicle, according to one embodiment of the present disclosure.
Figure 20B:
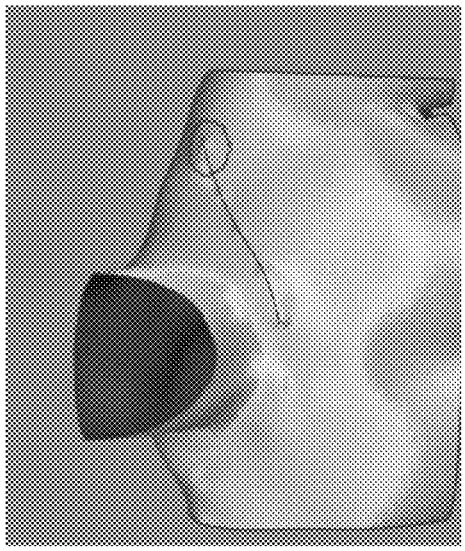
Figure 20C:
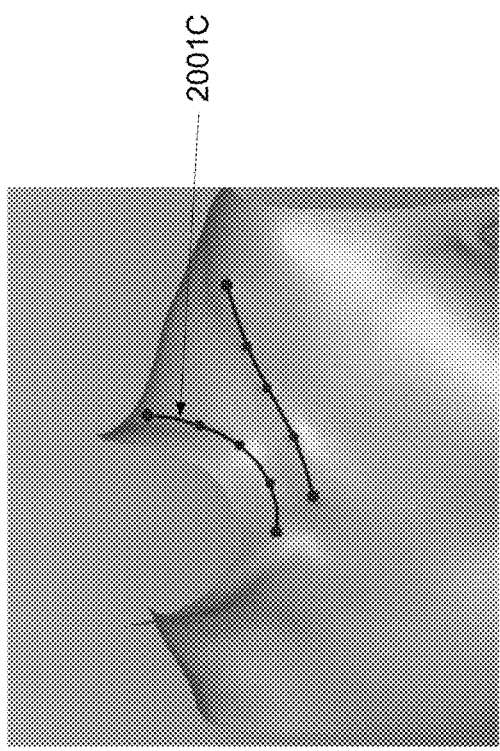

Referring now to FIGS. 20A-C, illustrated is exemplary modeling data 134 for producing a customized protective device for the clavicle, according to one embodiment of the present disclosure. In various embodiments, the data processing console 142 locates relevant anatomical features from the subject data 136. In particular embodiments, the data processing console 142 employs inputs that are a roughly circular mesh centered on the 3-dimensional tracking dot that marks the location of the AC Joint and a 3D curve created from interpolated points located on the mesh at the apex of the 3D tracking dots to locate relevant anatomical features, such as a path 2001A of the collarbone. In various embodiments, the data processing console 142 creates a 3D curve 2001C at the inflection point of curvature where the neck connects to the shoulder and chest.

Figure 21A:
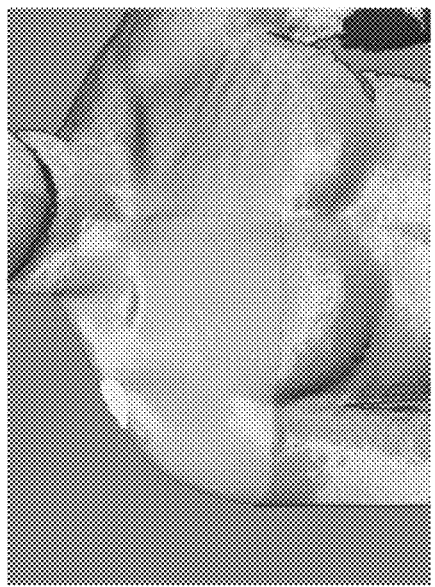
FIGS. 21A-C illustrate exemplary modeling data for producing a customized protective device for the clavicle, according to one embodiment of the present disclosure.
Figure 21B:
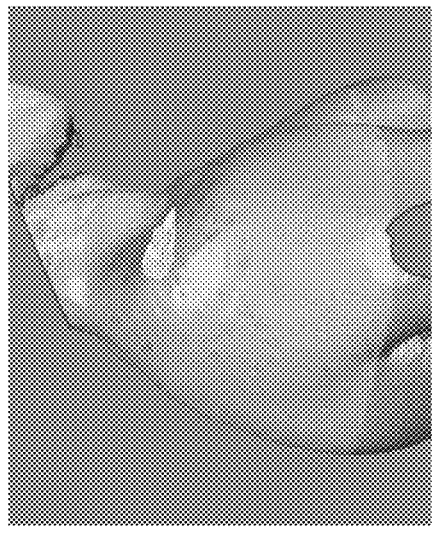
Figure 21C:
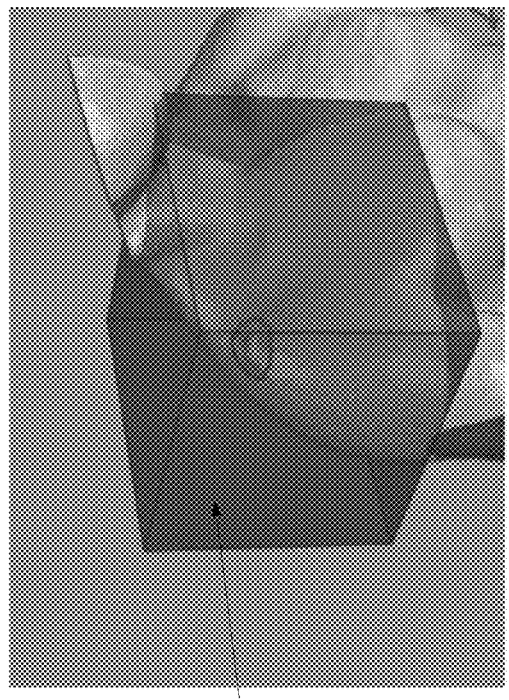

Referring now to FIG. 21A-C, illustrated is exemplary modeling data 134 for producing a customized protective device for the clavicle, according to one embodiment of the present disclosure. In some embodiments, the data processing console 142 uses these inputs to generate three planes and use them to crop the polygon mesh down the midline of the chest, at the apex of the armpit and midway along the front of the neck perpendicular to the local surface normal. In at least one embodiment, the data processing console 142 creates a bounding box 2101C from the plane corresponding to the midline of the chest. The bounding box may be used to measure the approximate chest depth (back of the chest to the front) and the shoulder width (from the midline of the sternum to the furthest point on the shoulder). The measurements may be stored in the computing environment 102 for further processing. The data processing console 142 may store this data in the modeling data 134 for further processing, such as the processing that results in FIGS. 22A-22C described below.

Figure 22A:
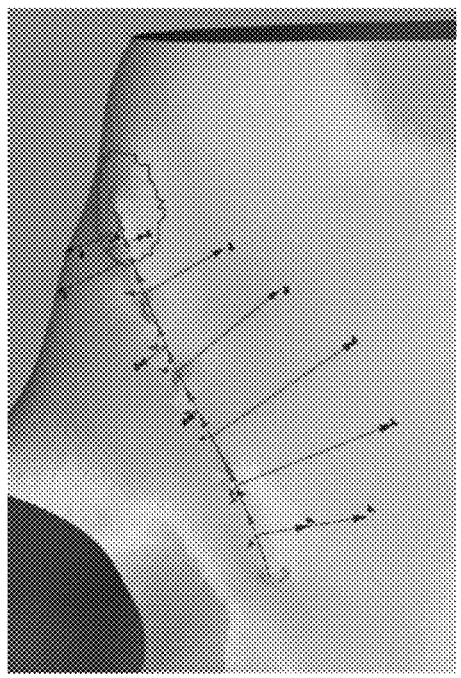
FIGS. 22A-C illustrate exemplary modeling data for producing a customized protective device for the clavicle, according to one embodiment of the present disclosure.
Figure 22C:
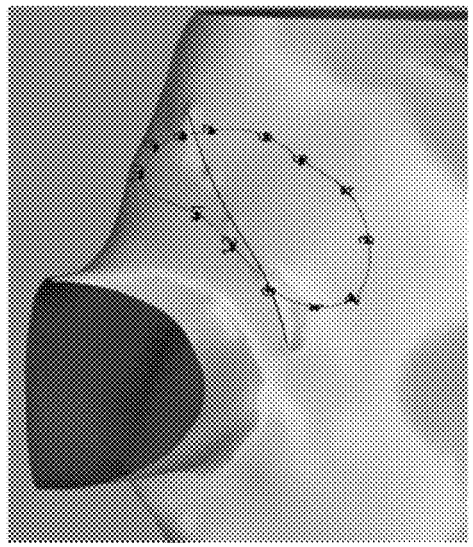
Figure 22B:
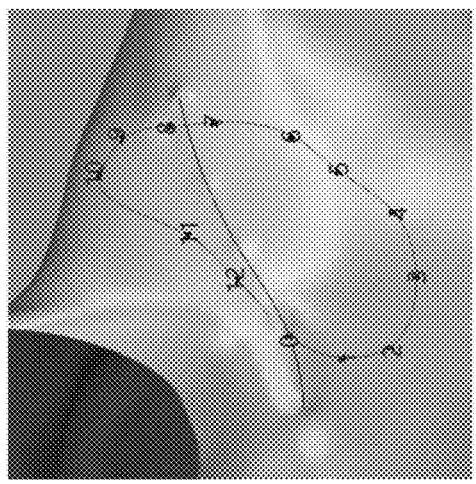
Figure 23G:
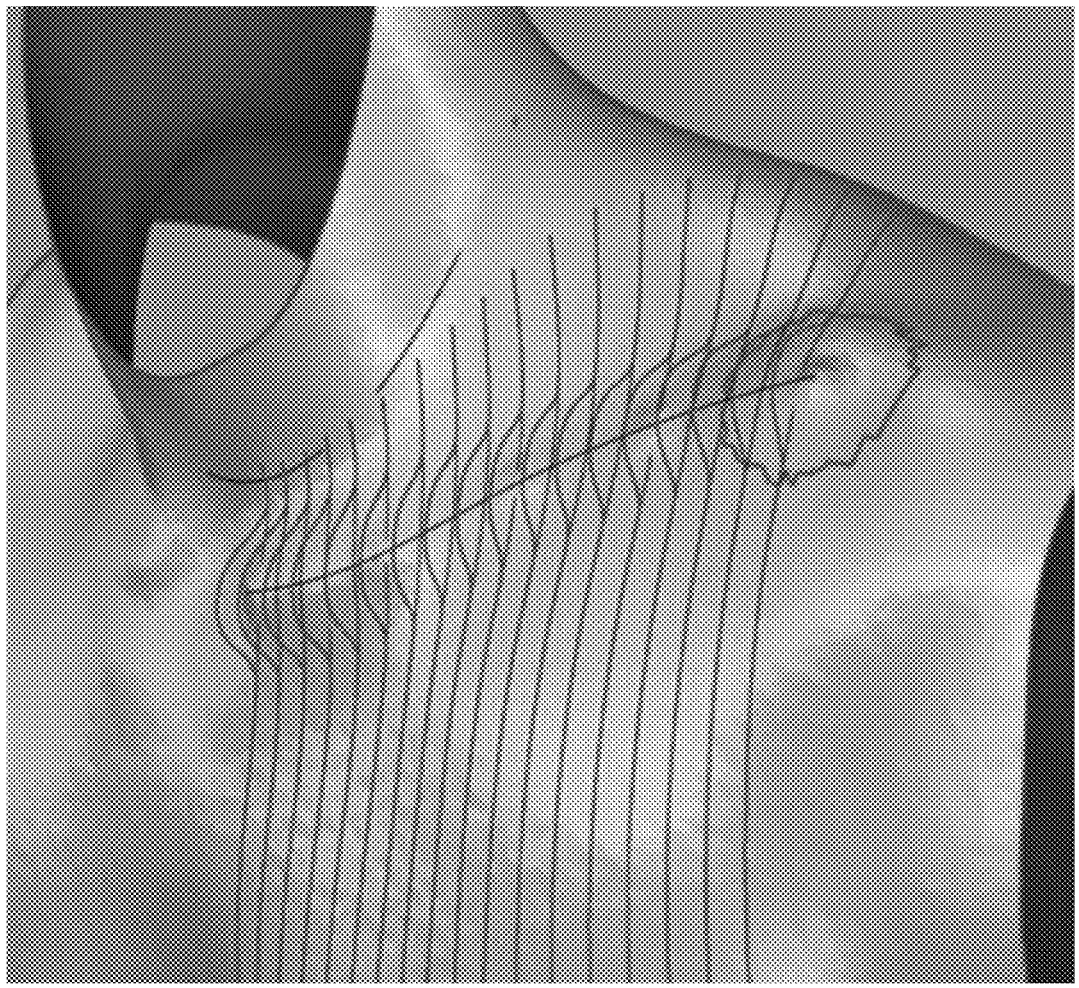
FIG. 23G illustrates exemplary modeling data for producing a customized protective device for the clavicle, according to one embodiment of the present disclosure.

Referring now to FIGS. 22A-C, illustrated is exemplary modeling data 134 for producing a customized protective device for the clavicle, according to one embodiment of the present disclosure. In some embodiments, the curve corresponding to the bone and neck shapes, a polygon mesh of the joint outline, the cropped polygon mesh, a Boolean value for right or left shoulder, and the corresponding measurements are fed into the data processing console 142 that generates an outline of the shape of the protective device. In some embodiments, the data processing console 142 finds the tangent vector of a 3D curve at a relevant position and calculates the cross-product of the vector with the normal of a polygon mesh at the closest position. The vector may also be re-calculated at discrete increments to maintain consistency. In particular embodiments, 12 points are used to create the shape. In various embodiments, the shape is a parametric function of the shape and size of the subject's torso as well as the length and diameter of their clavicle bone.

In a particular example, point 0 may be located just beyond the second tracking dot from the SC joint, although this may vary based on the location of the injury. Continuing this example, point 10 is located just below the highest point on the trap. Continuing this example, points 11 and 12 are interpolated between points 0 and 10 following the curvature of the neck. Continuing this example, points 7 and 8 may be positioned on either side of the bone and mark the clavicle bone width. In some embodiments, the data processing console 142 places the points at a distance 0.1 times the length of the clavicle bone curve from the AC joint endpoint. Continuing the previous example, the data processing console 142 parametrically determines points 1-6 based off the size of the subject. For the furthest point down the chest, point 3 may be set at between 0.6 and 0.75 times the height of the chest bounding box. In one or more embodiment, the data processing console 142 configures points 5 and 6 to decrease impingement with the shoulder during movement.

Referring now to FIGS. 23A-G, illustrated is exemplary modeling data 134 for producing a customized protective device for the clavicle, according to one embodiment of the present disclosure. In some embodiments, the data processing console 142 creates 3D curves corresponding to the area of the torso using a series of surfaces or manual manipulation of the surfaces themselves. In particular embodiments, once these curves are created, the data processing console 142 uses the reference curve for the clavicle bone to separate segments evenly spaced with lengths 1.3 times the diameter of the bone. In some embodiments, this is accomplished by extracting several evenly spaced points from the clavicle curve and calculating the closest 10-200 vertices of the mesh.

In one or more embodiments, the data processing console 142 uses the average position and normal of the mesh vertices to offset the points from the mesh by a defined distance. In at least one embodiment, the data processing console 142 uses the average, instead of the vector at a specific point, to account for irregularities in mesh quality and the distortions caused by the tracking dots. In some embodiments, the offset points are interpolated into a curve that is then lofted into a surface and used to split the curves. In some embodiments, the data processing console 142 determines the intersection point of the surface with each curve to be the center of the clavicle bone. In various embodiments, the data processing console 142 multiplies the width of the clavicle by a factor of 1.3 and the resulting value is used to determine the length of each curve segment. The data processing console 142 may project the center point of each segment corresponding to the center of the clavicle onto the offset clavicle curve. In one or more embodiments, the data processing console 142 calculates the distance of this projection and uses this distance as the maximum magnitude for further processing. In some embodiments, the curves are re-parameterized, divided into equally spaced segments, and their normal vectors to the polygon mesh are calculated.

In particular embodiments, the data processing console 142 applies a function including but not limited to a sigmoid, Bezier, or Arc to the magnitude of the normal vector at each point along the segment. In at least one embodiment, the maximum vector is set by the height of the offset clavicle curve and can be altered by the user or the data processing console 142 for the specifications of a specific subject but is commonly set at 13 mm above the maximum point of the clavicle. In some embodiments, data processing console 142 produces a smooth, arched curve that fits the end tangents of the non-segmented curves. The separated segments may then be replaced with the lofted segments and joined back into their full-length counterparts.

Figure 24A:
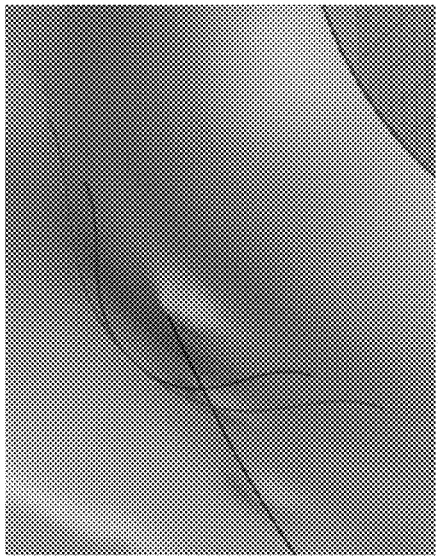
FIGS. 24A-C illustrate exemplary modeling data for producing a customized protective device for the clavicle, according to one embodiment of the present disclosure.
Figure 24B:
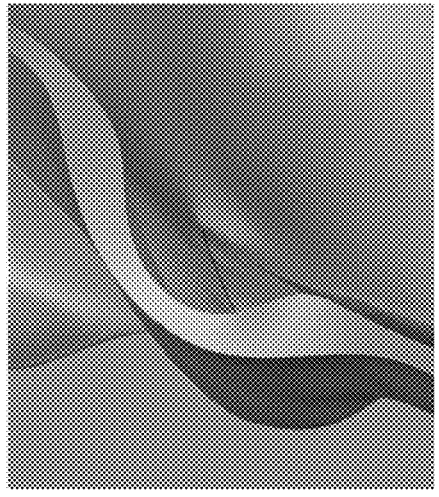
Figure 24C:
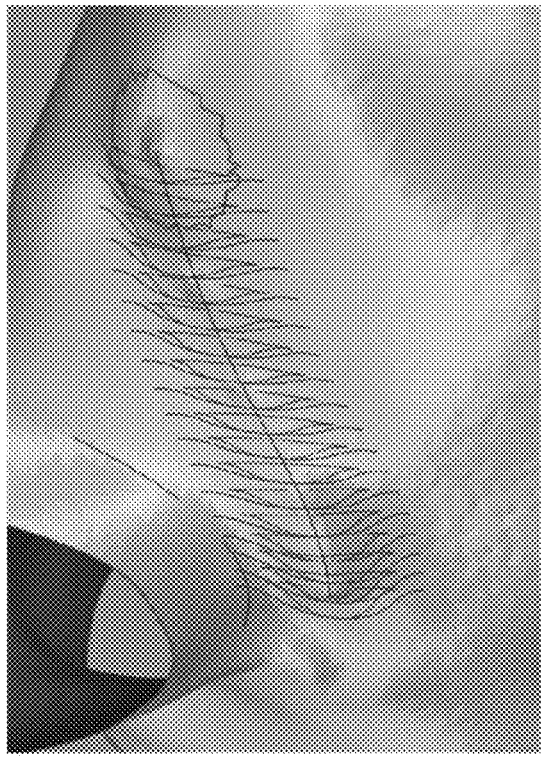

Referring now to FIGS. 24A-C, illustrated is exemplary modeling data 134 for producing a customized protective device for the clavicle, according to one embodiment of the present disclosure. In some embodiments, a second set of curves are formed corresponding to the outer surface of a customized protective device 2600 that have wider arches over the bone. In particular embodiments, the curves are 1.2-1.5 times the length of the inner curves. In some embodiments, using the outer curvature length of 1.2-1.5 times the length of the inner curvature is done to reduce stress concentrations of the customized protective device 2600 during impact by adding additional thickness at the areas of highest stress.

Referring now to FIGS. 25A-E, illustrated is exemplary modeling data 134 for producing a customized protective device for the clavicle, according to one embodiment of the present disclosure. In some embodiments, once the set of curves corresponding to the top and bottom of the customized protective device 2600 are generated, the data processing console 142 uses the curves to create NURBS surfaces with the same shape using common CAD operations, such as a loft or network surface. The data processing console 142 may project or pull the 3D sketch of the boundary onto both surfaces and may use the 3D sketch to isolate the relevant shape. The top surface may then be offset by a defined distance and a closed surface may be used to connect the two surfaces a body. In some embodiments, the additive manufacturing device 106 may round or fillet the edges and add subject-specific information or branding to the customized protective device 2600. In an embodiment, the thickness of the customized protective device 2600 is set to 4 mm, the top and bottom edges are filleted with a 1.5-2.0 mm radius, and the branding or subject information is extruded to 0.5 mm above the top surface. In some embodiments, the data processing console 142 sets the fit of the customized protective device 2600 to a maximum of 0.5 mm at the contact regions. In various embodiments, the customized protective device 2600 fits to the subject data at defined points on the chest and trap, but retains an arch shape to protect the clavicle from direct impacts.

Figure 26B:
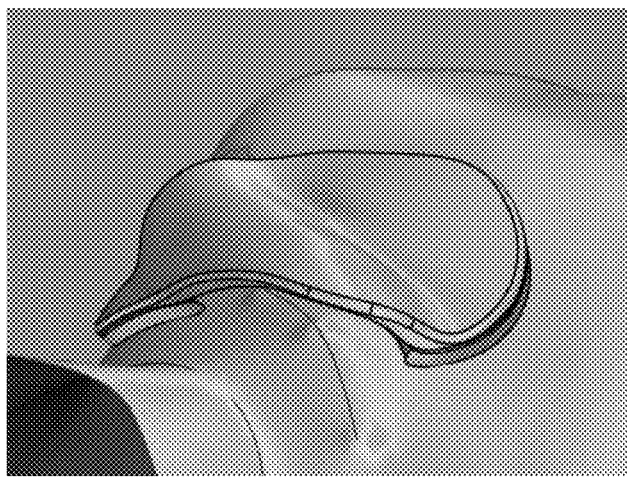
FIGS. 26A-B illustrate a rendered customized protective device for the clavicle, according to one embodiment of the present disclosure.
Figure 26A:
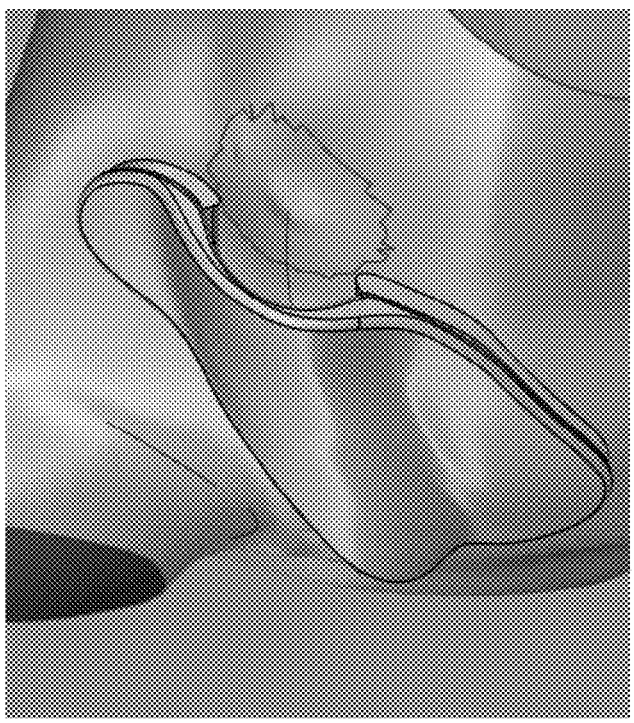

Referring now to FIGS. 26A-B, illustrated is a rendered customized protective device 2600 for the clavicle, according to one embodiment of the present disclosure. In some embodiments, after the data processing console 142 renders the customized protective device 2600, it exports the customized protective device 2600 to the subject or medical professional for review. Changes may be requested based on the use case of the customized protective device 2600, and the parameters of the customized protective device 2600 may be altered to best fit the specifications of the user. Once the final customized protective device 2600 design is confirmed, the computing environment 102 exports the customized protective device 2600 model to a suitable 3D printing format. Suitable 3D printing file formats include but are not limited to standard triangle language (STL), OBJ file type, or 3D manufacturing format (3MF). In some embodiments, the computing environment 102 performs slicing on the customized protective device 2600 model to formulate 3D printing instructions. In one or more embodiments, the computing environment 102 uploads the customized protective device 2600 model to a 3D printer that uses SLA technology. The 3D printer discussed herein may print the customized protective device 2600. During, before, or after the printing process, the data processing console 142 or the additive manufacturing device 106 may be used to orient the customized protective device 2600, such that the surface area per slice is minimized and no support structures are generated on the top surface.

In some embodiments, the additive manufacturing device 106 can print the customized protective device 2600 and an energy absorbent foam may be adhered to the subject-facing side of the customized protective device 2600 with a cutout around the maximum height of the channel. In particular embodiments, the additive manufacturing device 106 uses 3D printed lattice structures to obtain the specified energy absorption characteristics. In various embodiments, the lattice structures may be added as an additional feature to the customized protective device 2600 and may be 3D printed all at once in the same material as the entire device or adhered to the bottom like the foam, as described in detail below with respect to FIGS. 32A-E. In some embodiments, the lattice structure reduces stress on the injured body part.

Figure 27:
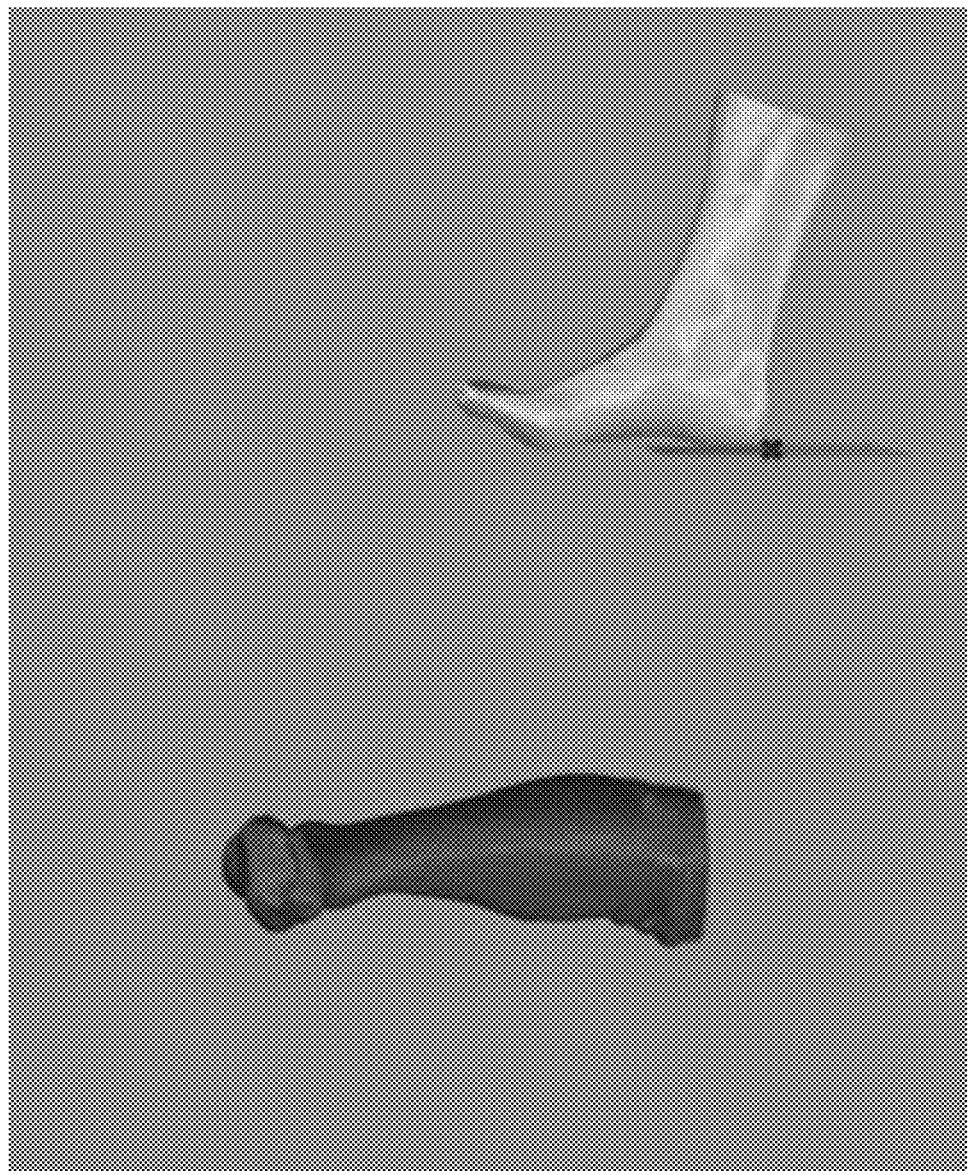
FIG. 27 illustrates exemplary modeling data for producing a customized protective device for an ankle, according to one embodiment of the present disclosure.
Figure 28A:
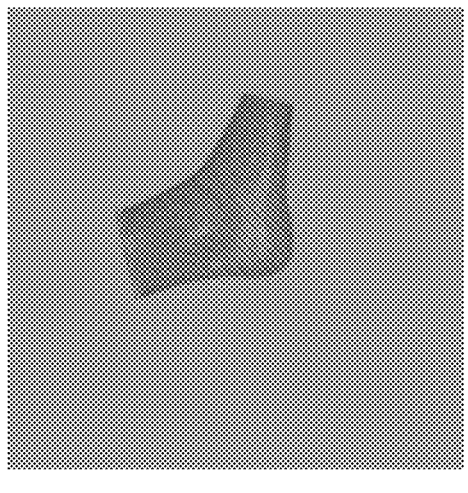
FIGS. 28A-D illustrate exemplary modeling data for producing a customized protective device for the ankle, according to one embodiment of the present disclosure.
Figure 28B:
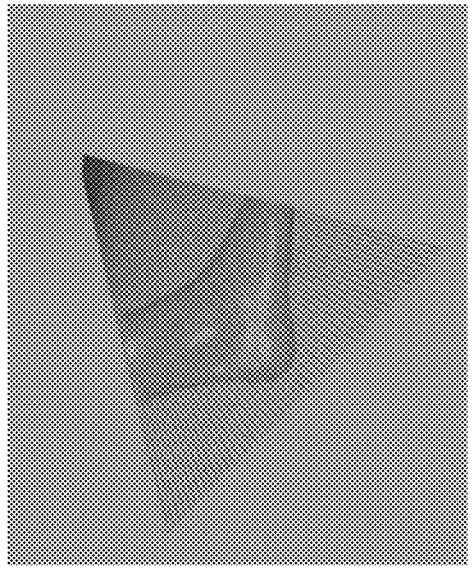
Figure 28C:
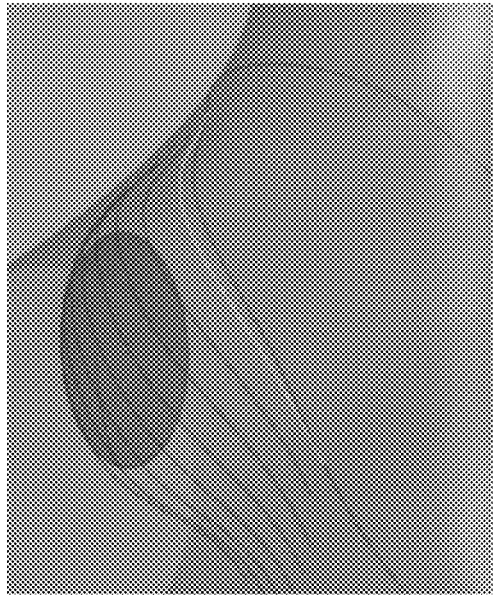
Figure 28D:
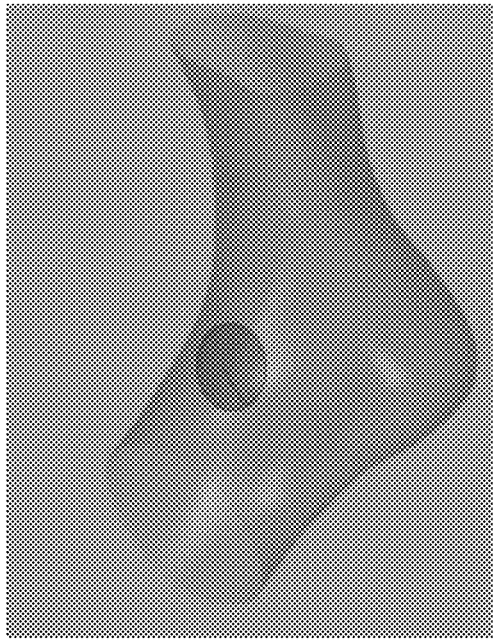

Referring now to FIG. 27, illustrated is exemplary modeling data 134 for producing a customized protective device for an ankle, according to one embodiment of the present disclosure. In some embodiments, anatomical data is captured of the subject's foot using the subject data capture device 108. In some embodiments, the subject data capture device 108 captures subject data 136 in the form of a polygon mesh by a 3D scanner. In some embodiments, the polygon mesh of the subject data 136 is properly aligned to a consistent position in 3D digital space determined by a second reference anatomy. This process may be accomplished completely by the data processing console 142. In various embodiments, the reference anatomy is aligned with the base of the heel at the origin. In one or more embodiments, the sole of the foot is aligned flat on the XY plane and the axis of the foot is aligned with the positive X-axis.

Referring now to FIG. 28A-D, illustrated is exemplary modeling data 134 for producing a customized protective device for the ankle, according to one embodiment of the present disclosure. In some embodiments, a series of surfaces are created at 1 mm intervals. When intersected with the mesh, the data processing console 142 may create 2-dimensional polylines, which may sample the mesh shape and curvature to a very fine tolerance. In particular embodiment, the resulting polylines are then divided into 1 mm long segments and the evenly spaced points are used to interpolate smooth, continuous, and periodic NURBS curves. In various embodiments, a spheroid is fit to each of the malleoli center points with a radius equal to ⅙ of the width of the shin at the high ankle. In one or more embodiments, the data processing console 142 moves the spheroid by a defined distance away from the mesh. In various embodiments, the intersecting curves are then split and deformed to fit over the spheroid. The same process may be repeated for both malleoli and the 5th metatarsal base. In at least one embodiment, the data processing console 142 generates a second set of curves for the shin portion of the brace using similar methods. In various embodiments, the data processing console 142 uses the curves to create two surfaces using loft, network surface, or other related CAD methods.

Figure 29A:
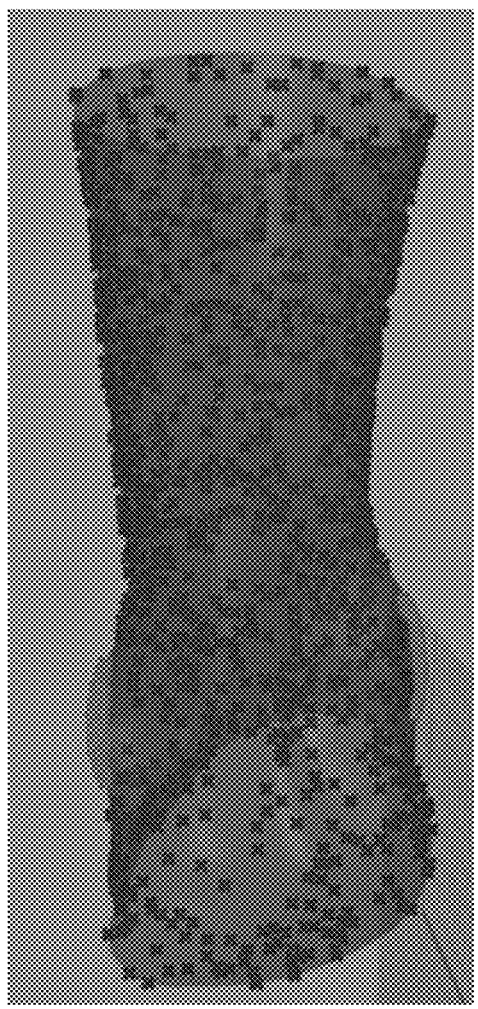
FIGS. 29A-B illustrate exemplary modeling data for producing a customized protective device for the ankle, according to one embodiment of the present disclosure.
Figure 29B:
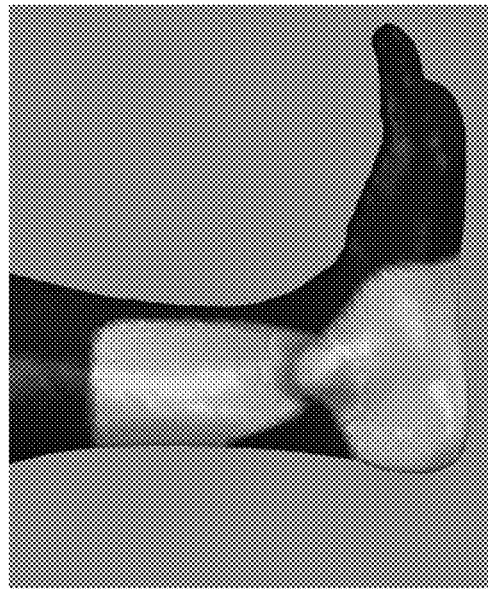
Figure 30B:
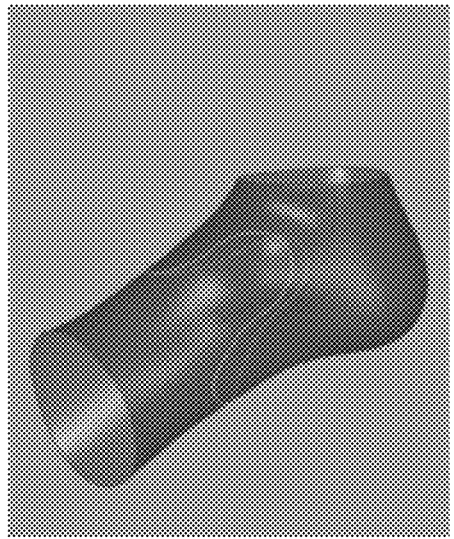
FIGS. 30A-D illustrate exemplary modeling data for producing a customized protective device for the ankle, according to one embodiment of the present disclosure.
Figure 30D:
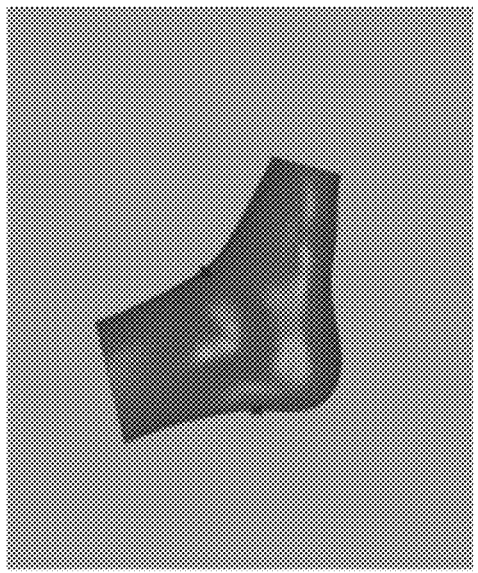
Figure 30A:
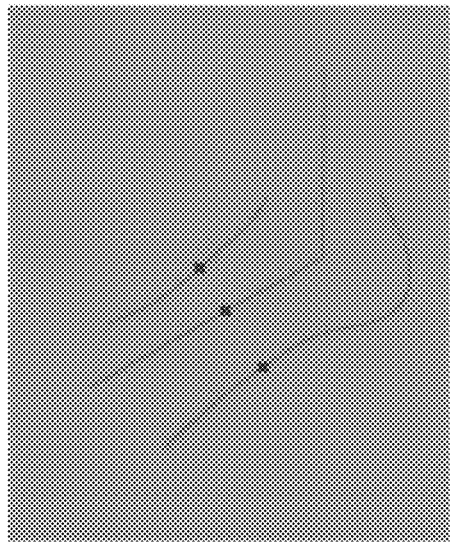
Figure 30C:
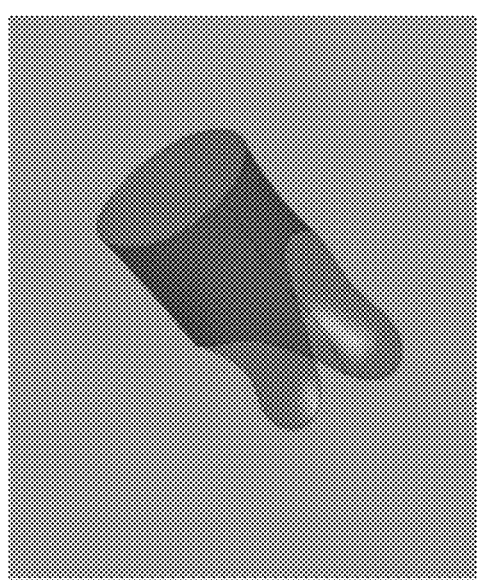
Figure 30F:
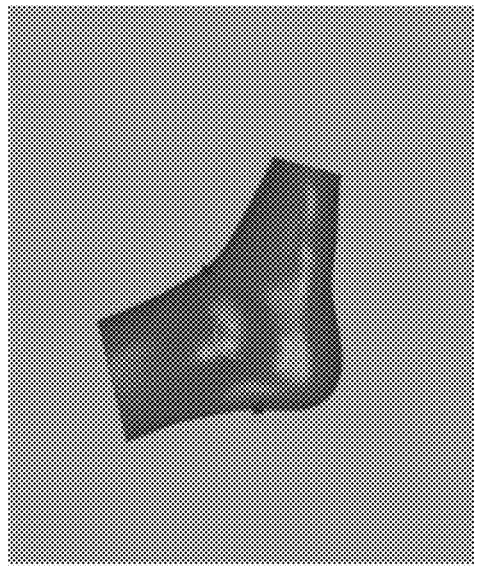
FIGS. 30E-H illustrate exemplary modeling data for producing a customized protective device for the ankle, according to one embodiment of the present disclosure.
Figure 30H:
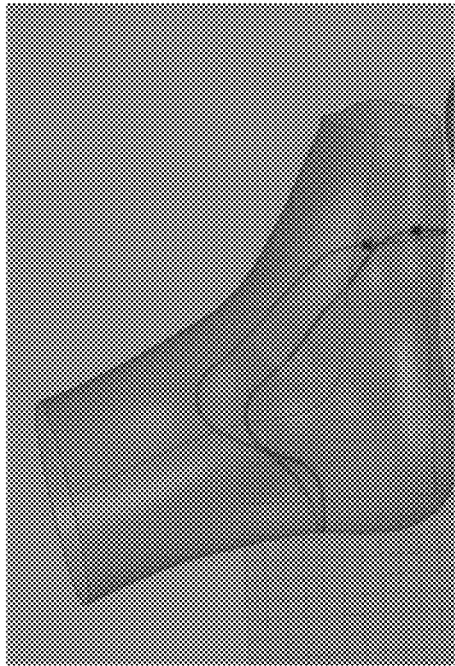
Figure 30E:
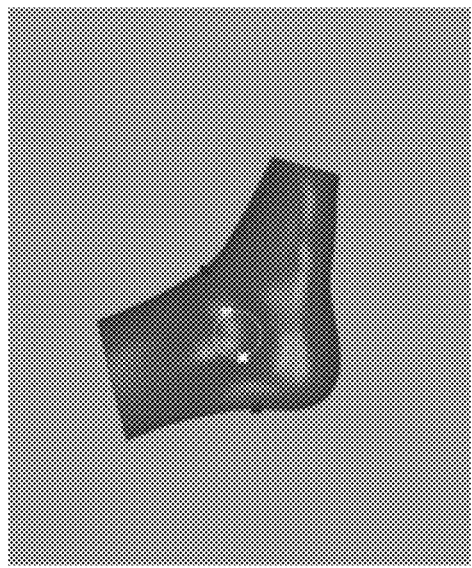
Figure 30G:
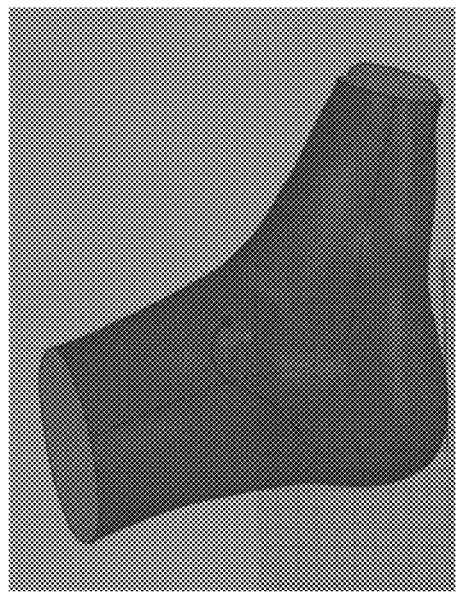

Referring now to FIG. 29A-B, illustrated is exemplary modeling data 134 for producing a customized protective device for the ankle, according to one embodiment of the present disclosure. In some embodiments, once the surface has been created, the surface can be input into the data processing console 142. The data processing console 142 may select points closest to the spheroids and apply a force pulling them onto the surface. The data processing console 142 may select and pull a random selection of points toward the subject mesh. In various embodiments, the data processing console 142 applies a smoothing force and the system is allowed to converge to a surface that fits the defined tolerance of 0.5 mm, is smooth, and fits well to the spheroids.

Referring now to FIG. 30A-H, illustrated is exemplary modeling data 134 for producing a customized protective device for the ankle, according to one embodiment of the present disclosure. In some embodiments, the data processing console 142 creates the parametrically defined cutting curves. In one or more embodiments, the data processing console 142 removes some material of the shin portion of the brace around the Achilles tendon in order to increase the comfort and functionality. In at least one embodiment, the material is removed 10-60% of the length from the base of the malleolus spheroid to the top of the brace. In particular embodiments, the data processing console 142 removes the middle 5-30% of the front of the shin so that it can easily be put on and taken off by the subject. In various embodiments, the data processing console 142 creates the foot portion of the brace by finding the inflection points of the back of the heel and top of the foot. In some embodiments, the data processing console 142 breaks the spheroid curve at the closest points to inflection points and a smooth curve is constructed between the segments. A plane may be rendered perpendicular to the foot past the 5th metatarsal base. In particular embodiments, the data processing console 142 creates a curve at this intersection and two points are selected around 20% of the curve length from the center of the sole. In at least one embodiment, the data processing console 142 smoothly interpolates the points and connects the points to the malleolus curve. In various embodiments, the resulting curves are used to split each of the two surfaces.

Referring now to FIG. 31A-D, illustrated a customized protective device 3100 for the ankle, according to one embodiment of the present disclosure. After the data processing console 142 creates a digital rendering, the data processing console 142 exports the rendering to the subject or medical professional for review. Changes may be requested based on the use case of the customized protective device 3100, and the parameters of the customized protective device 3100 may be altered to best fit the specifications of the user. Once the final customized protective device 3100 design is confirmed, the computing environment 102 exports the customized protective device 3100 model to a suitable 3D printing format. Suitable 3D printing file formats include but are not limited to standard triangle language (STL), OBJ file type, or 3D manufacturing format (3MF). In some embodiments, the computing environment 102 performs slicing on the customized protective device 3100 model to formulate 3D printing instructions. In one or more embodiments, the computing environment 102 uploads the customized protective device 3100 model to a 3D printer that uses SLA technology. The 3D printer discussed herein may print the customized protective device 3100. During, before, or after the printing process, the data processing console 142 or the additive manufacturing device 106 may be employed to orient the customized protective device 3100, such that the surface area per slice is minimized and no support structures are generated on the inner surface.

Referring now to FIG. 32A-E, illustrated are customized protective devices 3200A, 3200B, 3200C, 3200D, and each of their corresponding lattice structures, according to one embodiment of the present disclosure. In particular embodiments, the customized protective devices 3200A-D employ lattice structures to absorb energy during use. In one or more embodiments, the lattice structures fit custom to the individual's anatomy to a specific degree of tolerance. The unit cells of the lattice structures may include but are not limited to the TPMS, Kelvin, and Octet unit cells. The customized protective device 3200A may use TPMS unit cells; the customized protective device 3200B may use Kelvin unit cells; the customized protective device 3200C may use an octet unit cell; and the customized protective device 3200D may use the TPMS unit cell for a clavicle device. In various embodiments, the lattice structures have variable thicknesses, strut sizes, or unit cell sizes to minimize translated energy to the patient. In some embodiments, the lattice structure translates energy by buckling or deforming in a variety of methods. In some embodiments, the 3D printing of the additive manufacturing device 106 prints the lattice structures using an elastomeric material with a comfortable hardness value between 20 and 80 Shore A. In some embodiments, the additive manufacturing device 106 can print the customized protective devices 3200 in a stiffer material. In at least one embodiment, the additive manufacturing device 106 prints the customized protective devices 3200 using the same material, where a bottom portion is printed in a lattice structure and the top portion is a solid body. In various embodiments, the customized protective devices 3200 include solid bottom sections that contours to the subject's body, a lattice layer for energy absorption, and a solid layer that may act as a shell.

In particular embodiments, lattice structures may be used to decrease the weight of specific products or to allow a degree of flexion in specific customized protective devices 3200. In one or more embodiments, the lattice structure is used in splinting devices that benefit from a greater range of flexibility or motion.

Figure 33A:
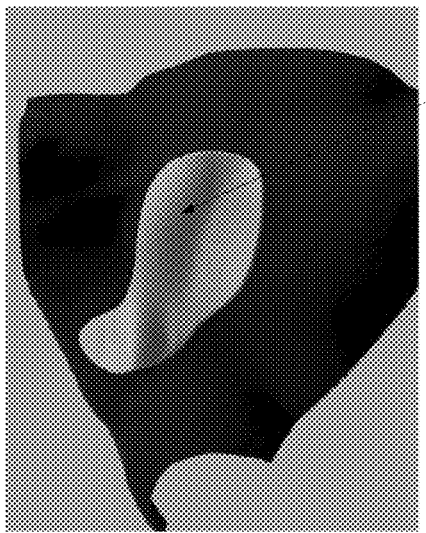
FIGS. 33A-U illustrate examples of various types of customized protective devices, according to various embodiment of the present disclosure
Figure 33B:
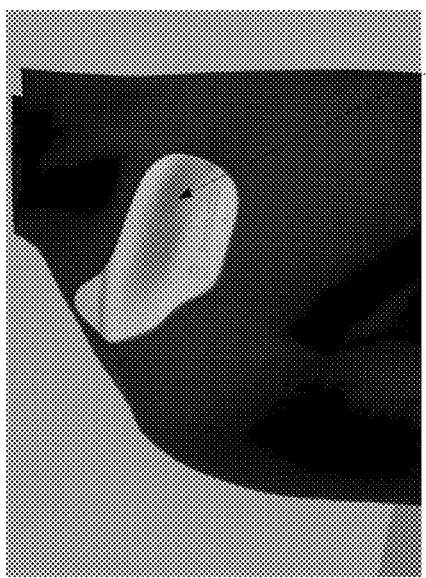
Figure 33C:
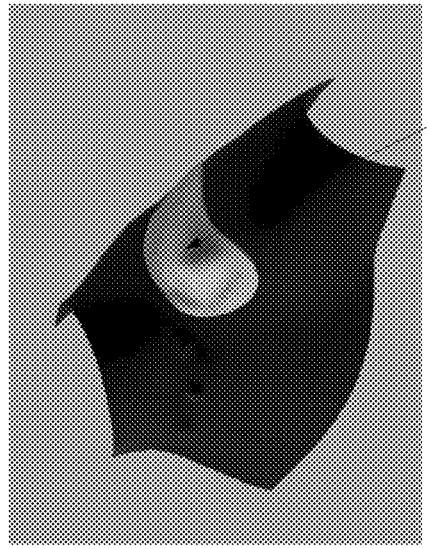
Figure 33D:
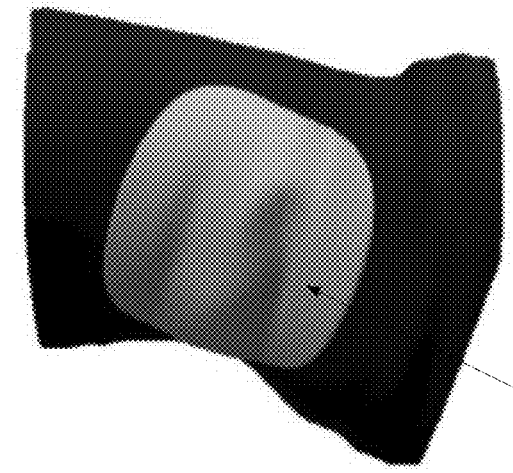
Figure 33E:
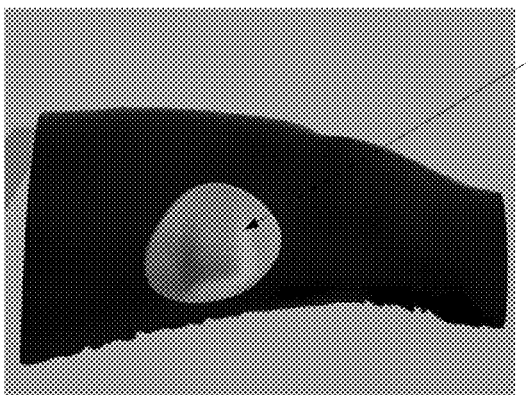
Figure 33F:
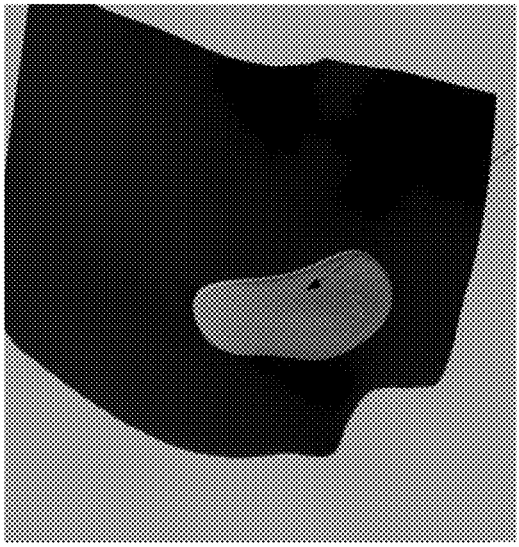
Figure 33P:
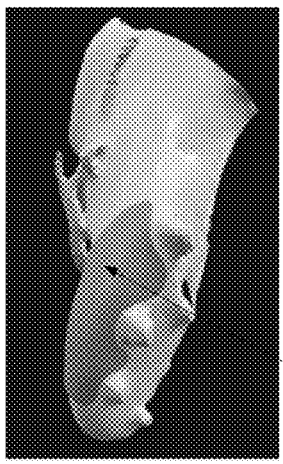
Figure 33T:
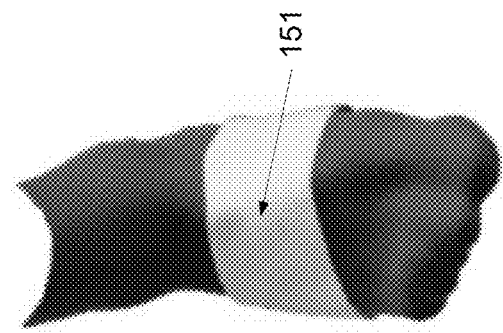
Figure 33O:
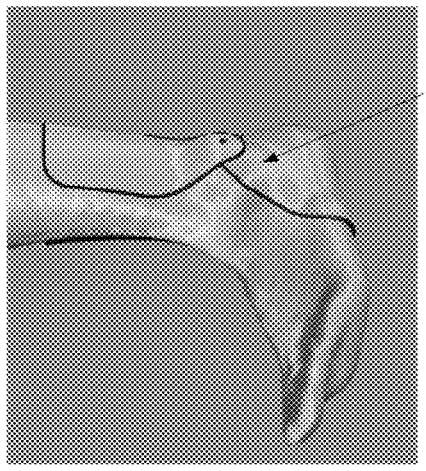
Figure 33S:
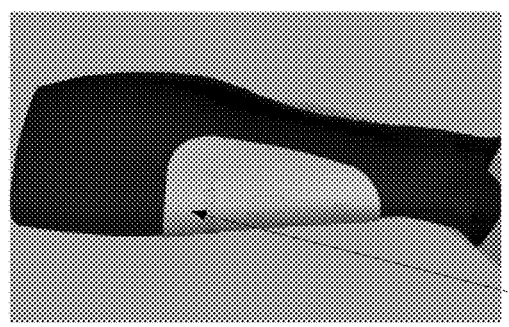
Figure 33N:
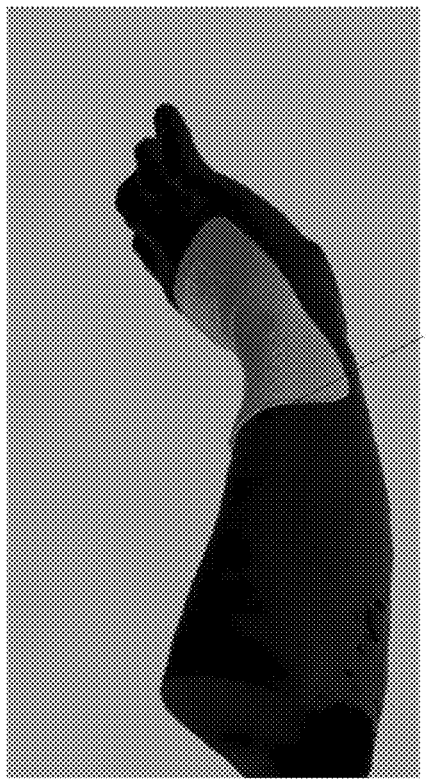
Figure 33R:
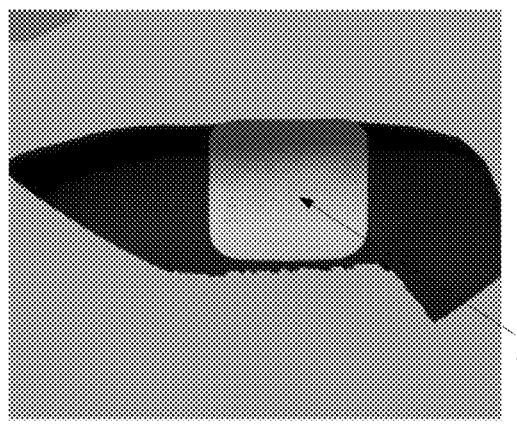
Figure 33Q:
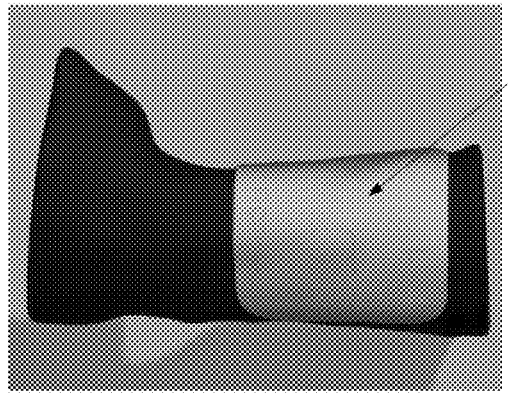
Figure 33U:
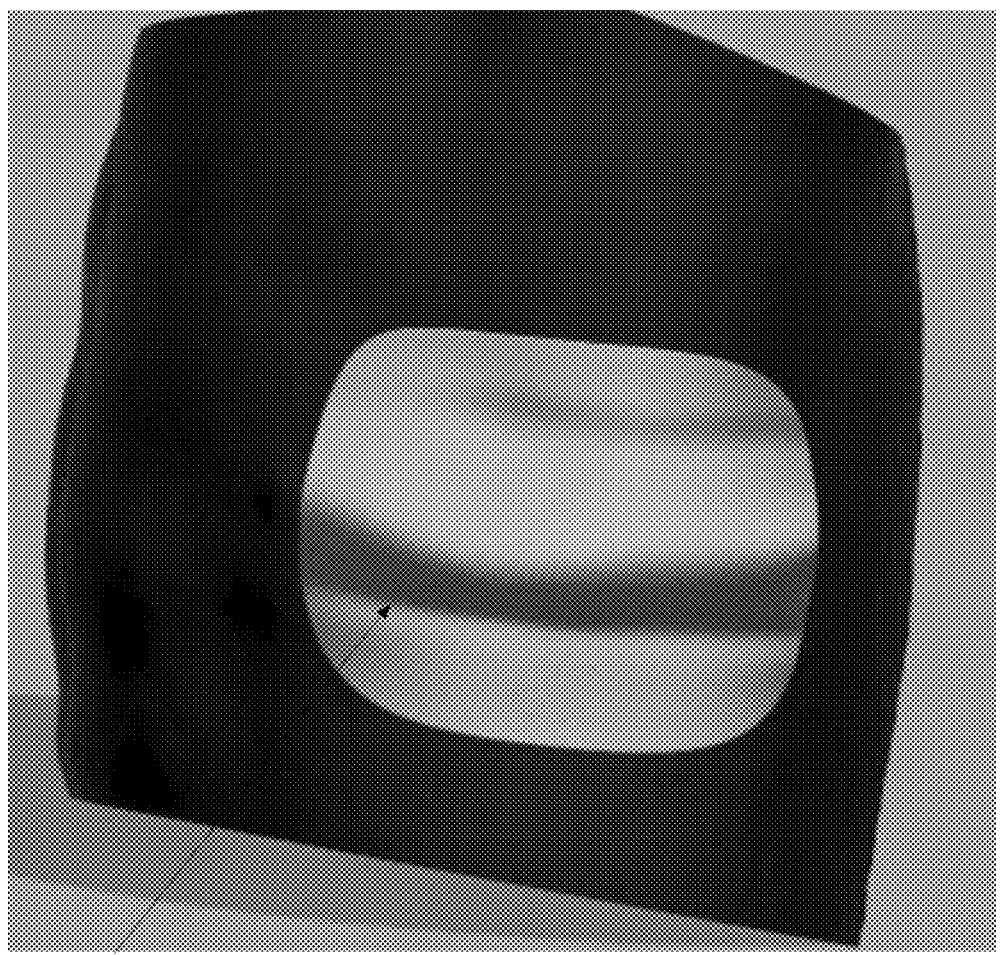

Referring now to FIGS. 33A-U, illustrated are various types of customized protective devices 151, according to various embodiment of the present disclosure. In particular embodiments, the customized protective device 151 can be designed for any particular body part. In one or more embodiments, the customized protective device 151 of FIG. 33A covers the acromioclavicular (AC) joint. In some embodiments, the customized protective device 151 of FIG. 33A contours to the top of the shoulder, distributes impacts away from the AC joint and pain points, and allows full range of motion. In one or more embodiments, the customized protective device 151 of FIG. 33A is used to protect Grades I-III and V AC joint separations.

In one or more embodiments, the customized protective device 151 of FIG. 33B covers a collarbone. In various embodiments, the customized protective device 151 of FIG. 33B forms a bridge over the clavicle, distributes load away from the clavicle, and allows full range of motion. In some embodiments, the customized protective device 151 of FIG. 33B minimizes contact points with the neck and shoulder during arm abduction, flexion, and extension.

In one or more embodiments, the customized protective device 151 of FIG. 33C covers a sternoclavicular joint. In one or more embodiments, the customized protective device 151 of FIG. 33C forms a bridge over the clavicle, distributes all load away from the clavicle, and allows full range of motion. In some embodiments, the customized protective device 151 of FIG. 33C minimizes contact points with the neck and shoulder during arm abduction, flexion, and extension.

In one or more embodiments, the customized protective device 151 of FIG. 33D covers a sternum. In some embodiments, the customized protective device 151 of FIG. 33D contours to the torso, distributes load away from the sternum, and rests on the pectoral muscles.

In various embodiments, the customized protective device 151 of FIG. 33E covers a thigh. In some embodiments, the customized protective device 151 of FIG. 33E contours to the thigh, distributes load away from the injured area, and allows full range of motion. In particular embodiments, the customized protective device 151 of FIG. 33E is low profile and hardly noticeable by the user.

In at least one embodiment, the customized protective device 151 of FIG. 33F covers a hip pointer. In various embodiments, the customized protective device 151 of FIG. 33F contours to the hip, distributes load away from the iliac crest, and allows full range of motion.

In particular embodiments, the customized protective device 151 of FIG. 33G partially covers the thumb. In one or more embodiments, the customized protective device 151 of FIG. 33G supports the thumb metacarpophalangeal (MCP) joint against hyperextension and hyperabduction. In various embodiments, the customized protective device 151 of FIG. 33G extends from the third metacarpal on the back of the hand around the thumb MCP joint and wraps partially onto the palm.

In some embodiments, the customized protective device 151 of FIG. 33H covers a thumb. In one or more embodiments, the customized protective device 151 of FIG. 33H with closed ring around the thumb restricts hyperextension and hyperabduction of the thumb MCP joint as well as impact to the inside of the palm.

In some embodiments, the customized protective device 151 of FIG. 33I partially covers the thumb. In various embodiments, the customized protective device 151 of FIG. 33I helps the thumb with various degrees of thumb ulnar collateral ligament (UCL) injuries. In particular embodiments, the customized protective device 151 of FIG. 33I restricts thumb hyperabduction while allowing full range of motion.

In at least one embodiment, the customized protective device 151 of FIG. 33J partially covers half of a hand. In some embodiments, the customized protective device 151 of FIG. 33J is designed to immobilize the wrist, ring finger, and pinky following a fracture of the 4th metacarpal. In various embodiments, the customized protective device 151 of FIG. 33J extends from proximal forearm past the tips of the ring finger and pinky and fully restricts motion of the wrist and both fingers.

In at least one embodiment, the customized protective device 151 of FIG. 33K partially covers a wrist. In one or more embodiments, the customized protective device 151 of FIG. 33K is designed for an athlete to return to physical activity following a scaphoid fracture. The customized protective device 151 of FIG. 33K may fully immobilize the wrist, may extend from the forearm to the knuckles, and may fully encapsulate the thumb.

In at least one embodiment, the customized protective device 151 of FIG. 33L partially covers a finger. In various embodiments, the customized protective device 151 of FIG. 33M and FIG. 33N covers the wrist. In one or more embodiments, the customized protective device 151 of FIG. 33O covers the ankle.

In one or more embodiments, the customized protective device 151 of FIG. 33P covers a portion of a shoe. In some embodiments, the customized protective device 151 of FIG. 33Q covers the forearm. In various embodiments, the customized protective device 151 of FIG. 33R covers the bicep. The customized protective device 151 of FIG. 33S may cover a shin. The customized protective device 151 of FIG. 33T may cover the top of a foot.

In some embodiments, the customized protective device 151 of FIG. 33U covers at least one rib. In various embodiments, the customized protective device 151 of FIG. 33U contours to the torso and distributes load away from the rib bone with minimal interference to normal shoulder pads and the overall comfort of the user.

From the foregoing, it will be understood that various aspects of the processes described herein are software processes that execute on computer systems that form parts of the system. Accordingly, it will be understood that various embodiments of the system described herein are generally implemented as specially configured computers including various computer hardware components and, in many cases, significant additional features as compared to conventional or known computers, processes, or the like, as discussed in greater detail herein. Embodiments within the scope of the present disclosure also include computer-readable media for carrying or having computer-executable instructions or data structures stored thereon. Such computer-readable media can be any available media, which can be accessed by a computer, or downloadable through communication networks. By way of example, and not limitation, such computer-readable media can comprise various forms of data storage devices or media such as RAM, ROM, flash memory, EEPROM, CD-ROM, DVD, or other optical disk storage, magnetic disk storage, solid-state drives (SSDs) or other data storage devices, any type of removable nonvolatile memories such as secure digital (SD), flash memory, memory stick, etc., or any other medium which can be used to carry or store computer program code in the form of computer-executable instructions or data structures and which can be accessed by a general-purpose computer, special purpose computer, specially-configured computer, mobile device, etc.

When information is transferred or provided over a network or another communications connection (either hardwired, wireless, or a combination of hardwired or wireless) to a computer, the computer properly views the connection as a computer-readable medium. Thus, any such a connection is properly termed and considered a computer-readable medium. Combinations of the above should also be included within the scope of computer-readable media. Computer-executable instructions comprise, for example, instructions and data, which cause a general-purpose computer, special purpose computer, or special purpose processing device such as a mobile device processor to perform one specific function or a group of functions.

Those skilled in the art will understand the features and aspects of a suitable computing environment in which aspects of the disclosure may be implemented. Although not required, some of the embodiments of the claimed systems and methods may be described in the context of computer-executable instructions, such as program modules or engines, as described earlier, being executed by computers in networked environments. Such program modules are often reflected and illustrated by flow charts, sequence diagrams, exemplary screen displays, and other techniques used by those skilled in the art to communicate how to make and use such computer program modules. Generally, program modules include routines, programs, functions, objects, components, data structures, application programming interface (API) calls to other computers whether local or remote, etc. that perform particular tasks or implement particular defined data types, within the computer. Computer-executable instructions, associated data structures and/or schemas, and program modules represent examples of the program code for executing steps of the methods disclosed herein. The particular sequence of such executable instructions or associated data structures represents examples of corresponding acts for implementing the functions described in such steps.

Those skilled in the art will also appreciate that the claimed and/or described systems and methods may be practiced in network computing environments with many types of computer system configurations, including personal computers, smartphones, tablets, hand-held devices, multi-processor systems, microprocessor-based or programmable consumer electronics, networked PCs, minicomputers, mainframe computers, and the like. Embodiments of the claimed system and method are practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing various aspects of the described operations, which is not illustrated, includes a computing device including a processing unit, a system memory, and a system bus that couples various system components including the system memory to the processing unit. The computer will typically include one or more data storage devices for reading data from and writing data to. The data storage devices provide nonvolatile storage of computer-executable instructions, data structures, program modules, and other data for the computer.

Computer program code that implements the functionality described herein typically comprises one or more program modules that may be stored on a data storage device. This program code, as is known to those skilled in the art, usually includes an operating system, one or more application programs, other program modules, and program data. A user may enter commands and information into the computer through keyboard, touch screen, pointing device, a script containing computer program code written in a scripting language, or other input devices (not shown), such as a microphone, etc. These and other input devices are often connected to the processing unit through known electrical, optical, or wireless connections.

The computer that affects many aspects of the described processes will typically operate in a networked environment using logical connections to one or more remote computers or data sources, which are described further below. Remote computers may be another personal computer, a server, a router, a network PC, a peer device or other common network node, and typically include many or all of the elements described above relative to the main computer system in which the systems and methods are embodied. The logical connections between computers include a local area network (LAN), a wide area network (WAN), virtual networks (WAN or LAN), and wireless LANs (WLAN) that are presented here by way of example and not limitation. Such networking environments are commonplace in office-wide or enterprise-wide computer networks, intranets, and the Internet.

When used in a LAN or WLAN networking environment, a computer system implementing aspects of the system and method is connected to the local network through a network interface or adapter. When used in a WAN or WLAN networking environment, the computer may include a modem, a wireless link, or other mechanisms for establishing communications over the wide-area network, such as the Internet. In a networked environment, program modules depicted relative to the computer, or portions thereof, may be stored in a remote data storage device. It will be appreciated that the network connections described or shown are exemplary and other mechanisms of establishing communications over wide area networks or the Internet may be used.

While various aspects have been described in the context of a preferred embodiment, additional aspects, features, and methodologies of the claimed systems and methods will be readily discernible from the description herein, by those of ordinary skill in the art. Many embodiments and adaptations of the disclosure and claimed systems and methods other than those herein described, as well as many variations, modifications, and equivalent arrangements and methodologies, will be apparent from or reasonably suggested by the disclosure and the foregoing description thereof, without departing from the substance or scope of the claims. Furthermore, any sequence(s) and/or temporal order of steps of various processes described and claimed herein are those considered to be the best mode contemplated for carrying out the claimed systems and methods. It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the claimed systems and methods. In addition, some steps may be carried out simultaneously, contemporaneously, or in synchronization with other steps.

The embodiments were chosen and described in order to explain the principles of the claimed systems and methods and their practical application so as to enable others skilled in the art to utilize the systems and methods and various embodiments and with various modifications as are suited to the particular use contemplated. Alternative embodiments will become apparent to those skilled in the art to which the claimed systems and methods pertain without departing from their spirit and scope. Accordingly, the scope of the claimed systems and methods is defined by the appended claims rather than the foregoing description and the exemplary embodiments described therein.

What is claimed is:

1. A computer-implemented method in which one or more processing devices perform operations comprising:
   accessing a scan of anatomical data of a target; and
   automatically and without human input:
      identifying a reference model based upon height and weight data associated with previously stored reference models unaffiliated with the target;
      matching the scan of anatomical data of the target with an anatomical landmark contained in the reference model;
      orienting the scan of anatomical data of the target within a three-axis coordinate system by comparing the scan of anatomical data of the target with the reference model based upon the height and weight data associated with the previously stored reference models unaffiliated with the target;
      isolating a relevant portion of the scan of anatomical data by:
         creating a boundary of a three-dimensional protective device based at least in part on the anatomical landmark contained in the reference model based upon the height and weight data associated with the previously stored reference models unaffiliated with the target, and the scan of anatomical data of the target oriented within the three-axis coordinate system;
         removing a portion of the scan of anatomical data outside of the boundary of the three-dimensional protective device;
         generating a representation of a continuous, three-dimensional surface of the three-dimensional protective device using the relevant portion of the scan of anatomical data and the boundary of the three-dimensional protective device; and
         applying an optimization algorithm to the representation of the continuous, three-dimensional surface of the three-dimensional protective device to smooth the representation of the continuous, three-dimensional surface while maintaining a fit to the scan of the anatomical data.

2. The computer-implemented method of claim 1, wherein the operation of creating the boundary of the three-dimensional protective device comprises:
   finding a tangent vector of a three-dimensional curve at a relevant position of the scan of anatomical data; and
   calculating a cross-product of the tangent vector with a normal of a polygon mesh of the reference model at a closest position of the reference model to the relevant position.

3. The computer-implemented method of claim 2, wherein the operation of creating the boundary of the three-dimensional protective device further comprises:
   finding additional tangent vectors at discrete position increment locations of the scan of anatomical data; and
   calculating additional cross-products of the additional tangent vectors with normal of the polygon mesh at closest positions of the reference model to the discrete position increment locations.

4. The computer-implemented method of claim 3, wherein the optimization algorithm applied to the continuous, three-dimensional surface comprises iteratively applying a Laplacian smoothing algorithm and an attraction force algorithm.

5. The computer-implemented method of claim 4, wherein the operations further comprise:
   determining a thickness of the three-dimensional protective device, wherein the thickness of the three-dimensional protective device is greater in an area with an elevated stress concentration.

6. The computer-implemented method of claim 1, wherein the operations further comprise:
   generating a lattice structure for the three-dimensional protective device to decrease weight, achieve desired energy absorption characteristics, optimize bending or splinting properties, or any combination thereof.

7. The computer-implemented method of claim 1, wherein the three-dimensional protective device comprises an AC joint pad, a thumb guard, a collarbone pad, or an ankle brace.

8. The computer-implemented method of claim 1, wherein the operations further comprise:
    determining a chest depth and shoulder width of the target from the scan of anatomical data of the target, wherein the size of the target comprises at least the chest depth and the shoulder width.

9. The computer-implemented method of claim 1, wherein the operation of generating the representation of the continuous, three-dimensional surface comprises:
    generating a polygon mesh using the scan of anatomical data of the target and the reference model;
    identifying a location of a lofted region of the polygon mesh;
    segmenting the polygon mesh using evenly spaced perpendicular surfaces;
    calculating normal vectors of the evenly spaced perpendicular surfaces of the polygon mesh positioned over the lofted region; and
    applying a function to a magnitude of the normal vectors to generate the lofted region as an arched curve that (i) fits end tangents of regions of the polygon mesh bounding the lofted region and (ii) is lofted to generate a three-dimensional space between the continuous, three-dimensional surface of the three-dimensional protective device and the polygon mesh.

10. A system comprising:
    a processor;
    a data store comprising a plurality of previously stored reference models; and
    a non-transitory computer-readable medium having instructions stored thereon, the instructions executable by the processor for performing operations comprising:
        accessing a scan of anatomical data of a target;
        identifying a reference model based upon height and weight data associated with the plurality of previously stored reference models, wherein the previously stored reference models are unaffiliated with the target;
        retrieving the reference model from the data store;
        matching the scan of anatomical data of the target with an anatomical landmark contained in the reference model;
        creating a boundary of a three-dimensional protective device based at least in part on the anatomical landmark contained in the reference model, and the scan of anatomical data of the target;
        generating a lofted region of the three-dimensional protective device, wherein generating the lofted region comprises:
            generating a polygon mesh using the scan of anatomical data of (i) the target within the boundary of the three-dimensional protective device and (ii) the reference model;
            identifying a location of the lofted region of the polygon mesh;
            segmenting the polygon mesh using evenly spaced perpendicular surfaces;
            calculating normal vectors of the evenly spaced perpendicular surfaces of the polygon mesh positioned over the lofted region; and
            applying a function to a magnitude of the normal vectors to generate the lofted region as an arched curve that (i) fits end tangents of regions of the polygon mesh bounding the lofted region and (ii) is lofted to generate a three-dimensional space between the three-dimensional protective device and the polygon mesh;
        generating a representation of a continuous, three-dimensional surface of the three-dimensional protective device that corresponds to the scan of anatomical data, the reference model, and the lofted region; and
        transmitting the representation of the continuous, three-dimensional surface of three-dimensional protective device to an additive manufacturing device.

11. The system of claim 10, wherein the operations further comprise:
    applying an optimization algorithm to the continuous, three-dimensional surface, wherein the optimization algorithm comprises iteratively applying a Laplacian smoothing algorithm and an attraction force algorithm.

12. The system of claim 11, wherein the three-dimensional protective device comprises a joint brace that prevents or inhibits rotation or movement of a joint of the target.

13. The system of claim 12, wherein the operation of creating the boundary of the three-dimensional protective device comprises:
    finding a tangent vector of a three-dimensional curve at a relevant position of the scan of anatomical data; and
    calculating a cross-product of the tangent vector with a normal of a polygon mesh of the reference model at a closest position of the reference model to the relevant position.

14. The system of claim 13, wherein the operations further comprise:
    labeling anatomical features of the scan of anatomical data, wherein the labeled anatomical features are used to identify the reference model of the closest size or proportion to the size or proportion of the target.

15. The system of claim 10, wherein the operation of accessing the scan of anatomical data of the target comprises receiving a three-dimensional anatomical scan of the target from a three-dimensional scanning device.

16. A non-transitory computer-readable medium having program code that is stored thereon, the program code executable by one or more processing devices for performing operations comprising:
    accessing a scan of anatomical data of a target;
    automatically and without human input:
        identifying a reference model based upon height and weight data associated with previously stored reference models, wherein the previously stored reference models are unaffiliated with the target and are stored in a data store;
        retrieving the reference model from the data store;
        creating a boundary of a three-dimensional protective device using based at least in part one the reference model and the scan of anatomical data of the target; and
        generating a representation of a continuous, three-dimensional surface of the three-dimensional protective device that corresponds to the scan of anatomical data and the reference model within the boundary of the three-dimensional protective device.

17. The non-transitory computer-readable medium of claim 16, wherein the operation of generating the representation of the continuous, three-dimensional surface comprises:
    generating a polygon mesh using the scan of anatomical data of the target and the reference model;
    identifying a location of a lofted region of the polygon mesh;
    segmenting the polygon mesh using evenly spaced perpendicular surfaces;

calculating normal vectors of the evenly spaced perpendicular surfaces of the polygon mesh positioned over the lofted region; and applying a function to a magnitude of the normal vectors to generate the lofted region as an arched curve that (i) fits end tangents of regions of the polygon mesh bounding the lofted region and (ii) is lofted to generate a three-dimensional space between the continuous, three-dimensional surface of the three-dimensional protective device and the polygon mesh.

18. The non-transitory computer-readable medium of claim 17, wherein the operations further comprise:
generating a lattice structure for the three-dimensional protective device to decrease weight, achieve desired energy absorption characteristics, optimize bending or splinting properties, or any combination thereof.

19. The non-transitory computer-readable medium of claim 18, wherein the operations further comprise:
determining a thickness of the three-dimensional protective device, wherein the thickness of the three-dimensional protective device is greater in an area with an elevated stress concentration.

20. The non-transitory computer-readable medium of claim 16, wherein the three-dimensional protective device comprises a joint brace that prevents or inhibits rotation or movement of a joint of the target.

\* \* \* \* \*